(12) United States Patent
Kondo

(10) Patent No.: US 6,653,928 B1
(45) Date of Patent: Nov. 25, 2003

(54) DRY LOAD TEST APPARATUS

(75) Inventor: Toyoshi Kondo, Tokyo (JP)

(73) Assignee: Tatsumi Corporation, Tokyo (JP)

( * ) Notice: Subject to any disclaimer, the term of this patent is extended or adjusted under 35 U.S.C. 154(b) by 0 days.

(21) Appl. No.: 09/889,589

(22) PCT Filed: Jul. 26, 2000

(86) PCT No.: PCT/JP00/04992

§ 371 (c)(1),
(2), (4) Date: Aug. 2, 2001

(87) PCT Pub. No.: WO01/40817

PCT Pub. Date: Jun. 7, 2001

(30) Foreign Application Priority Data

Dec. 2, 1999 (JP) .......... 11-343801

(51) Int. Cl.[7] ............................. H01C 10/14
(52) U.S. Cl. .............. 338/319; 338/320; 338/215
(58) Field of Search ................. 338/319, 320, 338/215, 48

(56) References Cited

U.S. PATENT DOCUMENTS

| | | | | |
|---|---|---|---|---|
| 524,382 | A | * 8/1894 | Herric | 338/320 |
| 1,002,533 | A | * 9/1911 | DeMayo | 338/320 |
| 1,190,780 | A | * 7/1916 | McElroy | 338/320 |
| 1,217,229 | A | * 2/1917 | Smith | 338/320 |
| 1,251,507 | A | * 1/1918 | Gray | 338/320 |
| 1,337,826 | A | * 4/1920 | Dodge | 338/320 |
| 1,653,070 | A | * 12/1927 | Smith | 338/320 |
| 1,709,808 | A | * 4/1929 | Quern | 338/320 |
| 2,050,220 | A | * 8/1936 | Frese | 338/320 |
| 4,775,775 | A | * 10/1988 | Spigarelli et al. | 392/473 |

FOREIGN PATENT DOCUMENTS

| | | |
|---|---|---|
| JP | 61-212778 | 9/1986 |
| JP | 62-219901 | 9/1987 |
| JP | 4-115083 | 4/1992 |
| JP | 5-215825 | 8/1993 |
| JP | 6-34725 | 2/1994 |
| JP | 7-43436 | 2/1995 |
| JP | 7-298687 | 11/1995 |
| JP | 9-15307 | 1/1997 |
| JP | 9-15308 | 1/1997 |
| JP | 9-15309 | 1/1997 |
| JP | 2000-19231 | 1/2000 |
| JP | 2000-121709 | 4/2000 |

* cited by examiner

Primary Examiner—Karl D. Easthom
(74) Attorney, Agent, or Firm—Jacobson Holman PLLC

(57) ABSTRACT

A dry load test apparatus 40 comprises multi stage resistor bodies 57R, 57S and 57T for high voltage load tests. having a large number of flat shaped resistor assemblies Ri, Si and Ti consisting of numerous elongate resistor elements rj provided side by side in a flat shape with interval and serially connected at an end thereof, said large number of resistor assemblies Ri, Si and Ti being provided side by side with multi stages with interval in order that flat planes thereof become parallel so that numerous resistor element columns which are formed with corresponding said resistor elements rj of the multi stage resistor assemblies Ri, Si and Ti are provided. Further, the dry load test apparatus 40 comprises a plurality of first multi stage switching members Swaij and SWbij, one end thereof being connected to an end of each of said resistor elements rj of the resistor element columns to constitute switching member columns Swai and SWbi, a large number of inter assembly conductive members Caj and Cbj respectively connecting other ends of first switching members Swaij and SWbij of said switching member columns Swai and SWbi one another, and a vacuum circuit breaker (high voltage switch) 86 connecting a few of said large number of inter assembly conductive members Caj and Cbj to an under test power supply (a three phase AC generator 88).

7 Claims, 48 Drawing Sheets

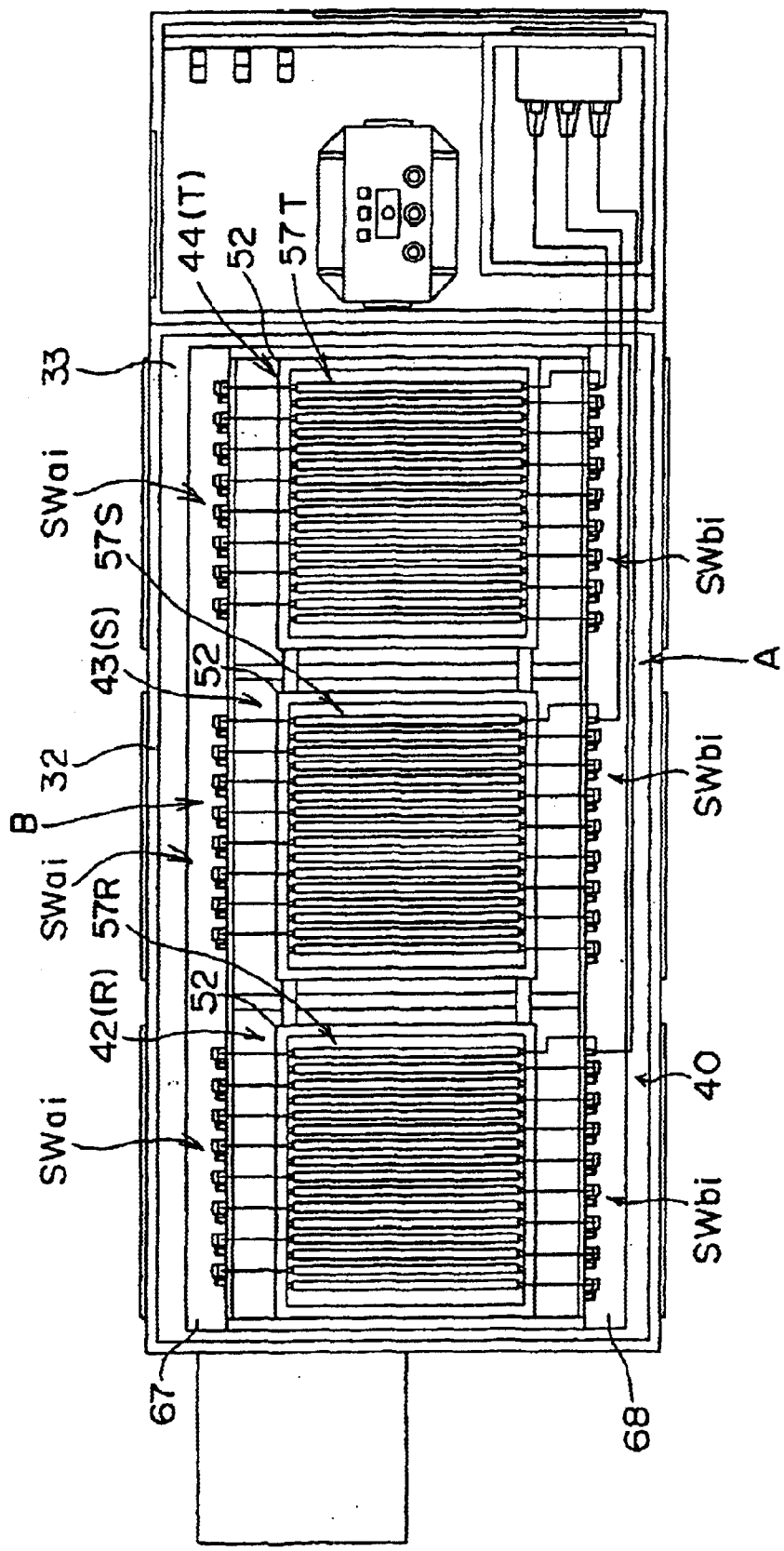

DRY LOAD TEST APPARATUS

BACKGROUND OF THE INVENTION

1. Field of the Invention

The present invention relates to a dry load test apparatus used in an electric load test of, for example, AC generator, other power supplies and the like.

2. Description of the Related Art

<Necessity for Load Test of Private Generator>

Recently, in facilities (buildings) requiring power such as factories, department stores, computer center buildings, medical facilities and a commercial buildings, it is desirable that stable power supplying can be achieved even in a power failure. For this reason, for the facilities that requires such power, a private generator such as a three phase AC generator is provided, and in a power failure, the private generator is driven urgently to supply power into the facilities so that stable power supplying has been performed even in a power failure.

Such a private generator is not always operated but limited to use only in an urgent power failure so that it is required to operate certainly in such cases. For this reason, it is required to perform the load tests periodically in order that the private generator can be operated normally in an urgent power failure.

The best method for load tests for the private generator is practical operating to generate power and supply the above mentioned generated power to apparatuses practically using power (electric apparatuses, such as an interior illumination and a cooler) in factories or department stores. But, if load test takes long time and there are tens of times of ON/OFF power supply tests implemented and sudden rising up test of power capacity, it is difficult to perform the load test by using an apparatus requiring practically power (for example, electric apparatus such as an interior illumination and a cooler), and the apparatus is not appropriate for the test.

Therefore, practically, the load test for private generator has been performed using a load test resistor comprising a load resistor having capacity apt to the capacity of generator.

<Conventional Example of a Load Test Apparatus>

Further, a three phase AC generator has been used in the above mentioned private generator. Hence, in the dry load test apparatus disclosed in Japanese Patent Laid Open No. Hei 6-34725 publication or Japanese Patent Laid Open No. Hei 7-43436 publication, three fixed resistor units which are star connected are used to obtain the load corresponding R-phase, S-phase and T-phase of the three phase AC generator.

Besides, each of the fixed resistor units has a resistor assembly comprising a plurality of bar shaped resistor elements, and load capacity is set with combination of the plurality of resistor elements.

Moreover, besides the apparatuses disclosed in the publications, there are apparatuses that switching settings of load capacity for load test can be available. For example, those are disclosed in Japanese Patent Laid Open No. Hei 9-15307 publication, Japanese Patent Laid Open No. Hei 9-15308 publication, Japanese Patent Laid Open No. Hei 9-15309 publication and the like. In the apparatuses disclosed in the publications, a large number of resistor assemblies consisting of a plurality of bar shaped resistor elements are prepared, and the large number of resistor assemblies are disposed in the upper and lower with multi stages so that a load resistor circuit is formed from the large number of resistor assemblies. Further, by the switching combination of the multi stage resistor assemblies, resistance value of the load resistor circuit can be changed.

Further, a load test resistor apparatus to which switching selection means for selecting the above mentioned resistance value of the load resistor for load test is provided is disclosed, for example, in Japanese Patent Laid Open No. 2000-19231 (P2000-19231A) publication. < >

<Load Test Apparatus for a Movable Type Three Phase AC Generator>

However, in the resistor apparatuses for load test of the three phase AC generator, there are a permanent type one which is permanently established is such as factories, department stores, pumping facilities, hospitals and the like and movable type one which is mounted on a vehicle and is carried to use in the facilities which needs the load test only when the load resistor test performs. For example, the movable type load test apparatus is that a dry load test apparatus 3 is mounted on a carrier 2 of a truck 1, as shown in FIG. 50A (refer to Japanese Patent Laid Open No. Hei 9-15307 publication).

The dry load test apparatus 3 has the frame 4 attached to the carrier 2, and R-phase, S-phase and T-phase resistor units 5, 6 and 7 adjacently attached to the frame 4. Each of the resistor units 5, 6 and 7 has the same configuration.

Each of the resistor units 5, 6 and 7 has a base frame 10 disposed on the frame 4, a vibration isolation rubber 11 interposed between the frame 4 and the base frame 10, and fixing nuts 13 and 14 which are screwed to the frame 4, the base frame 10, the vibration isolation rubber 11 and a fixing bolt 12, and both ends of the fixing bolt 12, as shown in FIG. 50B.

Further, each of the resistor units 5, 6 and 7 comprises an electric fan 15 disposed below the base frame 10 and the frame 4 and attached to the frame 4, the isolator (isolation member) 16 fixed on the base frame 10, the housing 17 fixed to the isolator 16 and opened at the upper and lower ends thereof, and the hood 18 which guides cooling wind from the electric fan 15 to the housing 17. As shown in FIG. 51, the housing 17 has a structure that side face openings of the frame 18 having a hexagonal shape formed with angles are closed with isolation plates 19a, 19b, 19c and 19d.

Also, each of the resistor units 5, 6 and 7 has the resistor bodies 20R, 20S and 20T disposed in the housing 17. The resistor bodies 20R, 20S and 20T have the resistor assemblies Ri, Si and Ti [i=1, 2, 3 cn] disposed in the upper and lower with multi stages. As shown in FIG. 51, the resistor assemblies Ri, Si and Ti have a plurality of bar shaped resistor elements (heaters) 21 which are provided side by side on the plane and the both ends thereof are held on the isolation plate, and an electrically conductive connection piece 22 to which the plurality of resistor elements 21 are serially connected.

Besides, as shown in FIGS. 52 and 53, the resistor assemblies Ri, Si and Ti of the resistor units 5, 6 and 7 are connected to a main vacuum circuit breaker (main VCB) MB which is a high voltage switch through separate vacuum circuit breakers (separate VCB) Bi [i=1, 2, 3 cn] which are high voltage switches.

In such a manner, the multi stage resistor assemblies Ri, Si and Ti can be turned ON/OFF with the separate vacuum circuit breakers (separate VCB) Bi so that fine load introducing test of three phase AC generator can be performed.

That is, in such a configuration, the sequence for performing the load resistor introducing test of the three phase AC generator 23 are as follows.

First, the operation of the three phase AC generator 23 is started, and then, the main vacuum circuit breaker MB is operated to be ON. Next, some of numerous separate vacuum circuit breakers (separate VCB) Bi are operated to be ON. In this case, for example, a few of the large number of separate vacuum circuit breakers (separate VCB) Bi are operated to be ON by every 10 minutes, thereby the load for the power generation capacity of the three phase AC generator 23 being 25% for the first 10 minutes, 50% for next 10 minutes, 75% for next 10 minutes, and 100% for the final 10 minutes. By such a predetermined time interval, the data from the load test of the three phase AC generator 23 are taken with changing the ratio of the load for the power generation capacity of the three phase AC generator 23 changed, thereby the fine load introducing test of the three phase AC generator being performed.

However, since the high price vacuum circuit breakers (VCB) Bi are provided at each of the resistor assemblies Ri, Si and Ti [i=1, 2, 3 cn], it causes drastic price increase of the dry load test apparatus. Further, in case where the vacuum circuit breakers (VCB) Bi and the resistor assemblies Ri, Si and Ti [i=1, 2, 3 cn] are connected to cable in consideration of ensuring potential between poles and withstand voltage and the like, a disposition interval W between the connection cable and the vacuum circuit breakers (VCB) Bi should be more than 10 cm. As a result, the resistor apparatus itself should be very large.

Therefore, the object of the present invention is to provide a dry load test apparatus which can be set resistance value of load resistor for load resistor test finely and whose manufacturing cost can be lowered.

SUMMARY OF INVENTION

In order to achieve the object, a dry load test apparatus according to the first aspect of the present invention is characterized by comprising multi stage resistor bodies for high voltage load test having numerous flat shaped resistor assemblies consisting of numerous elongate resistor elements provided side by side in a flat shape with interval and serially connected at an end thereof, said numerous resistor assemblies being provided side by side with multi stages with interval in order that flat planes thereof become parallel so that numerous resistor element columns which are formed with corresponding said resistor elements of the multi stage resistor assemblies are provided; a plurality of first multi stage switching members, one end thereof being connected to an end of each of said resistor elements of the resistor element columns to constitute switching member columns; numerous inter assembly conductive members respectively connecting other ends of first switching members of said switching member columns one another; and a high voltage switch connecting a few of said large number of inter assembly conductive members to an under test power supply.

Also, the dry load test apparatus according to the second aspect of the present invention, in addition to the first aspect, is characterized in that one end of said first switching members is connected to each ends of at least a few of said resistor elements of the resistor element columns to constitute the switching member columns.

Further, the dry load test apparatus according to the third aspect of the present invention, in addition to the first aspect, is characterized in that one end of said first switching members is connected to each ends of all of said resistor elements of the resistor element columns to constitute the switching member columns corresponding to each of said resistor element columns.

The dry load test apparatus according to the fourth aspect of the present invention, in addition to the first aspect, is characterized in that a shorting means for shorting selectively said large number of inter assembly conductive members one another is provided.

The dry load test apparatus according to the fifth aspect of the present invention, in addition to the fourth aspect, is characterized in that said shorting means is a second switching member.

The dry load test apparatus according to the sixth aspect of the present invention, in addition to the fifth aspect, is characterized in that wherein said switching member comprises one set of a plurality of stationary contact pairs as the first and second stationary contacts, a plurality of movable contacts interrupting or connecting the first and second stationary contacts of each of said stationary contact pairs, and a driving means driving said movable contacts to the first and second stationary contacts in advance or retreat simultaneously to interrupt or to connect the first and second stationary contacts of each of said stationary contact pairs; and wherein said plurality of first stationary contacts and said second stationary contacts are individually connected each other.

The dry load test apparatus according to the seventh aspect of the present invention, in addition to the sixth aspect, is characterized in that said driving means are solenoids which are operatively controlled by a control panel and a control circuit.

The dry load test apparatus according to the eighth aspect of the present invention, in addition to the seventh aspect, is characterized in that said solenoid comprises a coil and an actuator driven by magnetic force of said coil, and wherein said solenoid is disposed on the substantially same straight line as a driving direction of said movable contact.

The dry load test apparatus according to the ninth aspect of the present invention, in addition to the sixth aspect, is characterized in that said driving means is an air cylinder which is operatively controlled by an air control circuit.

Moreover, the dry load test apparatus according to the present invention means a dry electric load test apparatus. That is, the dry load test apparatus does not cool a resistor element as a load generating heat with water, but cool it with dry air. Hereinafter, the dry load test apparatus is used as the meaning.

BRIEF DESCRIPTION OF THE DRAWINGS

FIG. 2 is a schematic plan view schematically illustrating the inside of dry load test apparatus when apparatus receiving box frame shown in FIG. 1A and FIG. 1B is seen from the cross section thereof;

DETAILED DESCRIPTION OF THE PREFERRED EMBODIMENTS

First Embodiment of the Invention

Hereafter, a first embodiment of the present invention will be described referring to FIG. 1 to FIG. 34.

Figure 1A:
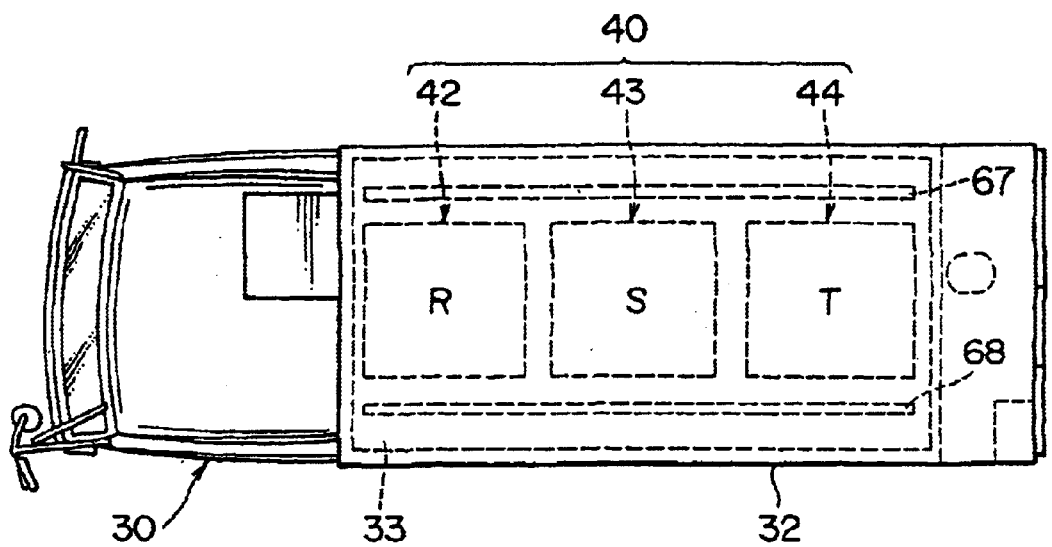
FIG. 1A is a plan view of a truck in which the dry load test apparatus in accordance to the present invention is mounted.
Figure 1B:
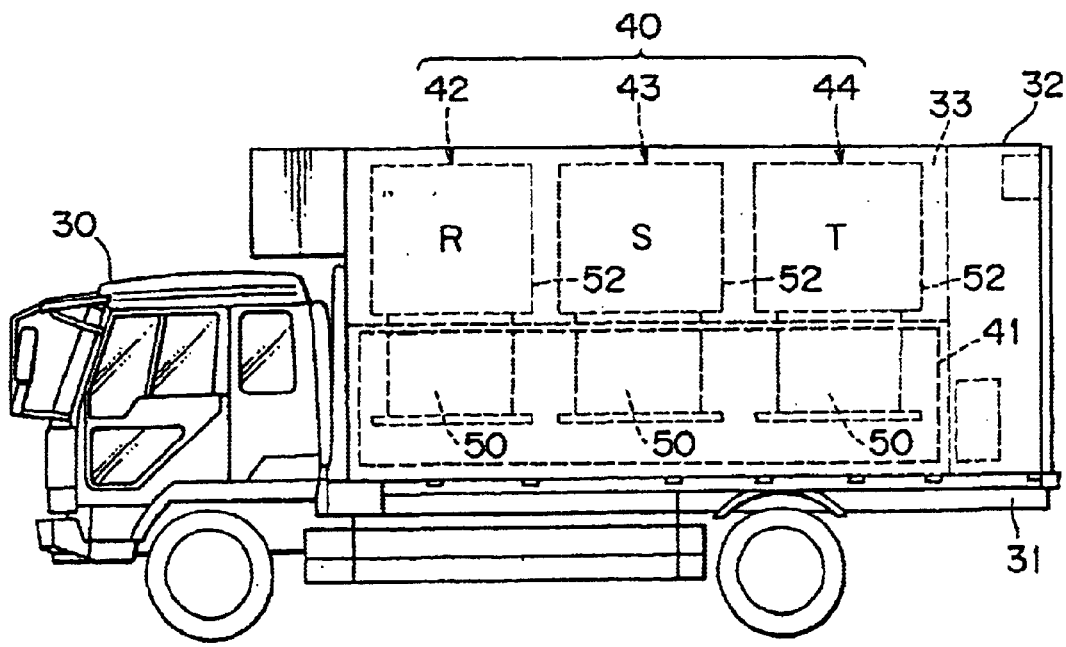
FIG. 1B is a side elevation view of FIG. 1A.

FIG. 1A is a plan view of a movable type dry load test apparatus, that is, a movable type electric load test apparatus relating to the present invention, and FIG. 1B is a side elevation view of FIG. 1A.

Constitution

The movable type dry load test apparatus comprises a truck 30 and a dry load test apparatus (electric load test apparatus) 40. The truck 30 comprises a carrier 31, and a box 32 provided on the carrier 31. A load chamber 33 is provided in the box 32. Further, a dry load test apparatus 40 is disposed in the load chamber 33.

<Schematic Constitution of the dry Load Test Apparatus 40>

Figure 3:
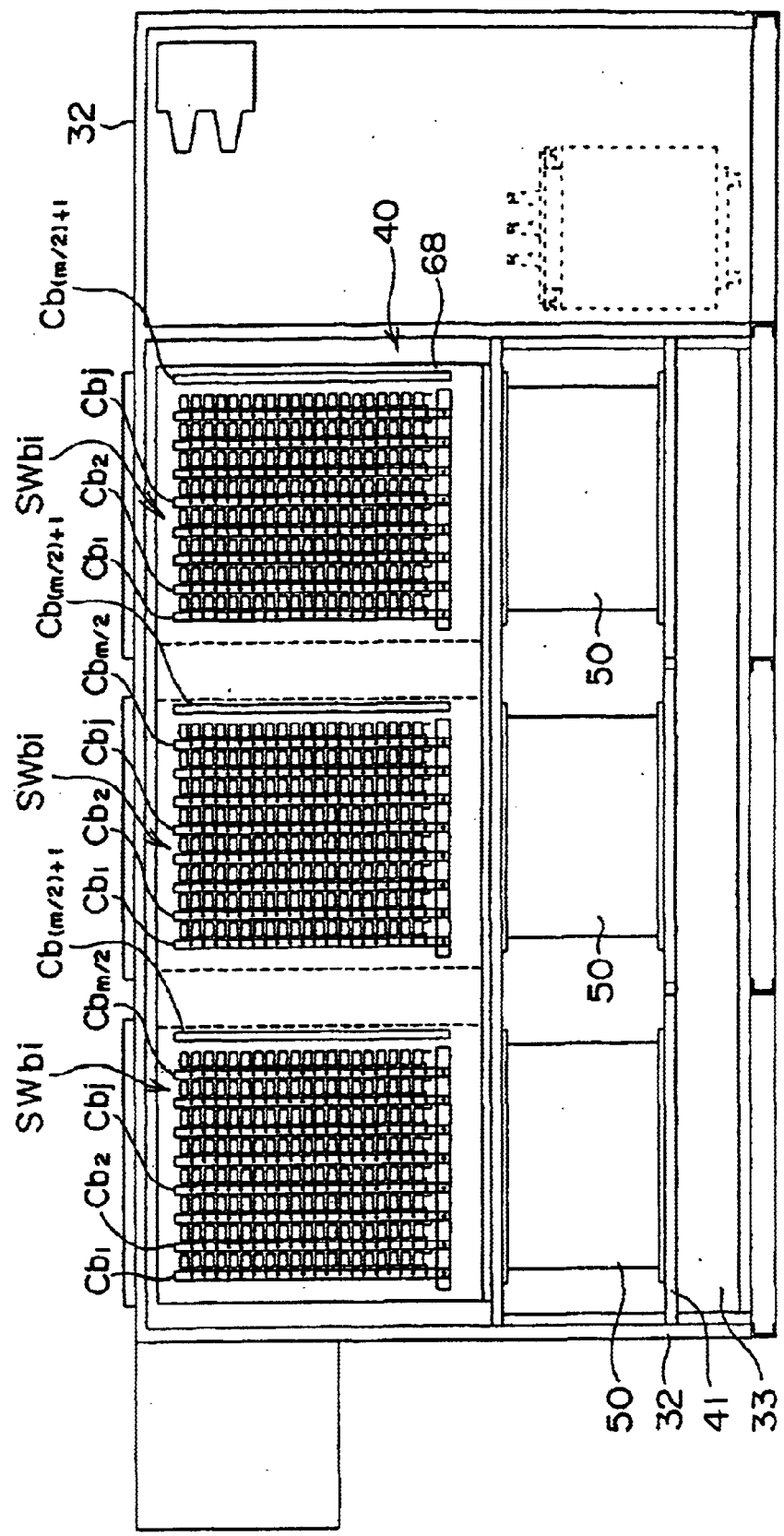
FIG. 3 is a schematic side elevation view of dry load test apparatus of FIG. 2 as seen in the direction of arrow A.
Figure 4:
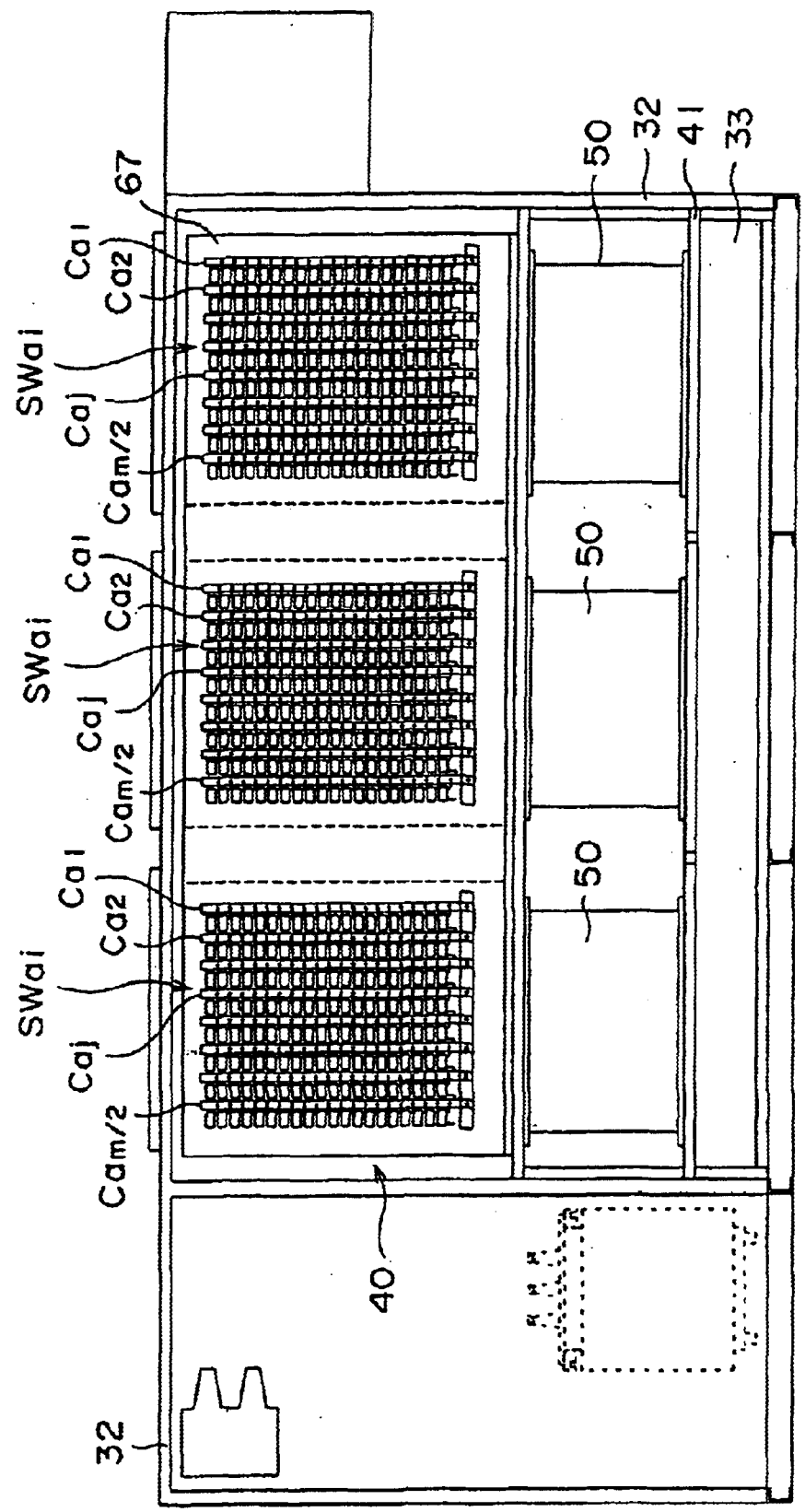
FIG. 4 is a schematic side elevation view of dry load test apparatus of FIG. 2 as seen in the direction of arrow B.
Figure 5:
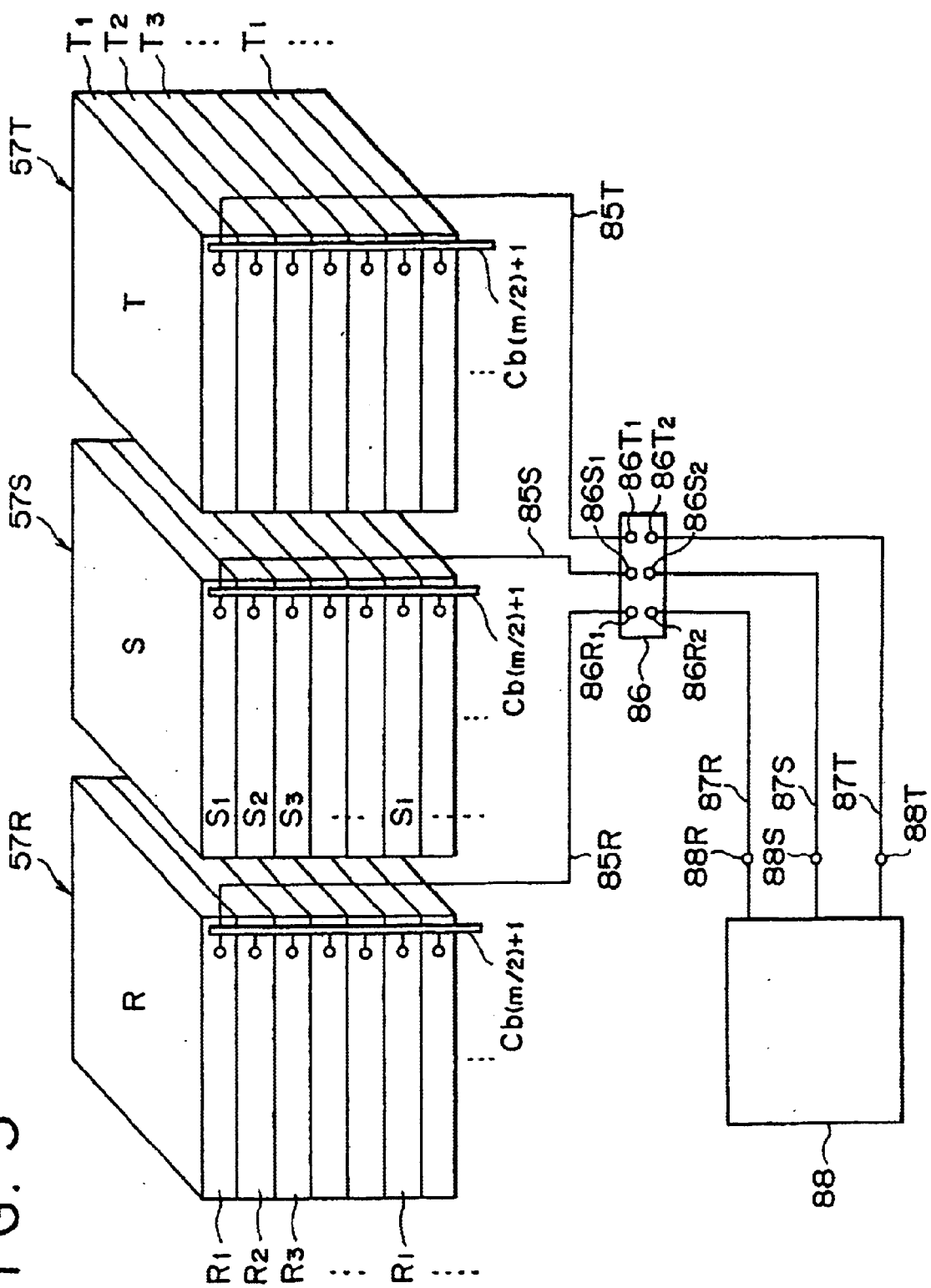
FIG. 5 is a schematic descriptive view illustrating an example of the dry load test apparatus and under test power supply of FIG. 1 to FIG. 4.
Figure 6:
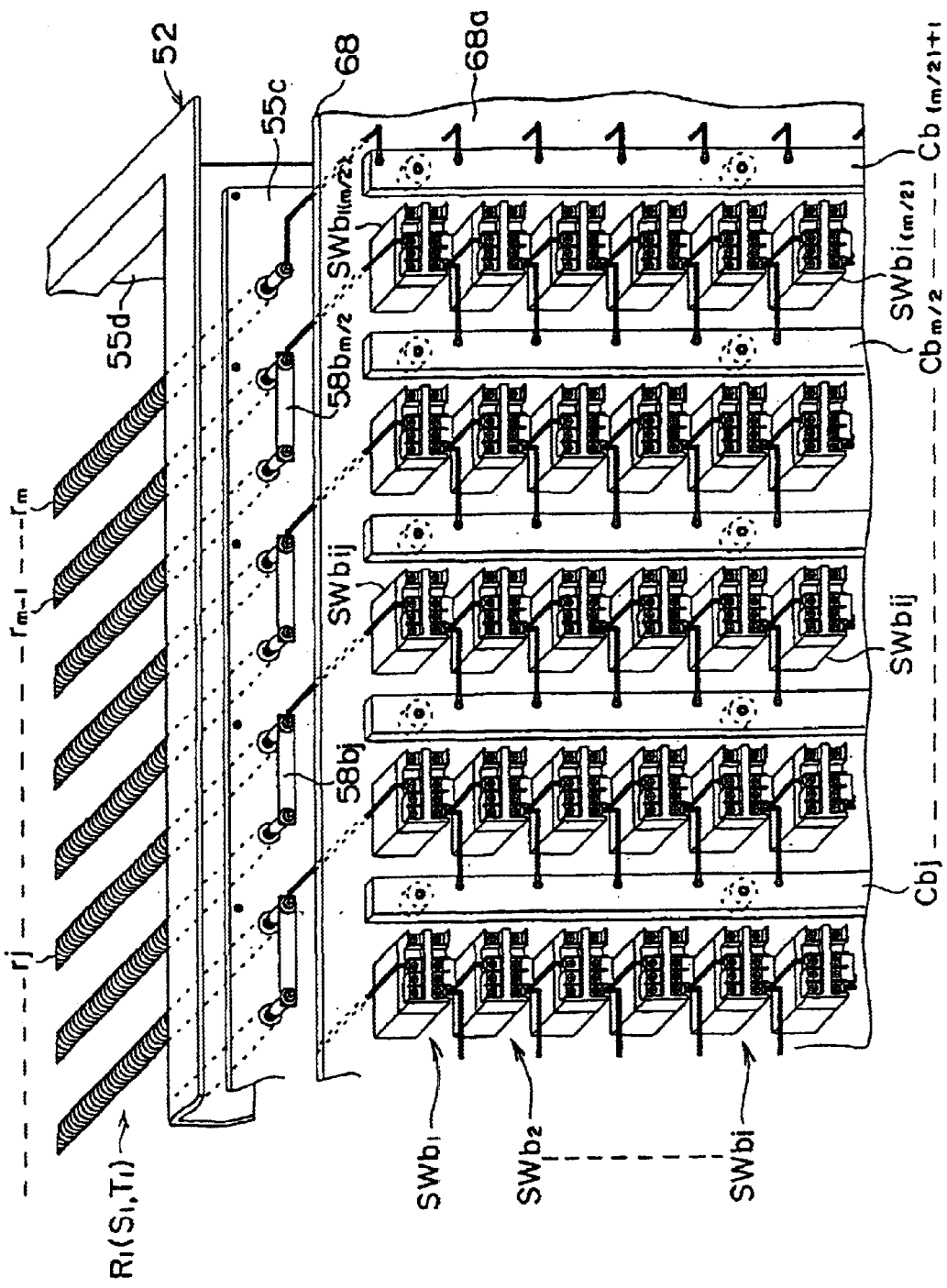
FIG. 6 is a partially perspective view where a portion of FIG. 3 is enlarged and seen askew.

As shown in FIG. 1B, FIG. 2, FIG. 3 and FIG. 4, the dry load test apparatus 40 comprises a frame 41 provided within the load chamber 33, and R-phase, S-phase, T-phase resistor units 42, 43 and 44 adjacently disposed on the frame 41 at front and rear sites thereof (refer to FIG. 1A, FIG. 5 and FIG. 6). Each of the resistor units 42, 43 and 44 has the same configuration.

<Each of the Resistor Units 42, 43 and 44>

Figure 7A:
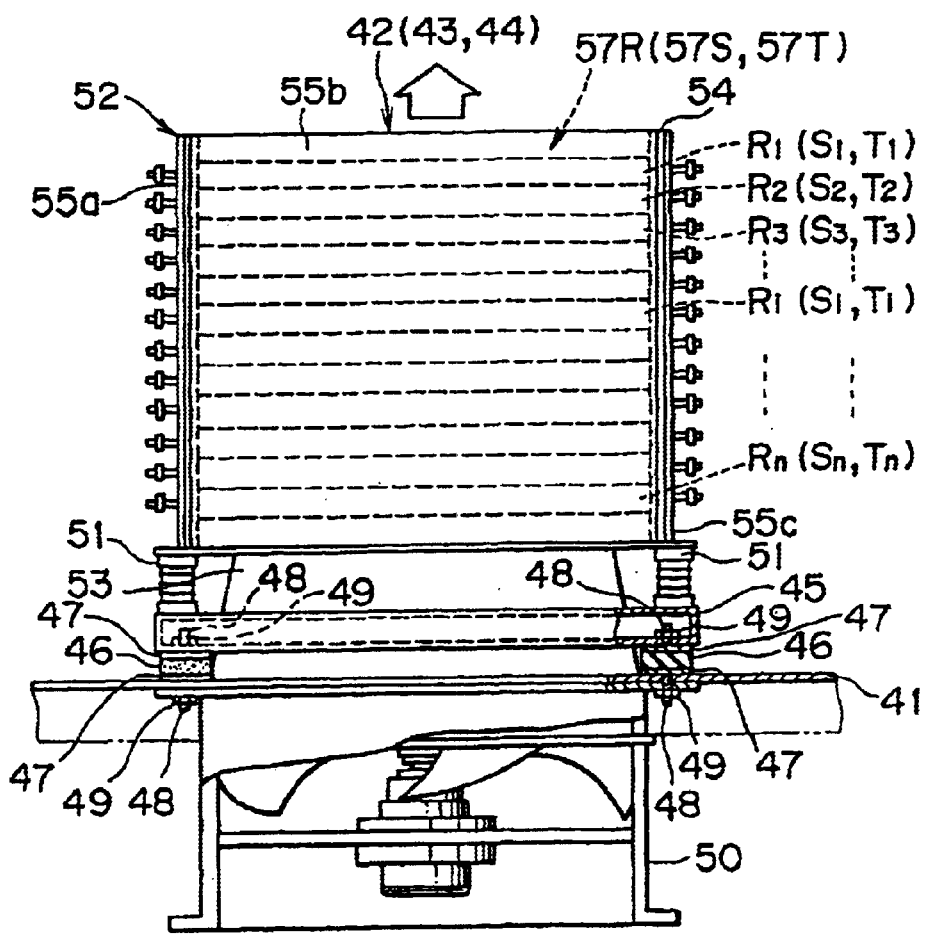
FIG. 7A is a side elevation view of the resistor unit where a portion of the electric fan of FIG. 3 and FIG. 4 are broken and seen.

As shown in FIG. 7A, each of the resistor units 42, 43 and 44 comprises a base frame 45 disposed on the frame 41, a vibration isolation rubber 46 interposed between the frame 41 and the base frame 45 having heat resistance and insulation property, plates 47 and 47 baking fixed at both the upper and lower ends of the vibration isolation rubber 46, fixing bolts 48 and 48 integrally provided with the plates 47 and 47 and penetrating the frame 41 and the base frame 45, respectively, and fixing nuts 49 and 49 respectively screwed at both ends of the fixing bolts 48 and 48.

Figure 8:
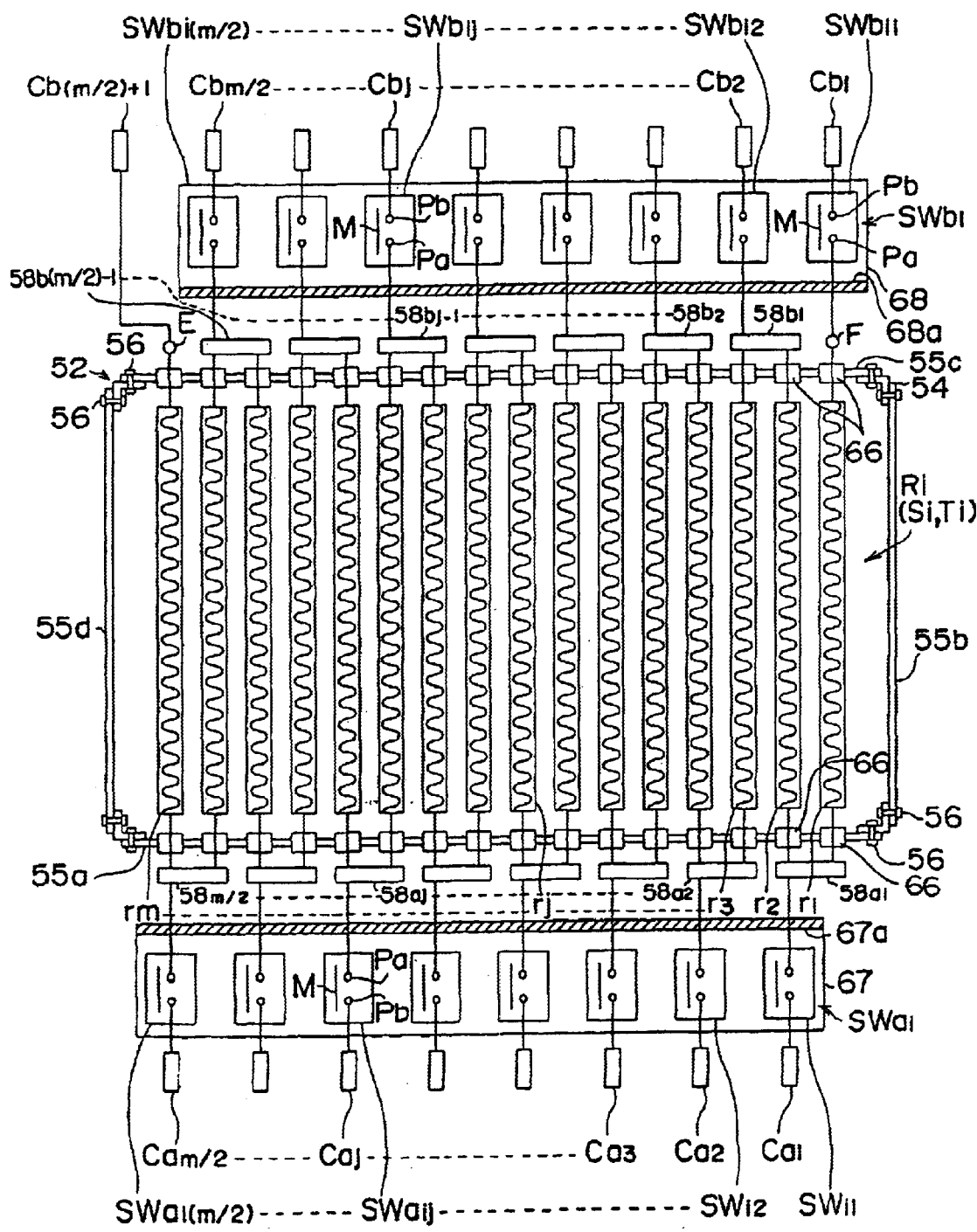
FIG. 8 is a enlarged cross sectional view illustrating a relation between the resistor unit and the switching member of FIG. 7A.
Figure 9:
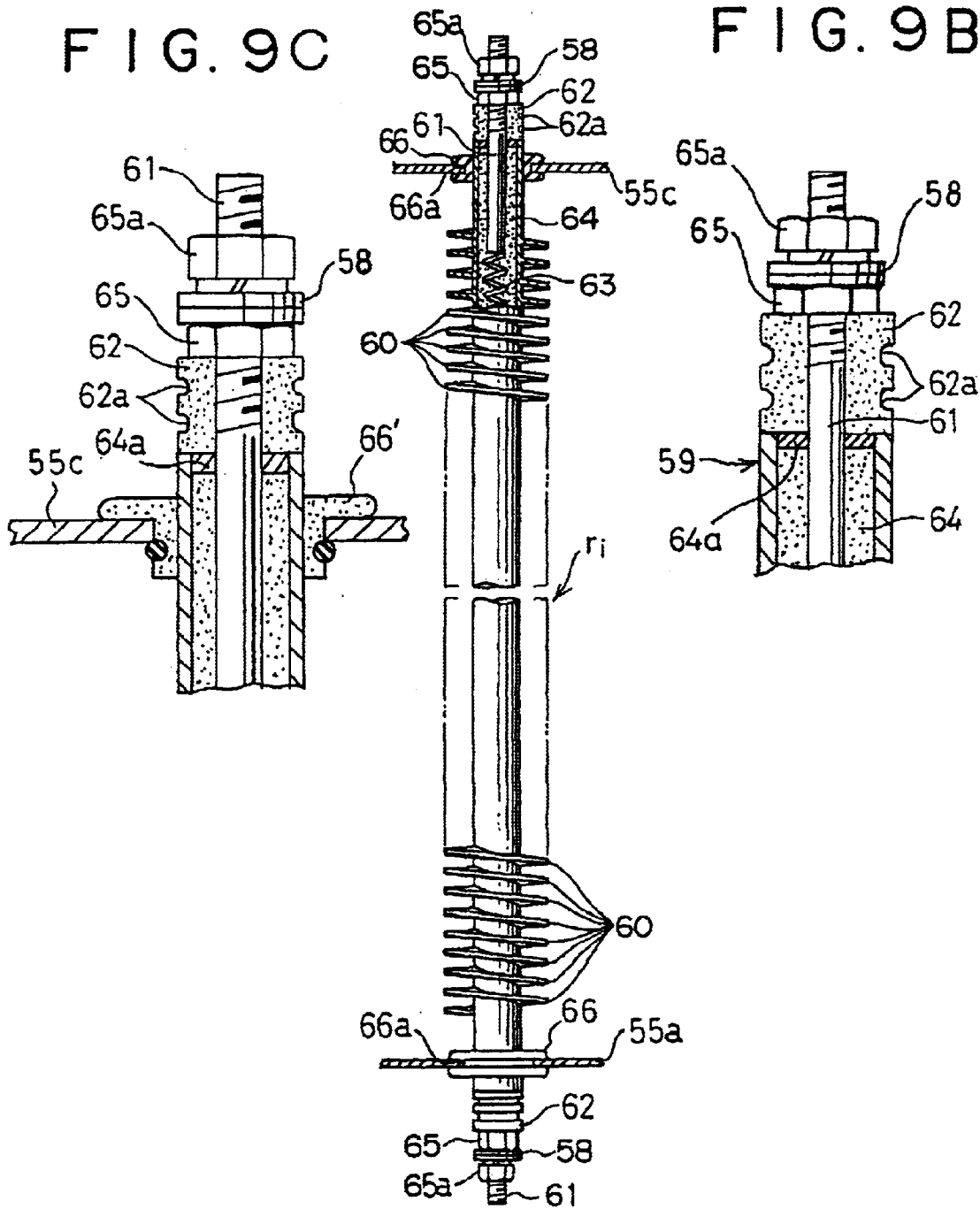
FIG. 9A is a descriptive view where a portion of the resistor element shown in FIG. 8 is broken and illustrated in detail.
FIG. 9B is a descriptive view illustrating an enlarged structure of an end of the resistor element of FIG. 9A.
FIG. 9C is a descriptive view illustrating another example of a holding structure of the end of the resistor element of FIG. 9A.

Further, each of resistor units 42, 43 and 44 comprises an electric fan 50 disposed below the base frame 45 and the frame 41 and attached to the frame 41, an isolator (isolation member) 51 fixed on the base frame 45, a housing 52 fixed on the isolator 51 and opened at the upper and lower ends thereof (refer to FIG. 6), an isolation hood 53 which guides cooling wind from the electric fan 50 to the housing 52. As shown in FIG. 8, the housing 52 has a structure that side face openings of a frame 54 having a hexagonal shape formed with angles are closed with side opening closure plates such as isolation plates 55a, 55b, 55c and 55d made of heat resistance material of epoxy group. The isolation plates 55a, 55b, 55c and 55d (refer to FIG. 6) are fixed on the frame 54 with fixing device 56 of bolt, nut and the like. Moreover, the side opening closed plate of isolation plates 55b and 55d and the like can be replaced with that of heat resistive and non combustible material other than dielectric material. For example, an aluminum plate or an iron plate can be used as the material.

Figure 7B:
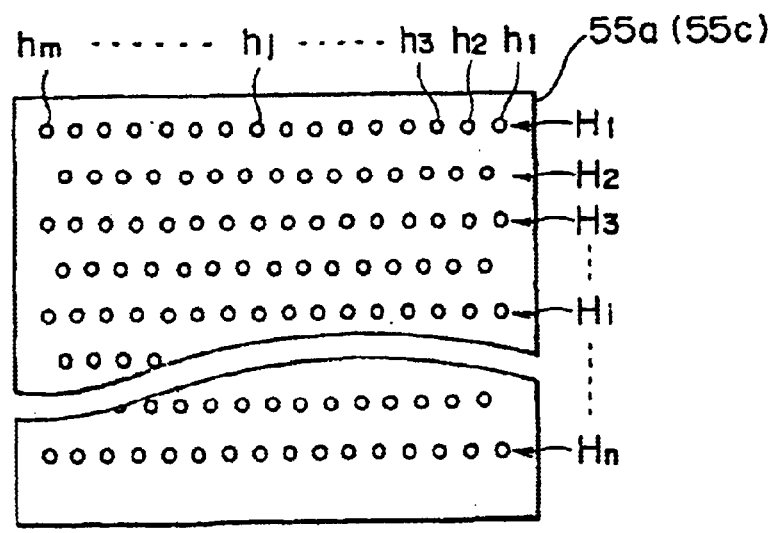
FIG. 7B is a descriptive view of isolation plate of FIG. 7A.

On the isolation plates 55a and 55c, numerous attaching opening columns Hi [i=1, 2, 3 cn] are formed in upper and lower with multi stages with an equal pitch, as shown in FIG. 7B. The attaching opening columns Hi are formed with a large number of attaching openings hj [j=1, 2, 3 cm] which are disposed horizontally with an equal pitch. In this example, the attaching opening columns Hi are provided with twenty two columns (i=n=22), the attaching openings hj are provided with sixteen columns (j=m=16). Moreover, the attaching openings hj are not limited to the sixteen columns, and the attaching opening columns Hi are not limited to the twenty two columns. Moreover, the attaching openings hj of the upper and the lower attaching opening columns Hi is disposed differently one another with shifted by half pitch horizontally.

<Resistor Body of each of the Resistor Units 42, 43 and 44>

Figure 10:
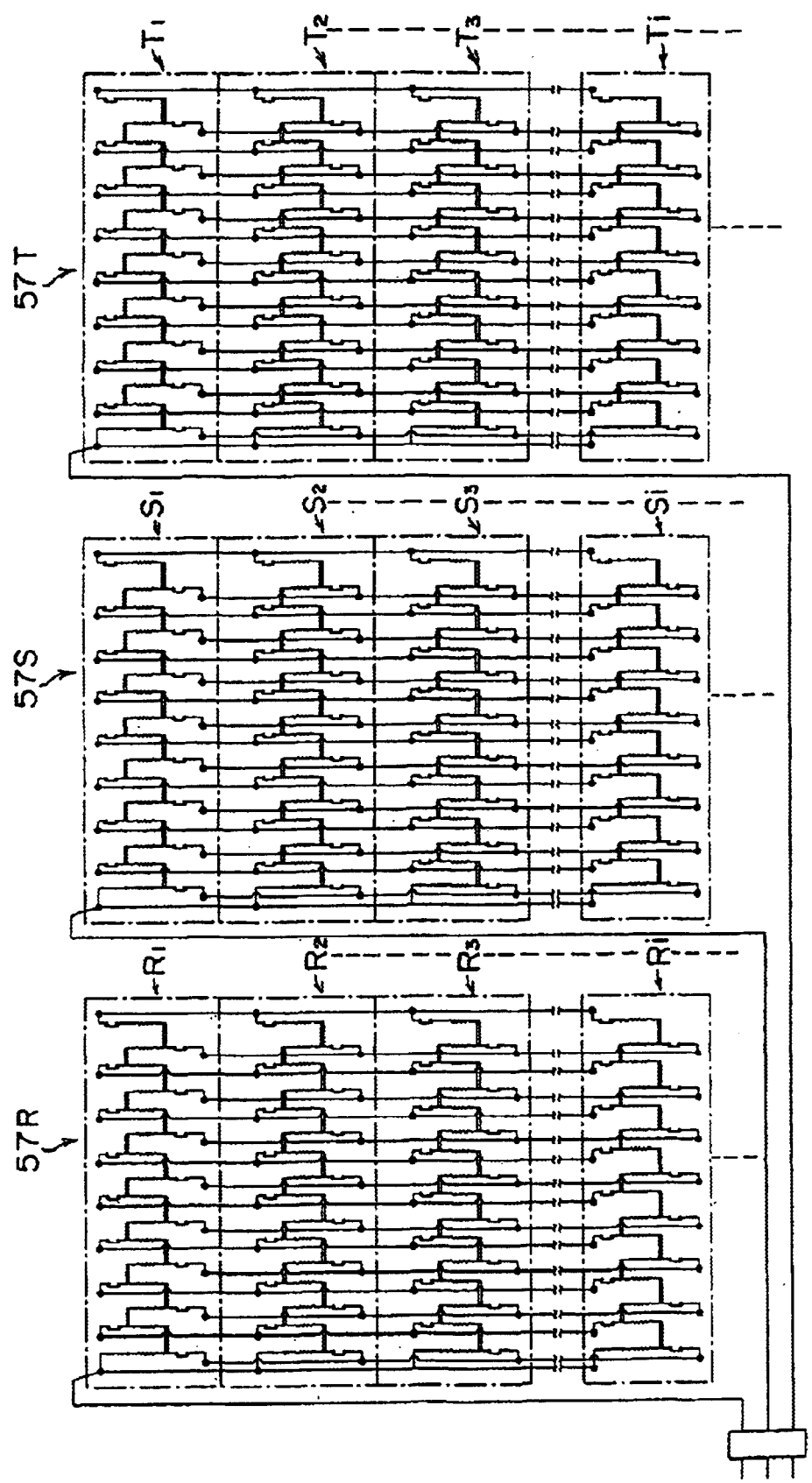
FIG. 10 is a circuit diagram of the dry load test apparatus of FIG. 1 to FIG. 8.
Figure 11:
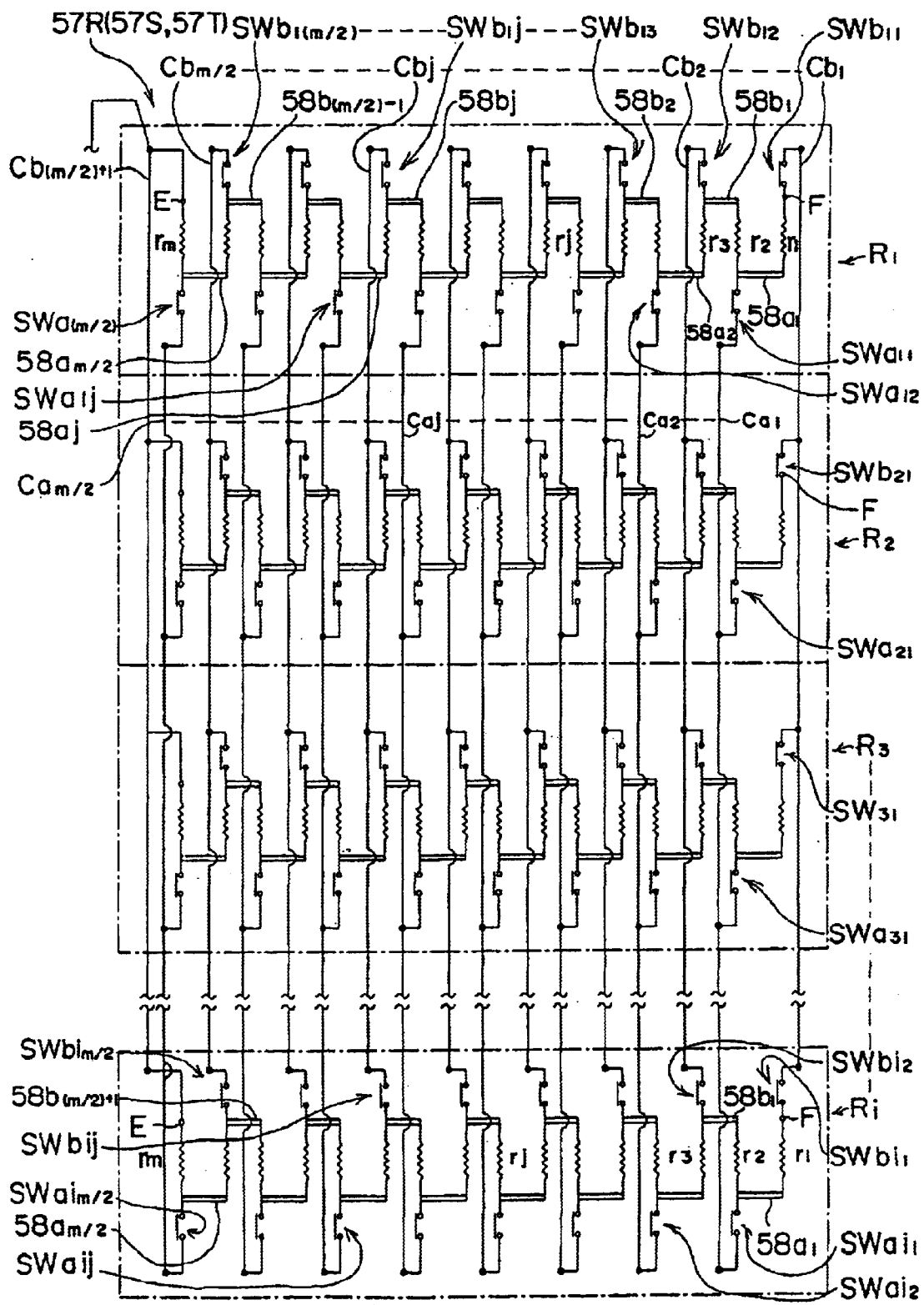
FIG. 11 is a partially enlarged descriptive view of FIG. 10.
Figure 12:
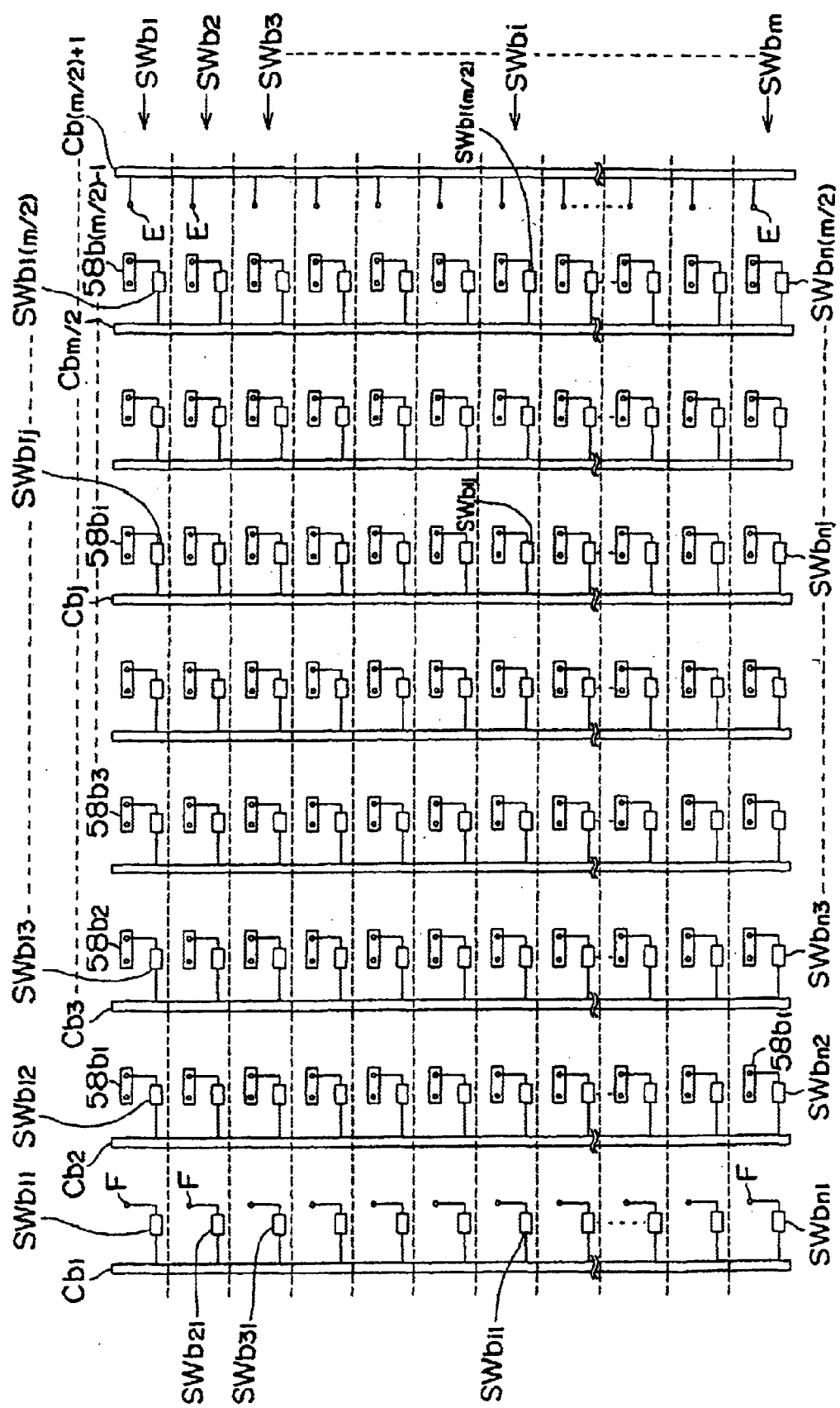
FIG. 12 is a descriptive view illustrating an arrangement relation between the switching member and the inter assembly conductive member as seen in the direction of arrow A of FIG. 2.
Figure 13:
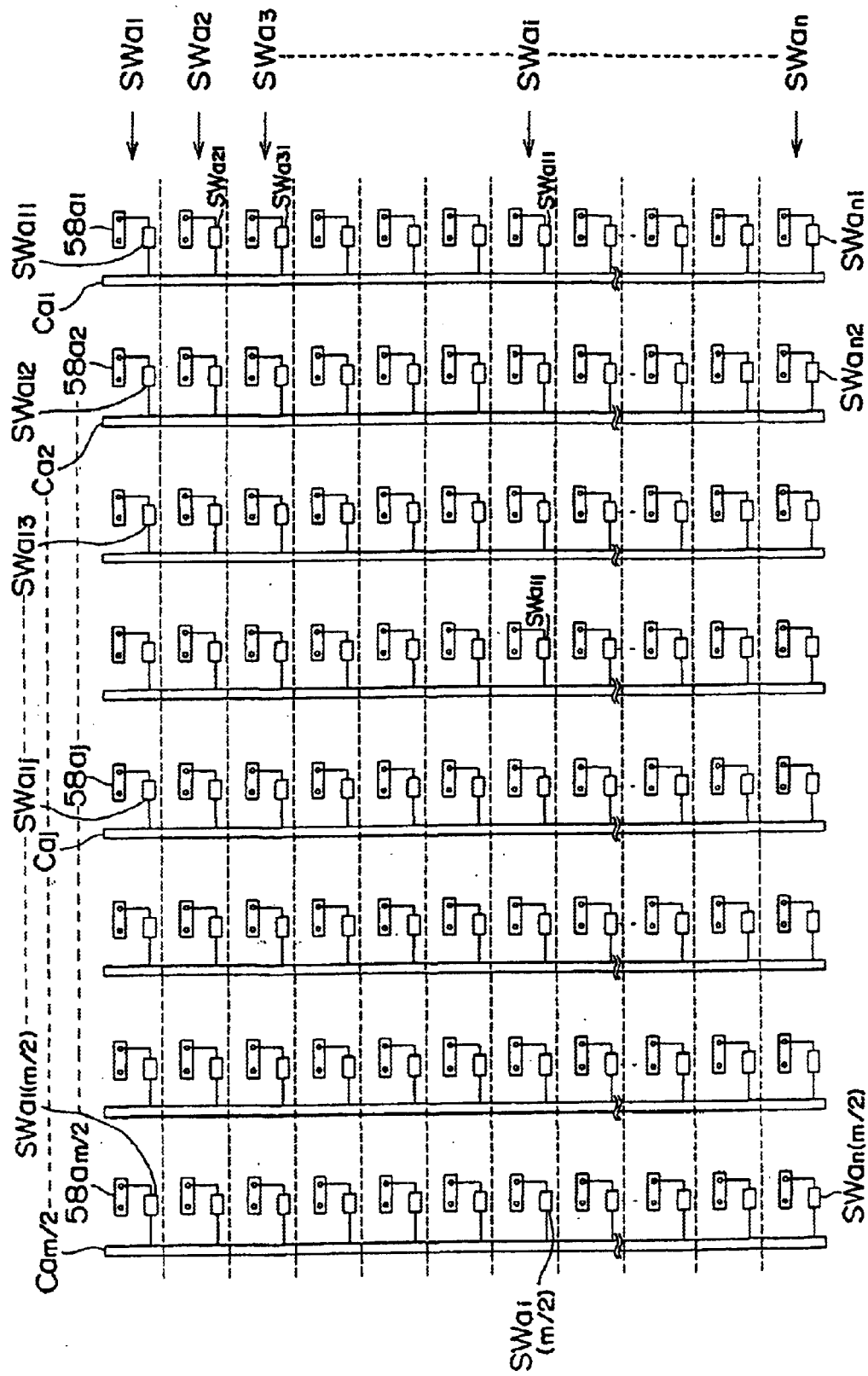
FIG. 13 is a descriptive view illustrating an arrangement relation between the switching member and the inter assembly conductive member as seen in the direction of arrow B of FIG. 2.

Also, each of the resistor units 42, 43 and 44 comprises resistor bodies 57R, 57S and 57T disposed within the housing 52, as shown in FIG. 2, FIG. 5 and FIG. 7A. The resistor bodies 57R, 57S and 57T comprises numerous flat shaped resistor assemblies Ri, Si and Ti [i=1, 2, 3 cn] which correspond to the attaching opening columns Hi and are disposed in upper and lower with multi stages (refer to FIG. 10 and FIG. 11). Since the attaching opening columns Hi are twenty two columns in this example, the resistor assemblies Ri, Si and Ti are also provided with twenty two stages corresponding to the attaching opening columns Hi. Moreover, FIG. 11 illustrates a connection relation of all the resistor assemblies Ri, Si and Ti in which reference numerals are attached only to the large parts for convenience of drawing. Further, since the configurations of the resistor assemblies Ri, Si and Ti of FIG. 10 are the same, common parts of the resistor assemblies Ri, Si and Ti are enlarged and shown in FIG. 11, and reference numerals which cannot be attached to FIG. 10 are attached to FIG. 11.

As shown in FIG. 8, the resistor assemblies Ri, Si and Ti comprises a plurality of bar shaped resistor elements (heaters) rj [j=1, 2, 3 cm] which are provided side by side in a flat shape (plane shape) and both ends are held at the isolation plate, and electrically conductive connection pieces 58aj and 58bj-1 [j=1, 2, 3 cm/2] to which the adjacent plurality of resistor elements (heaters) rj are serially connected at the end. The plurality of resistor elements (heaters) rj are arranged corresponding to the attaching openings hj so that the number of them is sixteen corresponding to the attaching openings hj in this example. As mentioned above, since the attaching openings hj of the attaching opening columns Hi are disposed to be shifted horizontally by half pitch, the resistor elements rj attached to the attaching openings hj of the upper and lower attaching opening columns Hi are disposed to be shifted horizontally by half pitch one another so that the longitudinal resistor elements rj are arranged in zigzag. With this, cooling wind blown by the electric fan 50 from the lower side among the isolation plates 55a, 55b and 55c efficiently reaches the resistor elements rj attached to the attaching openings hj of the upper and lower attaching opening columns Hi so that all the resistor elements rj of the attaching opening columns Hi are efficiently cooled.

Moreover, each of the electrically conductive connection pieces 58aj of the multi stage resistor assemblies R1 to Rn constitutes connection piece column in a line vertically, each of the electrically conductive connection pieces 58bj-1 of the multi stage resistor assemblies R1 to Rn constitutes connection piece column in a line vertically, and each of the resistor elements (heaters) rj of the multi stage resistor assemblies R1 to Rn constitutes resistor element column arranged in a line vertically.

(Resistor Elements of the Resistor Assemblies Ri, Si and Ti)

As shown in FIG. 9A, the resistor elements rj comprises a barrel body 59 made of metal material having high thermal conductivity or stainless steel and the like, a radiating fin 60 fixed at the outer periphery of the barrel body 59, a bar shaped electrodes 61 and 61 whose one end is inserted concentrically into the both ends of the barrel body 59, and isolation bodies (isolation members) 62 and 62 fixed integrally and concentrically at the outer periphery of the central portion of the bar shaped electrodes 61 and 61. The isolation body 62 consists of dielectric isolator made of ceramic and the like, and an annular groove 62a is formed to prevent dust from being attached on the peripheral surface.

Further, the resistor elements rj comprises a resistor line (heater line of nichrome wire and the like) 63 which are disposed at the center of the barrel body 59 and the both ends are connected to the bar shaped electrodes 61 and 61, dielectric materials (isolation members) 64 of magnesia and the like filled in the space among the inner surface of the barrel body 59, one end of the bar shaped electrodes 61 and 61 and the resistor line 63, fixing nuts 65 and 65a screwed at the other end of the bar shaped electrode 61.

Further, the electrically conductive connection piece 58 is tightened between the fixing nuts 65 and 65a to be fixed to the resistor elements rj.

Also, as shown in FIG. 9A and FIG. 9B, an annular or cylindrical heat resistive caulking material (heat resistive sealing material) 64a is fitted between the end of the barrel body 59 and the bar shaped electrode 61 and pressed with the isolation body (isolation member) 62 so that warm air cannot come into the isolation body 64 with the hear resistive caulking material 64*a*. Further, in order to resist high pressure, the length of the isolation body 62 is set to, for example, about 10 mm or more so that sufficient isolation distance are ensured between the electrically conductive connection piece 58 and the barrel body 59.

An isolation member 66 having heat resistance and elasticity is fixed in the vicinity of the both end of the barrel body 59. The isolation member 66 is made of silicon rubber (synthetic resin) having heat resistance, elasticity and the like. Further, an annular attaching groove 66*a* is formed at the central portion of the isolation member 66.

The resistor elements (heaters) rj of the resistor assemblies Ri, Si and Ti are disposed corresponding to the attaching openings hj of the attaching opening columns Hi, as mentioned above. Further, the resistor elements (heaters) rj are fixed (held) on the isolation plates 55*a* and 55*c* with the isolation members 66 and 66 of both end sides thereof fitted into the attaching openings hj and hj of the isolation plates 55*a* and 55*c* and the isolation plates 55*a* and 55*c* engaged into the annular attaching grooves 66*a* and 66*a* of the isolation members 66 and 66.

The barrel body 59 is held on the isolation plates 55*a* and 55*c* with the isolation member 66 having heat resistance and elasticity so that vibration impact of moving a truck at the time is transferred to the resistor elements rj, thereby preventing the resistor elements rj from being broken by such vibration impact. Further, the isolation plates 55*a* and 55*c* supporting the resistor elements rj are formed with epoxy resin group made of material having relative heat resistance, but the isolation member 66 is formed with a silicon rubber (synthetic resin) having heat resistance and the like so that heat of the resistor elements rj cannot be directly transferred to the isolation plates 55*a* and 55*c*, thereby increasing durability of the isolation plates 55*a* and 55*c*.

Also, the isolation member 66 is formed with silicon rubber (synthetic resin) having heat resistance and elasticity in this example, but the present invention is not necessarily limited to it. That is, in case where the dry load test apparatus 40 is mounted on the truck to be used without moving, the isolation member 66 is formed with a dielectric isolator 66' made of ceramic as shown in FIG. 9C so that the isolation plates 55*a* and 55*c* and the like may be held to the isolation member 66'.

<Switching member>

Further, as shown in FIG. 1, FIG. 2 and FIG. 8, the dry load test apparatus 40 comprises isolation plates 67 and 68 disposed at the position placed among the resistor units 42, 43 and 44 in the state that it is separated with the resistor units 42, 43 and 44 (refer to FIG. 3, FIG. 4 and FIG. 6). The isolation plates 67 and 68 are extended in the arrangement direction of the resistor units 42, 43 and 44 and formed with the size for covering the sides of the resistor units 42, 43 and 44. The lower ends of the isolation plates 67 and 68 are attached to the frame 41 with an attaching means (not shown) of bolt, nut and the like.

In the surface 67*a* and 68*a* of the opposite side to the side of the resistor units 42, 43 and 44 of the isolation plates 67 and 68, as shown in FIG. 2, first switching member columns SWai and SWbi [i=1, 2, 3, cn] are disposed with multi stages corresponding to the resistor assemblies Ri, Si and Ti (refer to FIG. 3, FIG. 4, FIG. 12, FIG. 13 and FIG. 14).

Each of the first switching member columns SWai and SWbi comprises first switching members SWaij and Swbij [j=1, 2, 3, cm/2] whose the number is half of the resistor elements (heaters) rj of the resistor assemblies Ri, Si and Ti. The first switching members SWaij and SWbij have a normally opened contact, and are attached to the isolation plates 67 and 68, respectively.

(Configuration of the Switching Members SWaij and SWbij)

Figure 18:
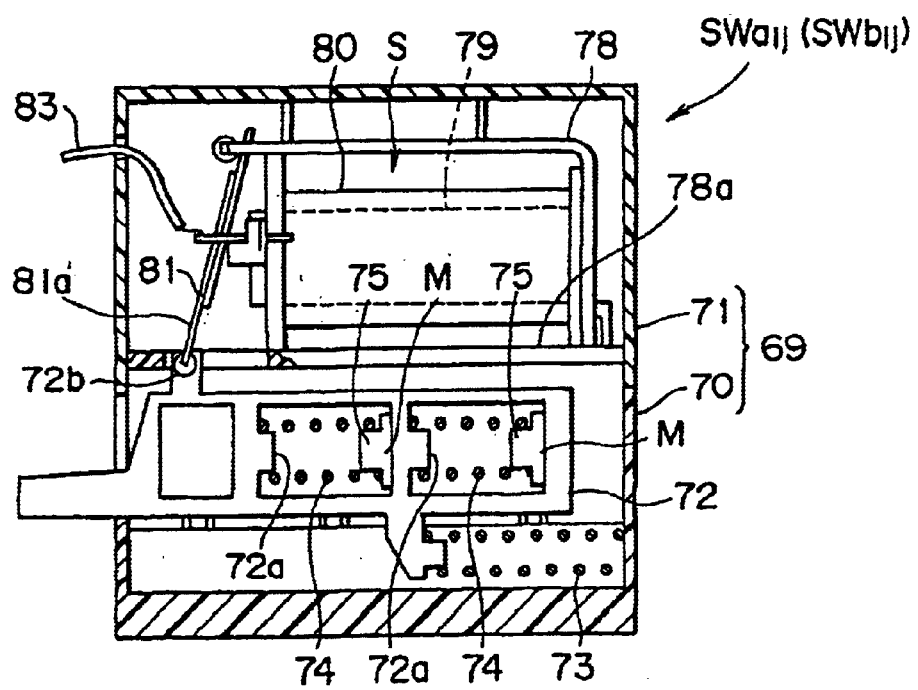
FIG. 18 is a longitudinal cross sectional view of the switching member of FIG. 16.
Figure 19:
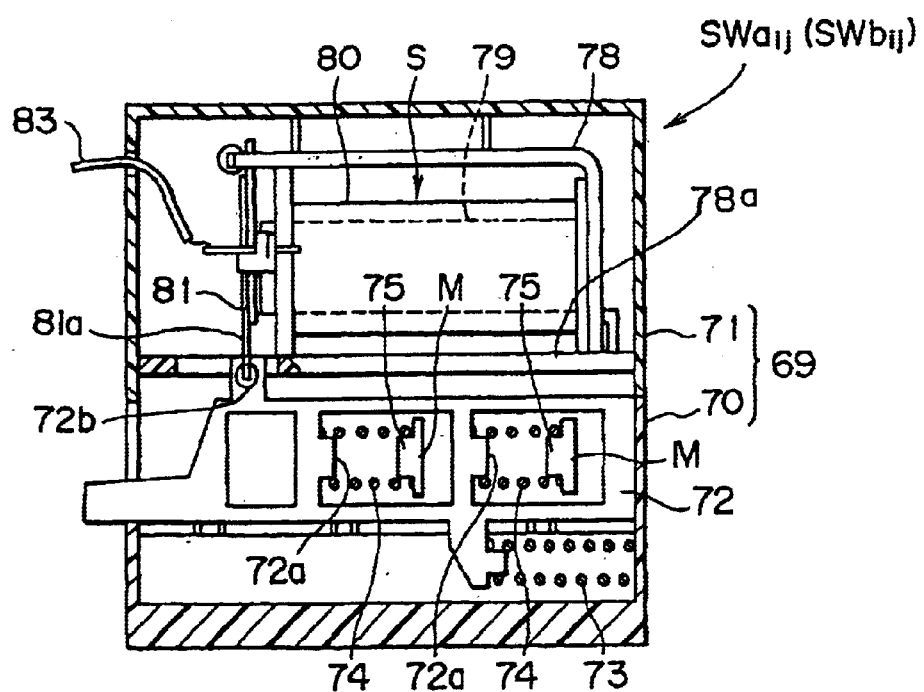
FIG. 19 is a descriptive view of operation of the switching member of FIG. 18.
Figure 20:
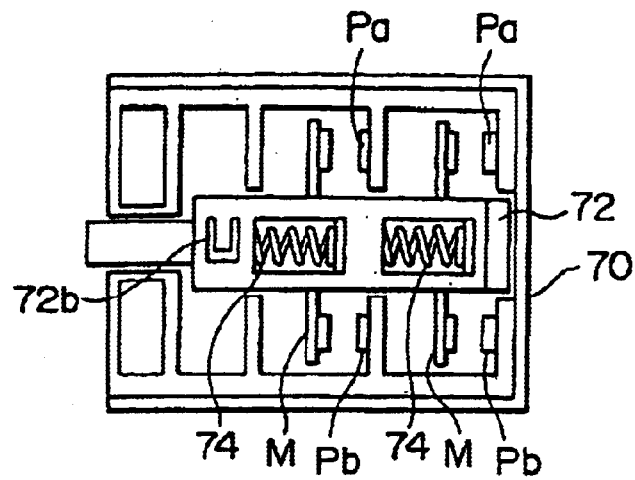
FIG. 20 is a plan view of the contact holding case of the switching member of FIG. 16.
Figure 21:
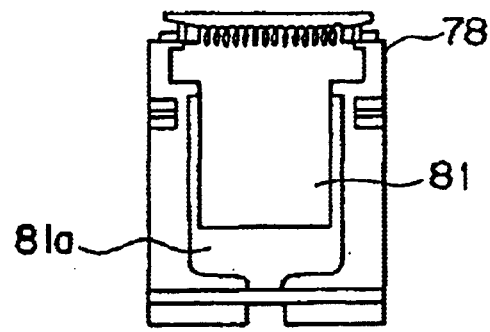
FIG. 21 is a left side elevation view of the solenoid of FIG. 18.
Figure 22:
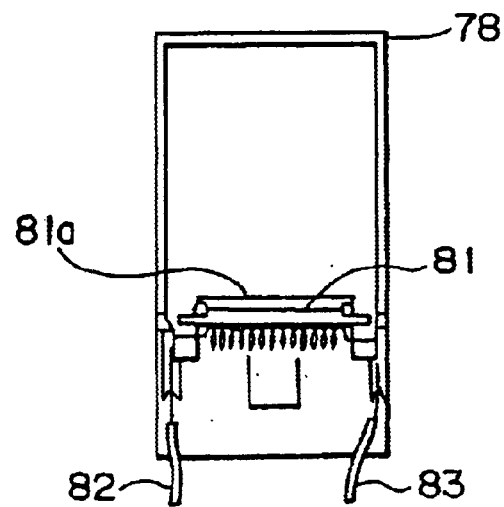
FIG. 22 is a plan view of FIG. 21.
Figure 23:
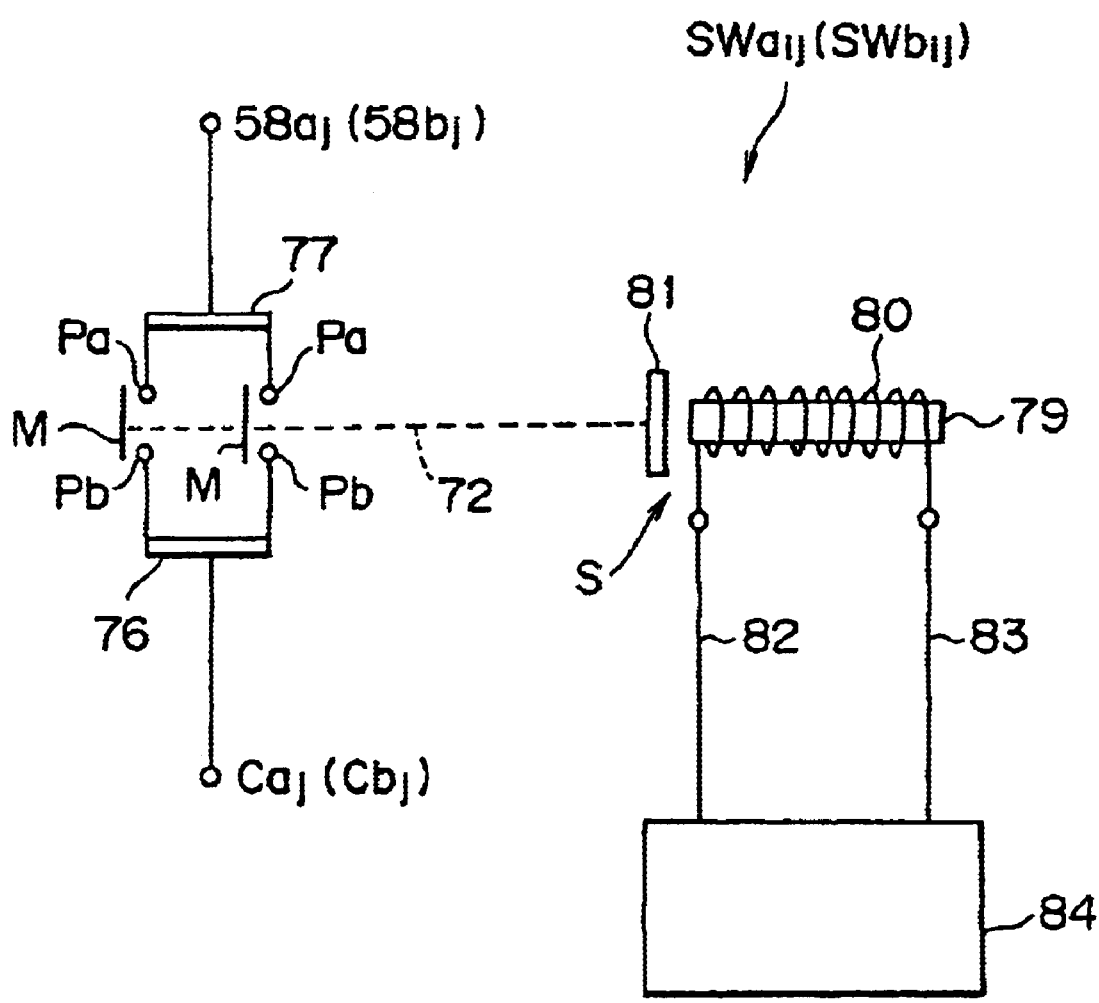
FIG. 23 is a schematic circuit diagram for operative control of the switching member shown in FIG. 16.

The first switching members SWaij and SWbij have the configuration as shown in FIG. 16 to FIG. 23. That is, the first switching members SWaij and SWbij have a case 69. The case 69 has a contact case (partition case) 70 of dielectric material of Teflon and the like resisting high voltage, and a solenoid case (partition case) 71 of dielectric material of Teflon and the like resisting high voltage, which are connected to be separable each other. Two sets of stationary contact pairs consisting of first and second stationary contacts Pa and Pb are provided to the contact case 70, as shown in FIG. 20. Further, the stationary contacts Pa and Pa are provided side by side at one side of the contact case 70, and the stationary contacts Pb and Pb are provided side by side at the other side of the contact case 70.

Further, at the position placed between the stationary contacts Pa and Pa and the stationary contacts Pb and Pb, a contact holding member 72 consisting of dielectric material of synthetic resin and the like is disposed to be movable parallel to the arrangement direction of the stationary contacts Pa and Pa. The contact moving member 72 is spring biased with one side of the longitudinal direction (left in FIG. 18 to FIG. 20) by a spring 73.

As shown in FIG. 18 and FIG. 19, contact moving slits 72*a* and 72*a* which penetrate horizontally with interval in the longitudinal direction are formed at the contact holding member 72, and spring hold projections 72*b* and 72*b* are formed at one side of end wall of the contact moving slits 72*a* and 72*a*. In the projections 72*b* and 72*b*, one end of springs 74 and 74 is engaged to be held, and in the other end of the springs 74 and 74, projections 75 and 75 provided on the center of flat shaped movable contacts M and M are engaged to be held. The springs 74 and 74 tightly press the movable contacts M and M on the end wall of the contact moving slits 72*a* and 72*a*.

Both end contact portions of the movable contact M are opposite to the stationary contacts Pa and Pb. Besides, the both end contact portions of the movable contact M are separated from the stationary contacts Pa and Pb with the spring force of the spring 73 so that the contacts Pa and Pb are normally opened contacted. Moreover, the stationary contacts Pa and Pa are connected by a terminal plate 76, and the stationary contacts Pb and Pb are connected by a terminal plate 77. With such configuration, the contacts Pa, Pa, Pb and Pb can resist some degrees of high voltage.

A base plate 78*a* made of Teflon and the like resisting high voltage is provided in the opening portion of the solenoid case 71, and the base plate 78*a* isolates the space within the case 71 and the space within the case 72 against high voltage. A solenoid holding frame 78 fixed on the base plate 78*a* is fixed to the solenoid case 71, and a solenoid S as a driving means is attached to the solenoid holding frame 78.

The solenoid S comprises an iron core 79 fixed on the solenoid holding frame 78 and extended parallel to the contact holding member 72, a coil (solenoid body) 80 wound on the iron core 79, a movable iron plate 81 held at the solenoid holding frame 78 and rotated to advance and retreat with respect to the iron core 79, and an isolation engagement plate 81*a* formed with a material such as Teflon resisting high voltage and fixed at the movable iron plate 81. The isolation engagement plate 81*a* further projects to lower side from the movable iron plate 81 so that a front end (lower end) of the isolation engagement plate 81*a* is engaged into the engaged recess portion 72b of the contact holding member 72. Further, an electric conduction control circuit 84 is connected to the coil 80 through lead lines 82 and 83.

The lead lines 82 and 83 are drawn out from the solenoid case 71 in the edge portion of the side separated from the contact case 70. With this, the lead lines 82 and 83 are set to be separated from the stationary contacts Pa and Pb or the movable contact M so that withstand voltage between the lead lines 82 and 83 and the stationary contacts Pa and Pb or the movable contact M is improved.

Further, if the coil 80 is electrically conducted with the electric conduction control circuit 84, the movable iron plate 81 is attractively moved to the fixing iron core 79 with magnetic force and magnetically attached to the fixing iron core 79 so that the solenoid S becomes in an operating state (ON). Besides, with the attractive movement, the isolation engagement plate 81a which integrally moves with the movable iron plate 81 moves the contact holding member 72 in the right side of the FIG. 18 to FIG. 20 with resisting spring force of the spring 73. With this, the movable contact M is attached to the stationary contacts Pa and Pb, and the stationary contacts Pa and Pb can be conducted (shorted). (Connection to the Electrically Conductive Connection Piece of the Switching Members SWaij and SWbij)

Further, one end (stationary contact Pa) of the first switching members SWaij is connected to each of the electrically conductive connection pieces 58aj, one end (stationary contact Pa) of the first switching members SWbij is connected to an end F to which the electrically conductive connection pieces of the resistor elements rj are not attached, and one end (stationary contact Pa) of the other first switching members SWbij is connected to each of the electrically conductive connection pieces 58bj-1.

<Inter Assembly Conductive Member>

Further, the other end (the stationary contact Pb) of the first switching members SWai of numerous resistor assemblies Ri, Si and Ti disposed in the upper and lower with multi stages is connected to each of inter assembly conductive members Caj [j=1, 2, 3 cm/2] to be conducted one another. Similarly, the other end (stationary contact Pb) of the first switching members SWbi of numerous resistor assemblies Ri, Si and Ti disposed in the upper and lower with multi stages is connected to each of inter assembly conductive members Cbj [j=1, 2, 3 cm/2] to be conducted one another. Further, the end E of the resistor elements rm of numerous resistor assemblies Ri, Si and Ti to which the electrically conductive connection pieces are not attached is connected to the inter assembly conductive members Cb(m/2)+1 to be conducted one another.

<Connection Relation of the Resistor Assemblies Ri, Si and Ti>

Figure 14:
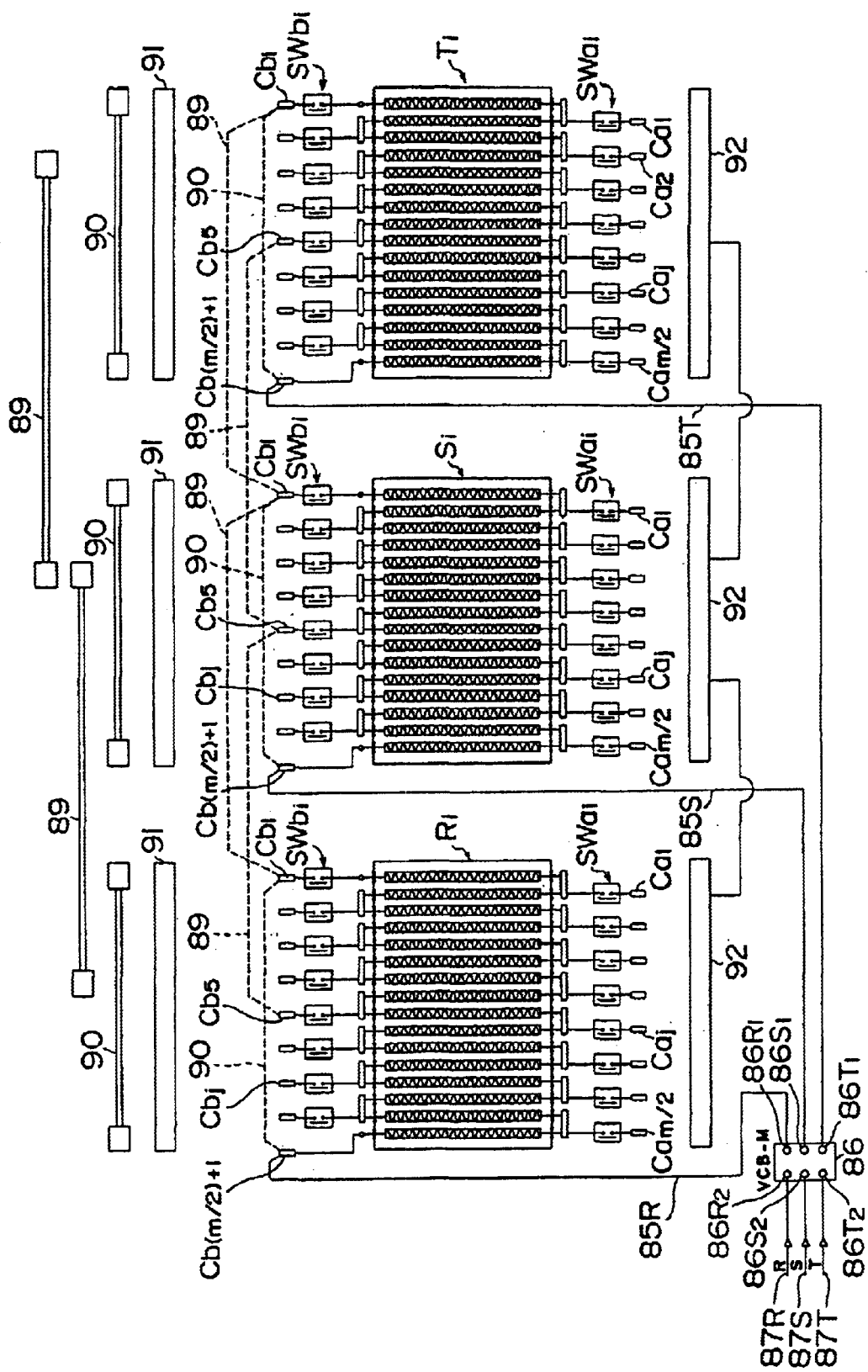
FIG. 14 is a descriptive view illustrating a relation between the resistor assembly and the member shorting the resistor element of the resistor assembly of FIG. 10.
Figure 15:
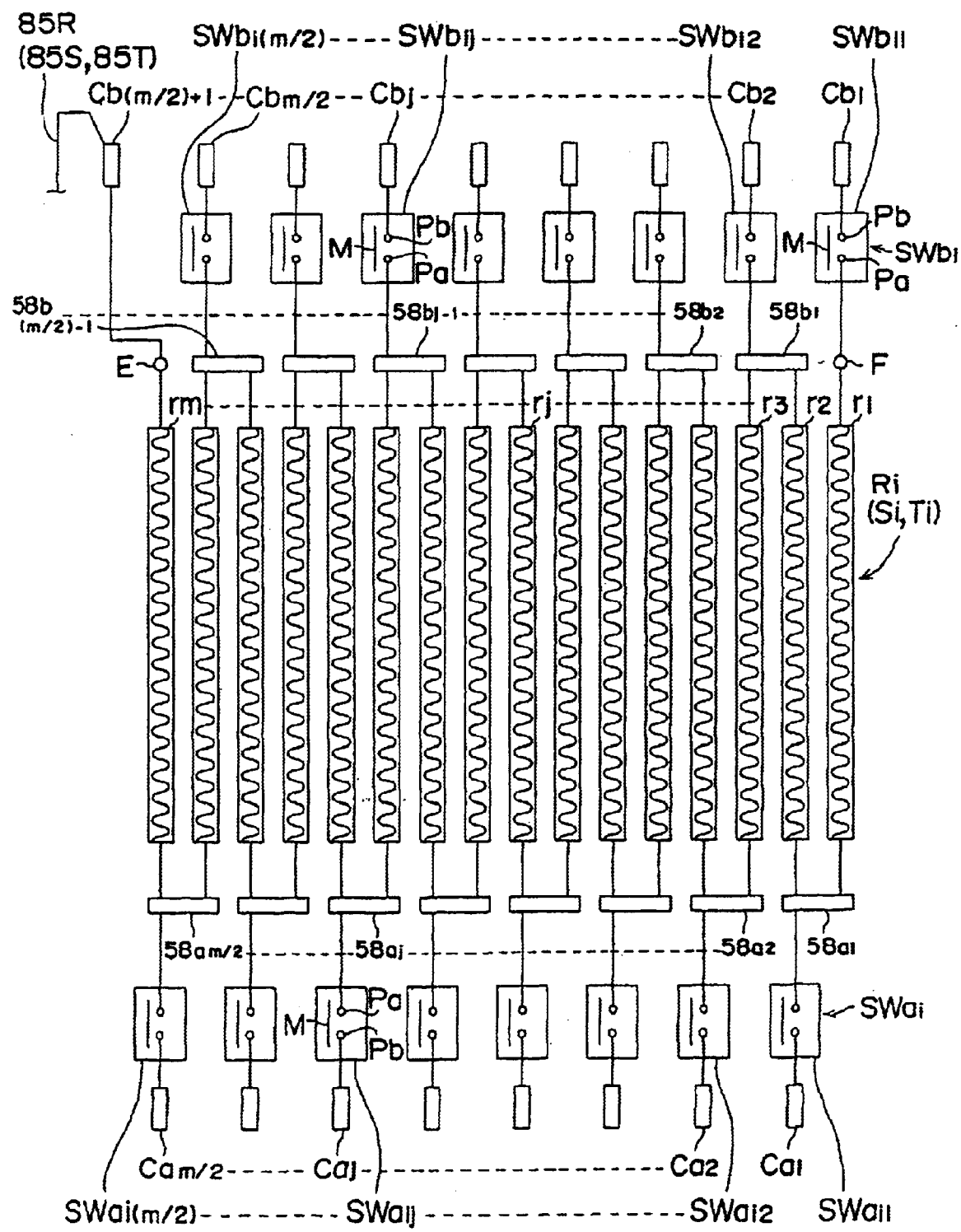
FIG. 15 is a partially enlarged descriptive view illustrating a relation between the resistor assembly and the switching member of FIG. 14.
Figure 16:
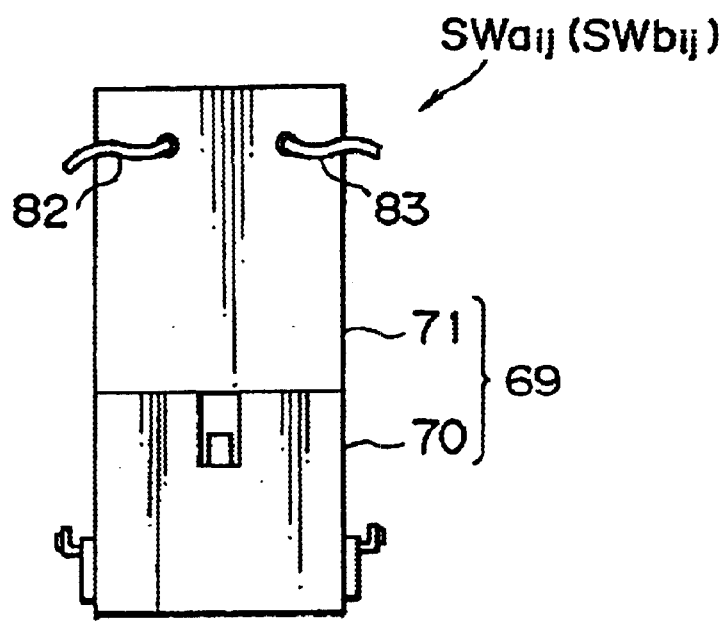
FIG. 16 is a front view of the switching member shown in FIG. 15.
Figure 17:
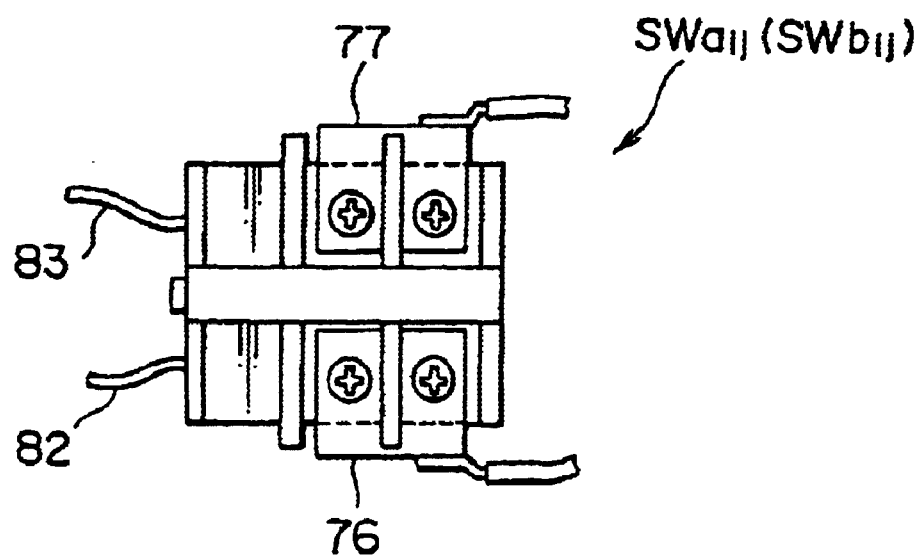
FIG. 17 is a bottom plan view of the switching member of FIG. 16.

The connection relation of the resistor assemblies Ri, Si and Ti is the same as shown in FIG. 14. Since FIG. 14 simultaneously illustrates the resistor assemblies Ri, Si and Ti, the only necessary reference numerals are attached and described for convenience of drawing in FIG. 14, and the detailed description is made in FIG. 15. Moreover, in FIG. 14 and FIG. 15, illustration of the isolation plates 67 and 68 shown in FIG. 8 is omitted for convenience of description.

The inter assembly conductive members Cb(m/2)+1 of the resistor assembly Ri are connected to a contact 86R1 of the main vacuum circuit breaker (VCB) 86 through a wiring 85R, the inter assembly conductive members Cb(m/2)+1 of the resistor assemblies Si are connected to a contact 86S1 of the main vacuum circuit breaker (VCB) 86 which is a high voltage switch through a wiring 85S, and the inter assembly conductive members Cb(m/2)+1 of the resistor assemblies Ti is connected to a contact 85T1 of the main vacuum circuit breaker (VCB) 86 through a wiring 85T. Contacts 86 R2, 86 S2 and 86 T2 of the vacuum circuit breaker (VCB) 86 are connected to the contacts 88R, 88S and 88T on the Ri, Si and Ti phases of three phase AC generator 88 through wirings 87R, 87S and 87T.

As mentioned above, by providing the switching members SWaij and SWbij and the inter assembly conductive members Caj, Cbj and Cb(m/2)+1, the conventional structure that ON/OFF must be performed at each stage of the resistor assemblies Ri, Si and Ti with the vacuum circuit breaker (VCB) is not needed, and the vacuum circuit breaker (VCB) is enough to be only the main vacuum circuit breaker (VCB) 86.

<Load Switching Connection Member>

The dry load test apparatus 40 comprises a shorting means for shorting a few of the resistor elements rj of the resistor assemblies Ri, Si and Ti. Shorting connection lines 89 and 89, shorting connection lines 90, 90 and 90, conductive plates (electrically conductive connection member) 91, 91 and 91 and inter connected conductive plates (electrically conductive connection members) 92, 92 and 92 are prepared as the shorting means.

<Electric Conduction Control Circuit 84>

Figure 24:
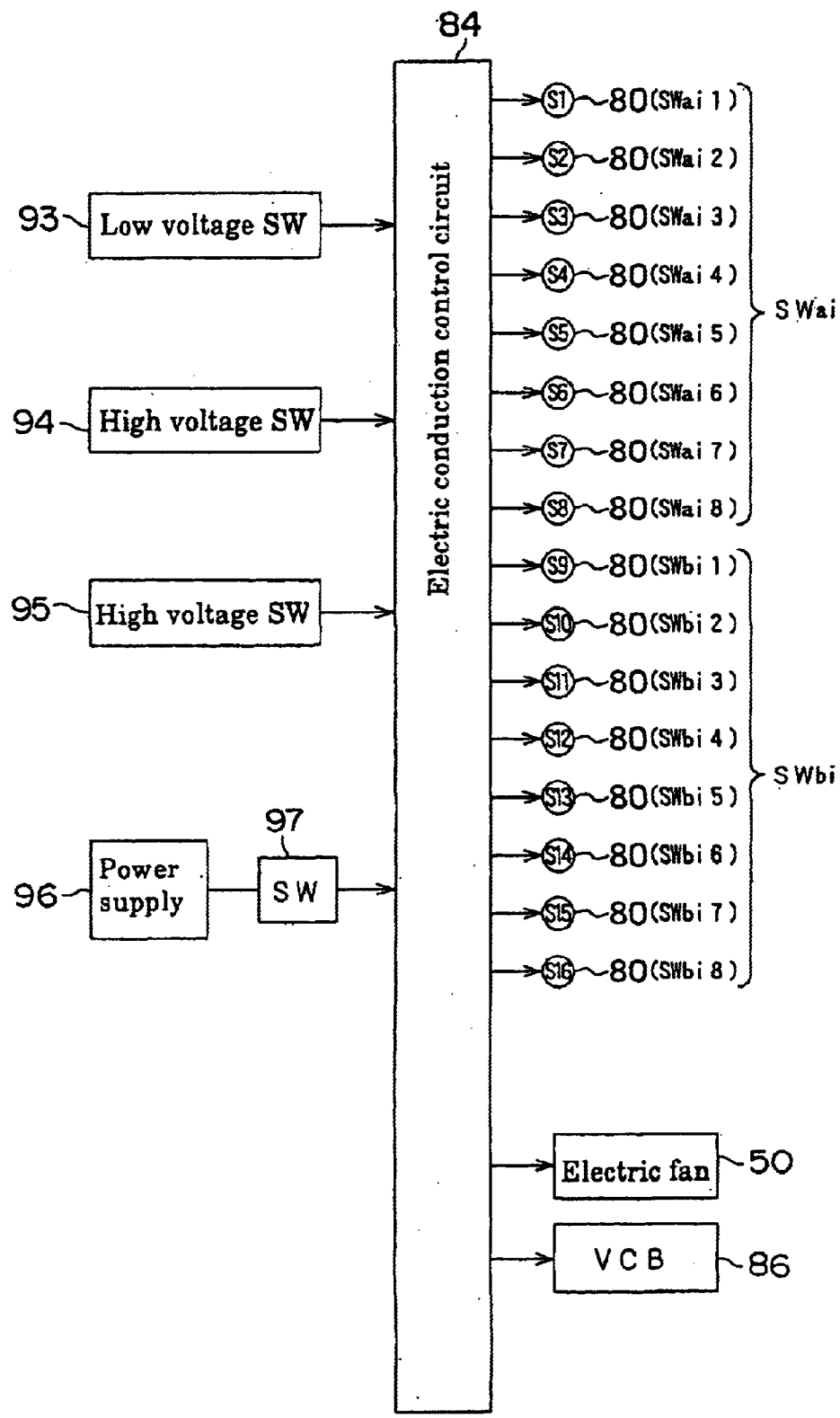
FIG. 24 is a control circuit diagram of the switching member shown in FIG. 15.

Further, as shown in FIG. 24, a low voltage switch for low voltage load test 93, a high voltage switch for high voltage load test 94, and a high voltage switch for high voltage load test 95 are connected to the above mentioned electric conduction control circuit 84, and further, a power supply 96 is connected through a power supply switch 97. Further, the electric fan 50 are driven and controlled by the electric conduction control circuit 84.

Operation

Next, the operation of the dry load test apparatus 40 having such configuration will be described.

In such configuration, the dry load test apparatus 40 is moved by the truck 30 to the site where the load test is performed. In this example, the site is a place where three phase AC generator 88 is provided as an electric instrument that becomes an object of the voltage load test.

Moreover, as mentioned above, the resistor bodies 57R, 57S and 57T provided in each of the resistor units 42, 43 and 44 in this example have twenty two stages of the flat shaped resistor assemblies Ri, Si and Ti. Also, the bar shaped resistor elements rj of the resistor assemblies Ri, Si and Ti are provided by sixteen.

Besides, the switching members SWaij and SWbij of the above mentioned switching member columns SWai and SWbi are provided by eight. Accordingly, the coil 80 which is the solenoid body of the switching members SWaij is corresponded to that shown in S1 to S8 of FIG. 24 and the coil 80 which is the solenoid body of the switching members SWbij is corresponded as that shown in S9 to S16, and an example of voltage load test will be described as follows.

Further, in this example, since the three phase AC generator 88 is used as an electric instrument which is the object of the voltage load test, the case where the three phase AC generator 88 is connected to the resistor bodies 57R, 57S and 57T of the dry load test apparatus 40 as shown in FIG. 5 will be described.

(1) Low Voltage Load Test

Figure 25:
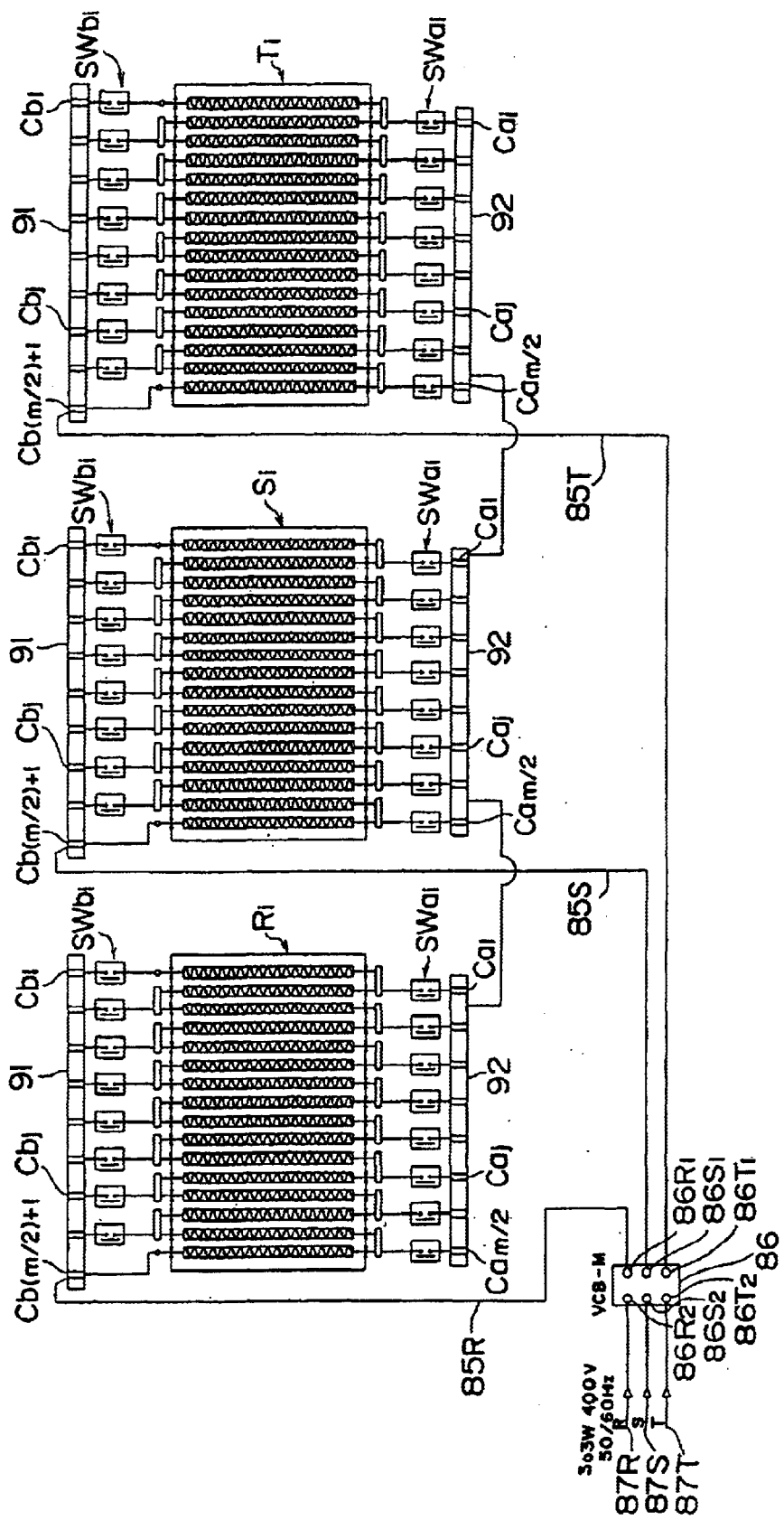
FIG. 25 is a schematic descriptive view illustrating a contact example of the resistor elements of the resistor assembly shown in FIG. 14.
Figure 26:
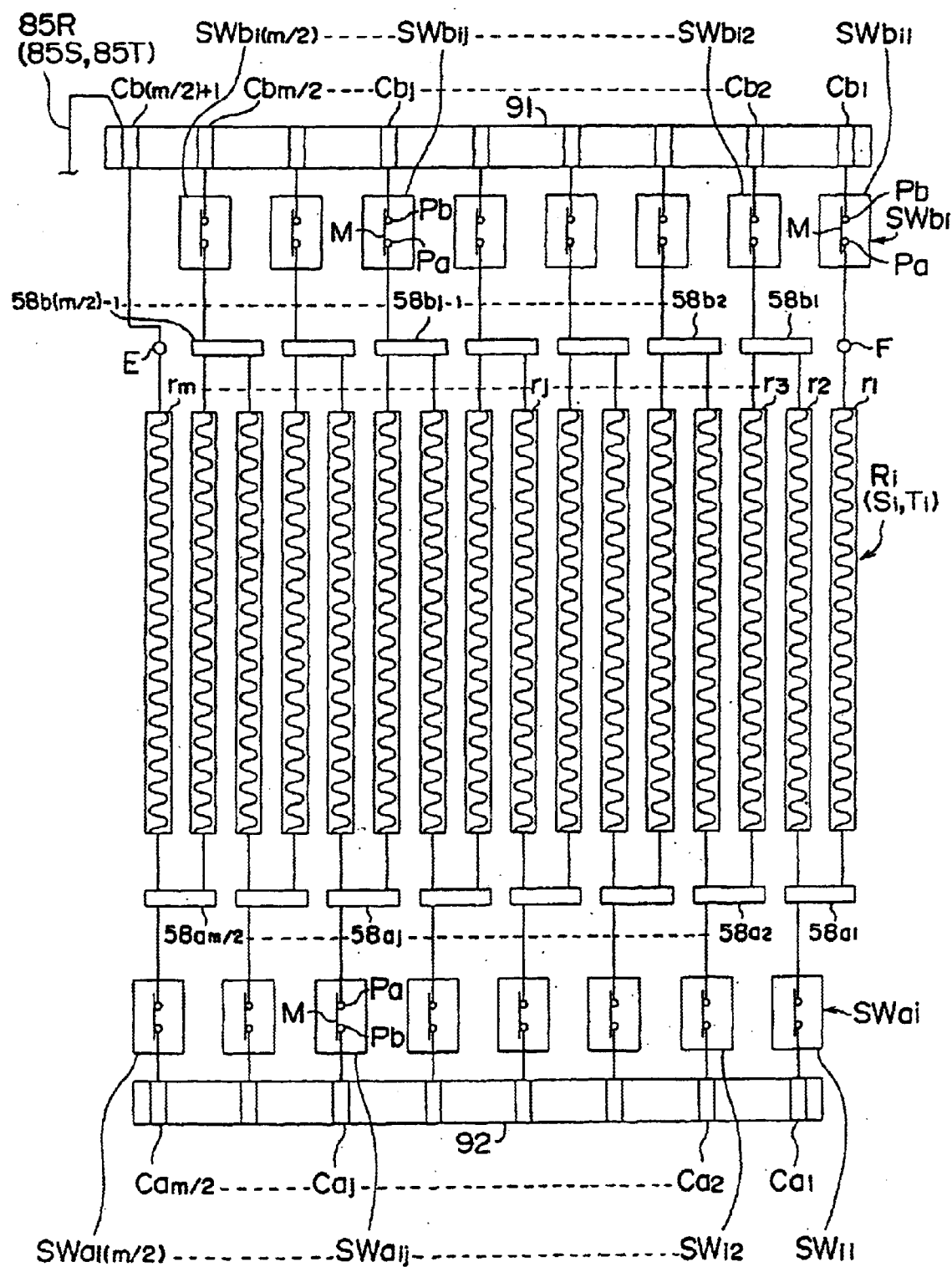
FIG. 26 is a partially enlarged descriptive view of FIG. 25.

In case of performing, for example, 400 V low voltage load test, first, as shown in FIGS. 25 and 26, the inter assembly conductive members Cb1 to Cb(m/2)+1 of the resistor body 57R are conducted (shorted) with the conductive plate 91, the inter assembly conductive members Cb1 to Cb(m/2)+1 of the resistor body 57S are conducted (shorted) with the conductive plate 91, and the inter assembly conductive members Cb1 to Cb(m/2)+1 of the resistor body 57T are conducted with the conductive plate 91.

With this, the resistor elements rj of the resistor assemblies Ri, Si and Ti are connected to the R, S and T phases of the three phase AC generator 88 through the electrically conductive connection pieces 58b1 to 58b (m/2), all the switching members SWbij of the switching member columns SWb1 to SWbn, the inter assembly conductive members Cb1 to Cb(m/2)+1 of the resistor bodies 57R, 57S and 57T, the conductive plate 91, the wirings 85R, 85S and 85T and the vacuum circuit breaker 86.

On the other hand, the inter assembly conductive members Ca1 to Cam/2 of the resistor body 57R are conducted (shorted) with the conductive plate 92, the inter assembly conductive members Ca1 to Cam/2 of the resistor body 57S are conducted (shorted) with the conductive plate 92, and the inter assembly conductive members Ca1 to Cam/2 of the resistor body 57T are conducted (shorted) with the conductive plate 92. With this, the resistor elements rj of the resistor assemblies Ri, Si and Ti which constitute the resistor bodies 57R, 57S and 57T are connected one another to a neutral point at which voltage becomes 0 V through the electrically conductive connection pieces 58a1 to 58a(m/2), the inter assembly conductive members Ca1 to Cam/2, all the switching members SWaij of the switching member columns SWa1 to SWan and the conductive plate 92.

Figure 27:
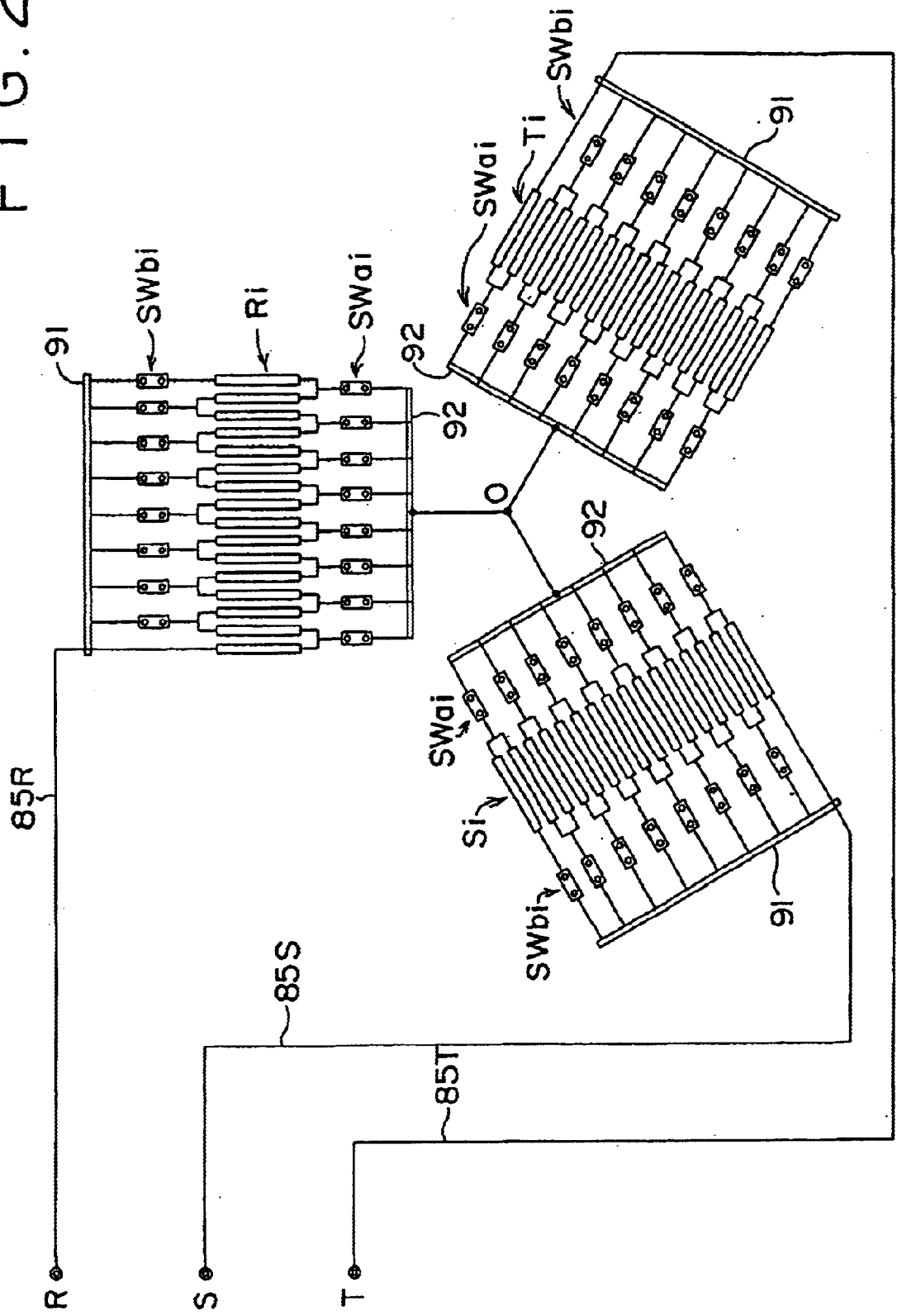
FIG. 27 is a descriptive view of the resistance value of the resistor assembly with the connection of FIG. 25.

In this state, the sixteen resistor elements rj of the resistor assemblies Ri, Si and Ti are in the state that all of them are parallel connected, as shown in FIG. 27. Besides, the resistor assemblies Ri, Si and Ti (that is, the resistor bodies 57R, 57S and 57T having low resistance value) whose all the resistor elements rj are connected parallel to reduce load resistance value are connected to the R, S and T phases of the three phase AC generator 88.

In such connection, the three phase AC generator 88 is operated, while the power supply switch 97 is turned ON so that the electric conduction control circuit 84 is operated. After that, the low voltage switch 93 is turned ON. With the ON operation, the electric conduction control circuit 84 first turns ON the main vacuum circuit breaker 86, and then, conducts all the coils 80 (S1 to S16) of the switching members SWaij and SWbij so that all the switching members SWaij and SWbij is turned ON.

With this, the output (voltage and current) from the three phase AC generator 88 is inputted to the resistor elements rj of the resistor assemblies Ri, Si and Ti, and the load test is started. With this, the resistor elements rj of the resistor assemblies Ri, Si and Ti are conducted so that the resistor elements rj generate heat.

At that time, the electric conduction control circuit 84 allows each of the electric fans 50 of the resistor units 42, 43 and 44 to be operated so that cooling wind from each of the electric fans 50 is blown to the housing 52 of the resistor units 42, 43 and 44. Further, the cooling wind absorbs heat which is generated in the resistor elements rj of the resistor units 42, 43 and 44 when it flows around the radiating fin 60, cools the resistor elements rj, and then, is vented from an exhaust port (not shown) of the box 32 forming the load chamber 33 to the outside.

Moreover, even in this case, the switching members SWaij and SWbij of each stage are ON/OFF controlled so that the load test is performed with changing the load resistance value applied to the three phase AC generator 88 from the resistor bodies 57R, 57S and 57T by predetermined time, for example, into 25%, 50%, 75% and 100%. Further, in this example, since the flat shaped resistor assemblies Ri, Si and Ti are provided by twenty two stages, the ratio of load resistance value applied to three phase AC generator 88 can be set more finely. For example, the load test can be performed by 5% or 10%.

(2) 3300 V High Voltage Load Test

Figure 28:
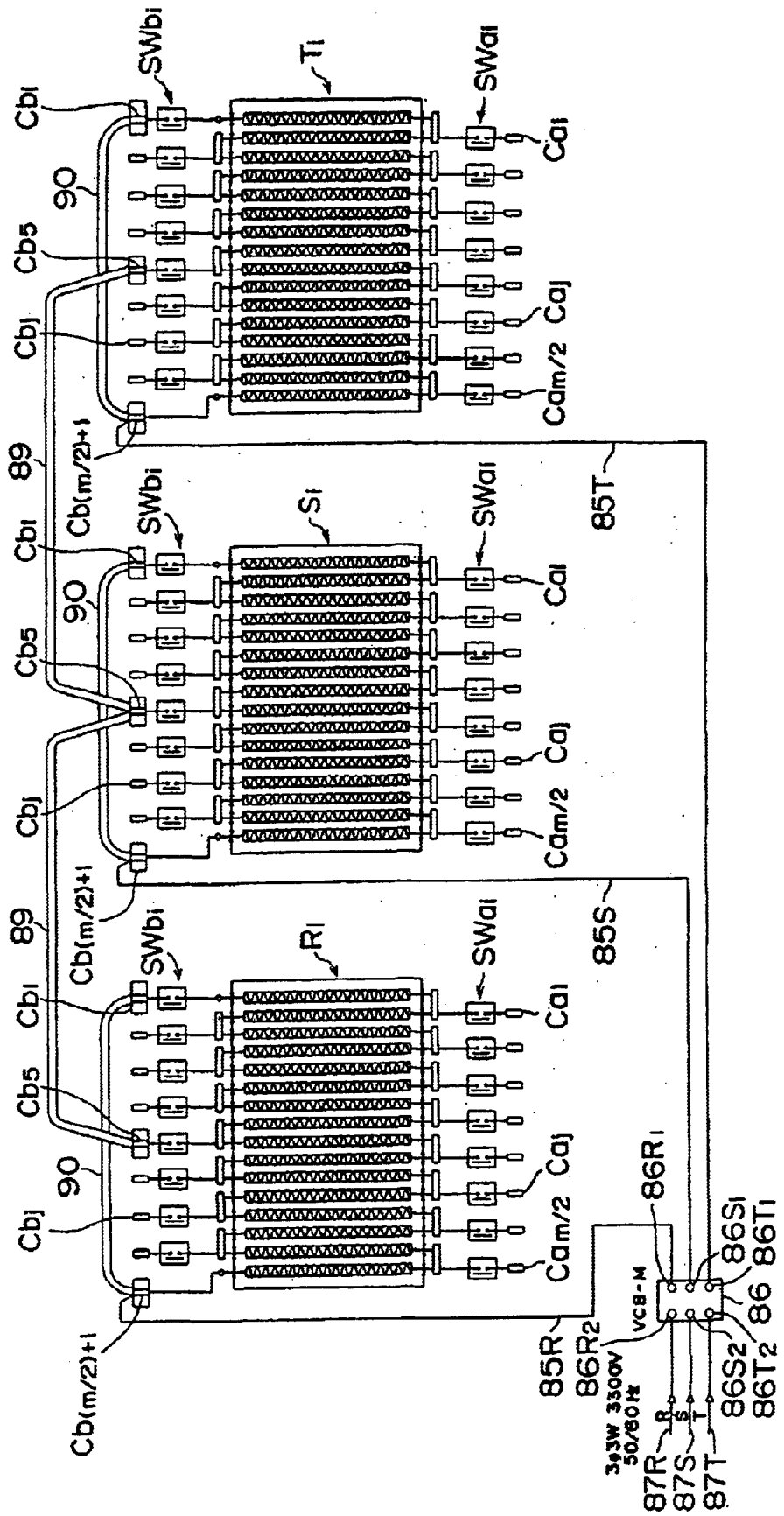
FIG. 28 is a schematic descriptive view illustrating other connection example of the resistor elements of the resistor assembly shown in FIG. 14.
Figure 29:
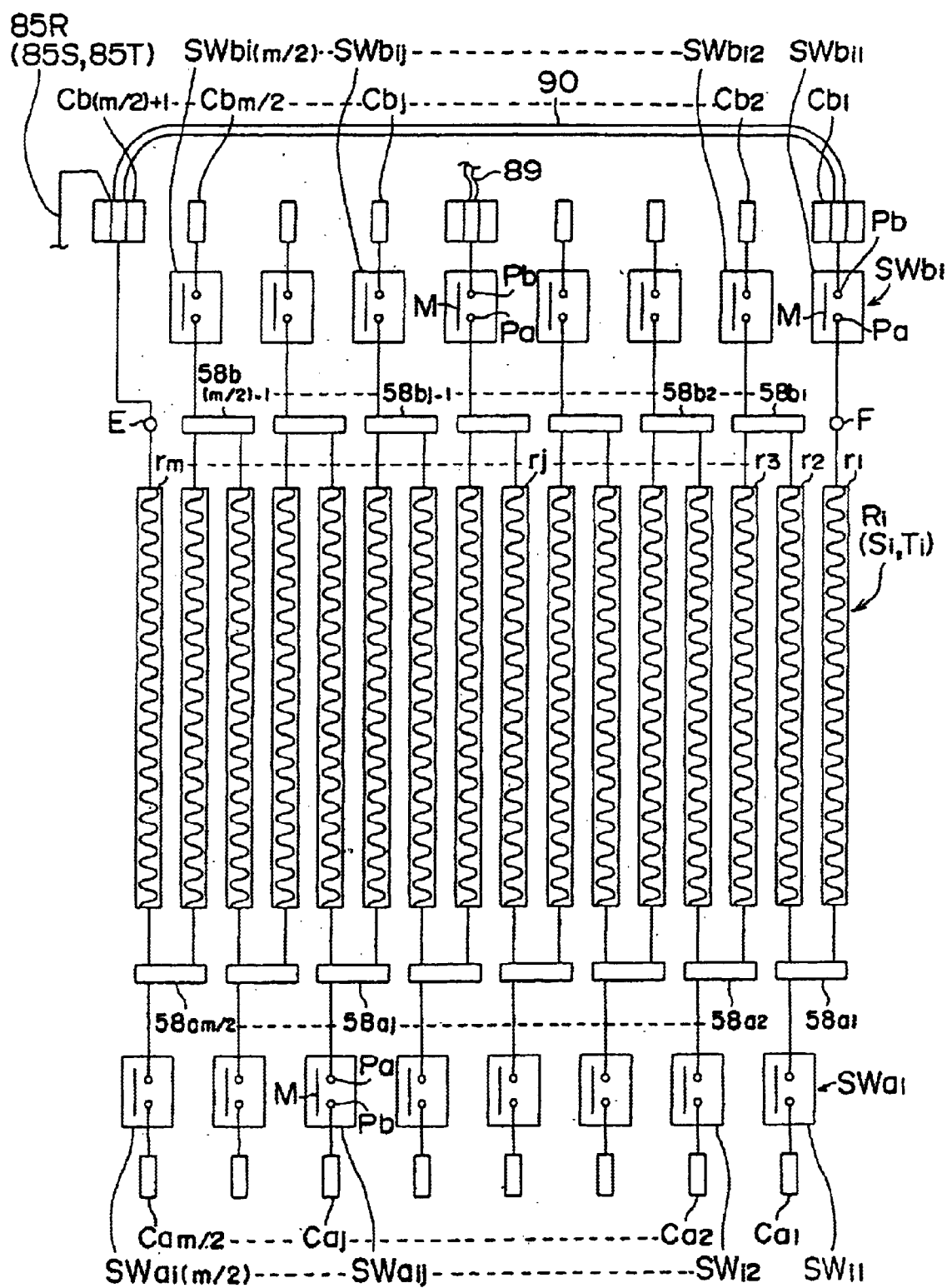
FIG. 29 is a partially enlarged descriptive view of FIG. 28.

In case of performing, for example, 3300 V high voltage load test, first, as shown in FIG. 28, the inter assembly conductive member Cb5 of the resistor body 57R and the inter assembly conductive member Cb5 of the resistor body 57S are connected and shorted by the connection line 89, and the inter assembly conductive member Cb5 of the resistor body 57S and the inter assembly conductive member Cb5 of the resistor body 57T are connected and shorted by the connection line 89. Further, the inter assembly conductive members Cb1 and Cb(m/2)+1 of each of the resistor bodies 57R, 57S and 57T are connected and shorted by the connection lines 90, 90 and 90 (refer to FIG. 29).

Figure 30:
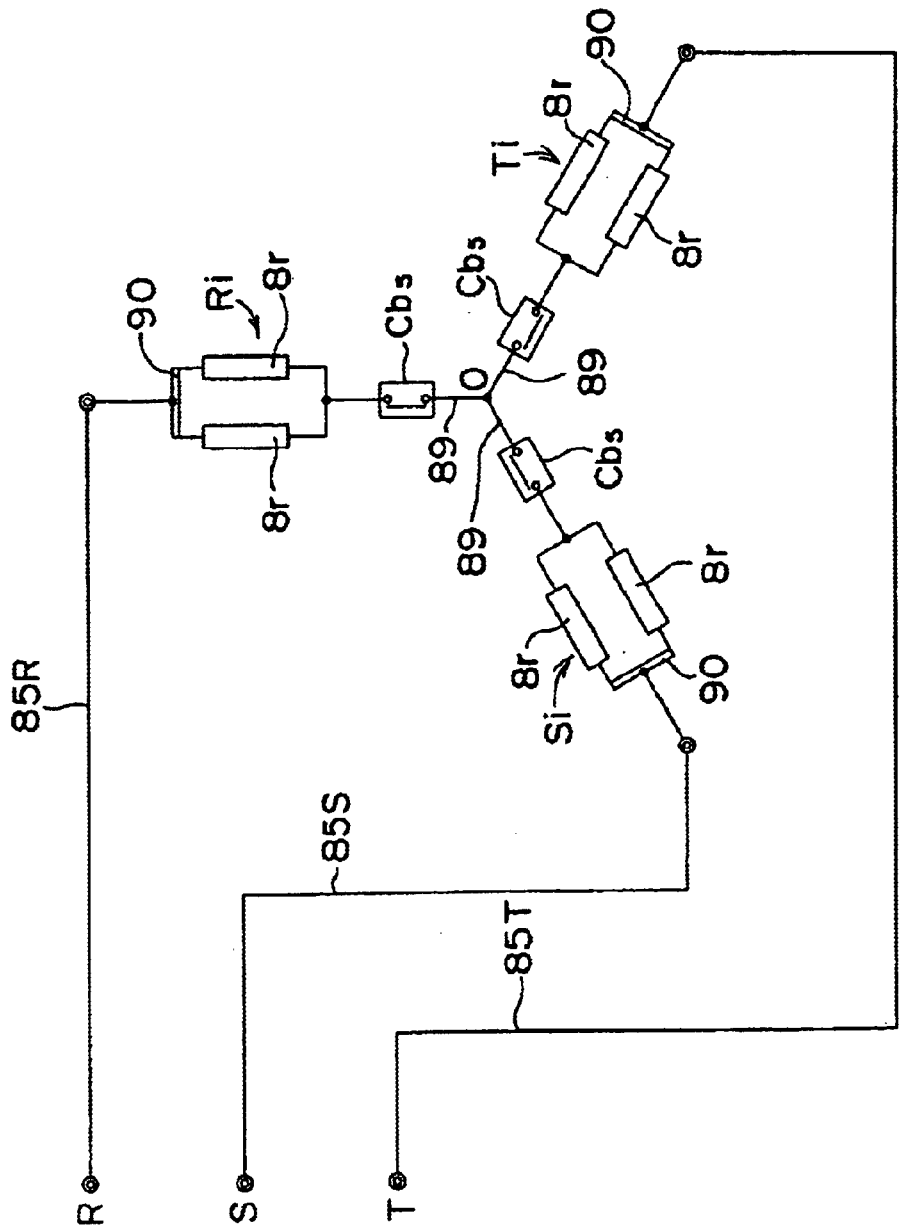
FIG. 30 is a descriptive view of the resistance value of the resistor assembly with the connection of FIG. 28.

In this state, as shown in FIG. 30, two resistor bodies 8r and 8r having the value for which the 8 resistor elements rj, which are half of each of sixteen resistor elements rj of each of the resistor assemblies Ri, Si and Ti, are parallel connected are parallel connected, and one end side of the parallel connected resistor bodies 8r and 8r are connected to the neutral point at which voltage becomes 0 V through the switching member SWbi5 and the connection lines 89 and 89.

Further, each of the inter assembly conductive members Cb1 and Cb(m/2)+1 of the resistor bodies 57R, 57S and 57T is connected to the R, S and T phases of the three phase AC generator 88 through the wirings 90, 90 and 90, the wirings 85R, 85S and 85T and the vacuum circuit breaker 86.

Accordingly, the resistor assemblies Ri, Si and Ti (that is, the resistor bodies 57R, 57S and 57T having intermediate resistance value) having the resistor bodies 8r and 8r which are parallel connected to have the intermediate level of resistance value are connected to the R, S and T phases of the three phase AC generator 88.

In such connection, the three phase AC generator 88 is operated, while the power supply switch 97 is turned ON so that the electric conduction control circuit 84 is operated. After that, the high voltage switch 94 is turned ON. With the a, ON operation, the electric conduction control circuit 84 first turns ON the main vacuum circuit breaker 86, and then, conducts the coils 80 (S1 and S5) of the switching members SWbi1 and SWbi5 so that the switching members SWbi1 and SWbi5 are turned ON. With this, the output (voltage and current) from the three phase AC generator 88 is inputted to the resistor bodies 8r and 8r of the resistor assemblies Ri, Si and Ti, and the load test is started. With this, each of the resistor elements rj which constitute the resistor bodies 8r and 8r is conducted so that the resistor elements rj generate heat.

At that time, the electric conduction control circuit 84 allows each of the electric fans 50 of the resistor units 42, 43 and 44 to be operated so that cooling wind from each of the electric fans 50 is blown to the housing 52 of the resistor units 42, 43 and 44. Further, the cooling wind absorbs heat generated in the resistor elements rj of the resistor units 42, and 44 when it flows around the radiating fin 60, cools the resistor elements rj, and then, is vented from an exhaust port (not shown) of the box 32 forming the load chamber 33 to the outside.

Moreover, even in this case, the switching members SWaij and SWbij of each stage are ON/OFF controlled so that the load test is performed with changing the load resistance value applied to the three phase AC generator 88 from the resistor bodies 57R, 57S and 57T by predetermined time, for example, into 25%, 50%, 75% and 100%. Further, in this example, since the flat shaped resistor assemblies Ri, Si and Ti are provided by twenty two stages, the ratio of load resistance value applied to three phase AC generator 88 can be set more finely. For example, the load test can be performed by 5% or 10%.

(3) 6600 V High Voltage Load Test

Figure 31:
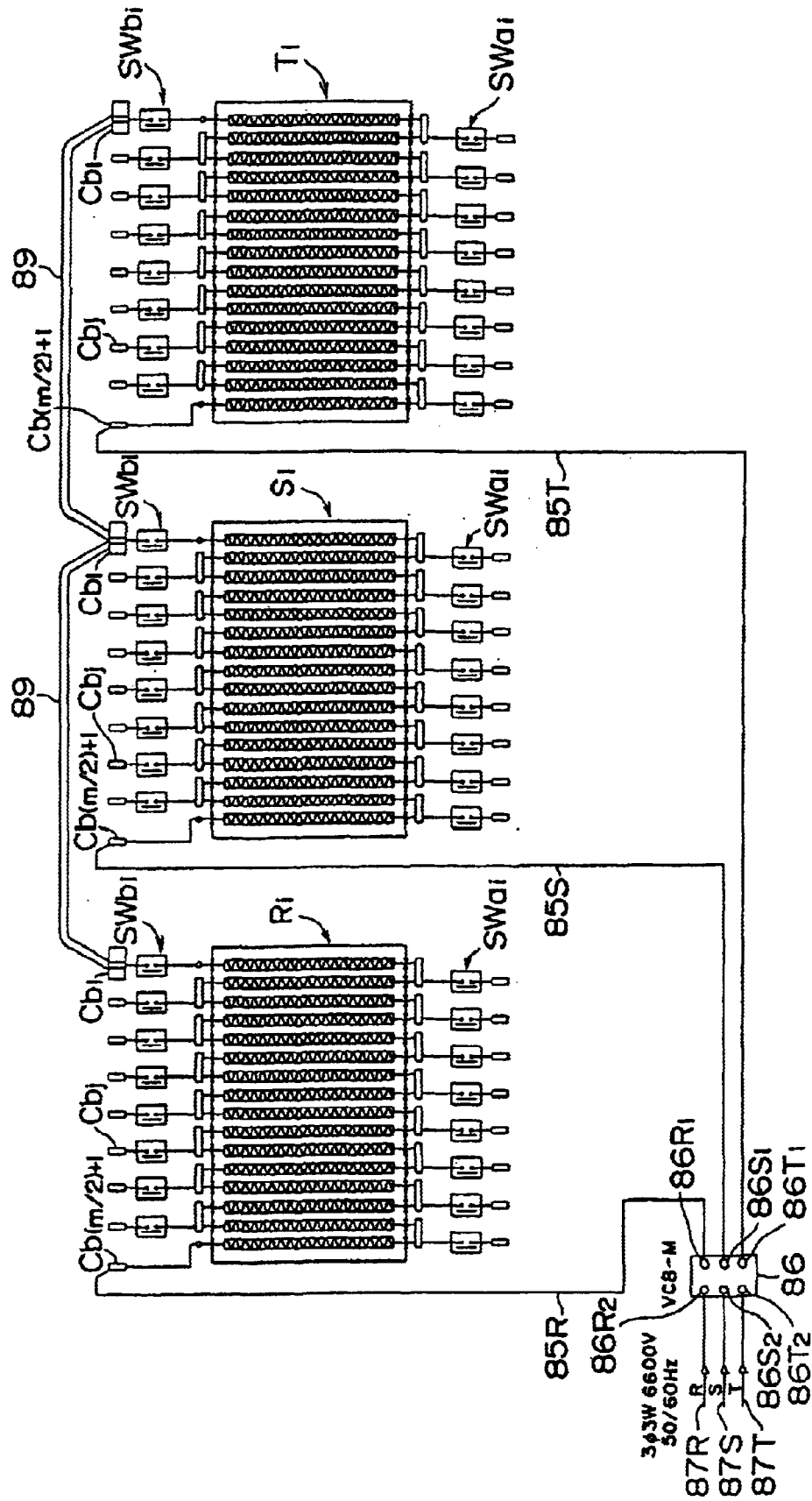
FIG. 31 is a schematic descriptive view illustrating other connection example of the resistor elements of the resistor assembly shown in FIG. 14.
Figure 32:
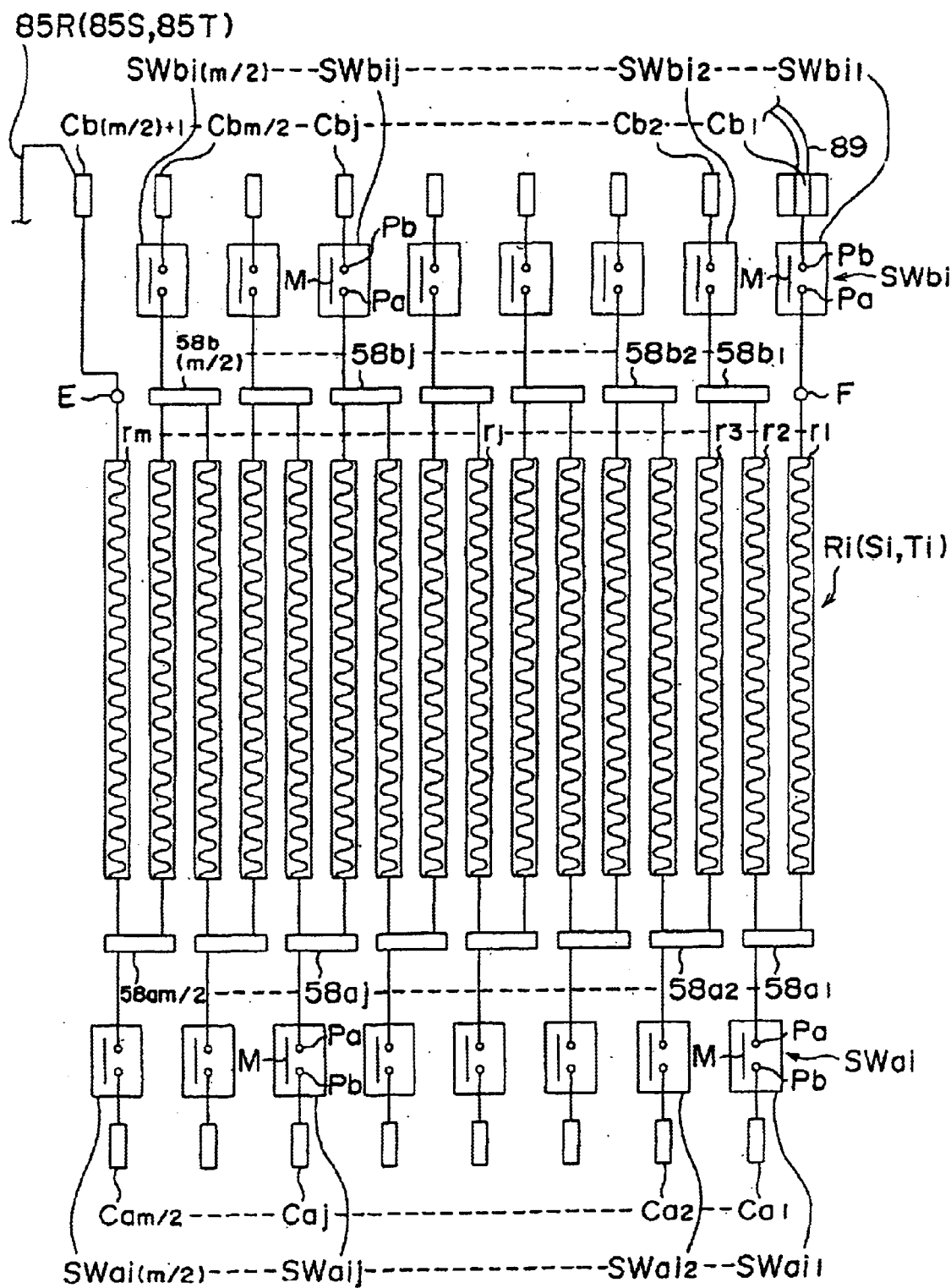
FIG. 32 is a partially enlarged descriptive view of FIG. 31.

In case of performing, for example, 6600V high voltage load test, first, as shown in FIG. 31, the inter assembly conductive members Cb1, Cb1 and Cb1 of the resistor bodies 57R, 57S and 57T are conducted and shorted by the connection lines 89, 89 and 89, respectively (refer to FIG. 32). With this, each of the resistor elements r16, r16, r16 of each of the resistor assemblies Ri, Si and Ti are connected to the neutral point at which voltage becomes 0V through the switching members SWb16, SWb16 and SWb16 and the connection lines 89 and 89.

Further, each of the inter assembly conductive members Cb(m/2)+1 of the resistor bodies 57R, 57S and 57T is connected to the R, S and T phases of the three phase AC generator 88 through the wirings 90, 90 and 90, the wirings 85R, 85S and 85T and the vacuum circuit breaker 86.

Figure 33:
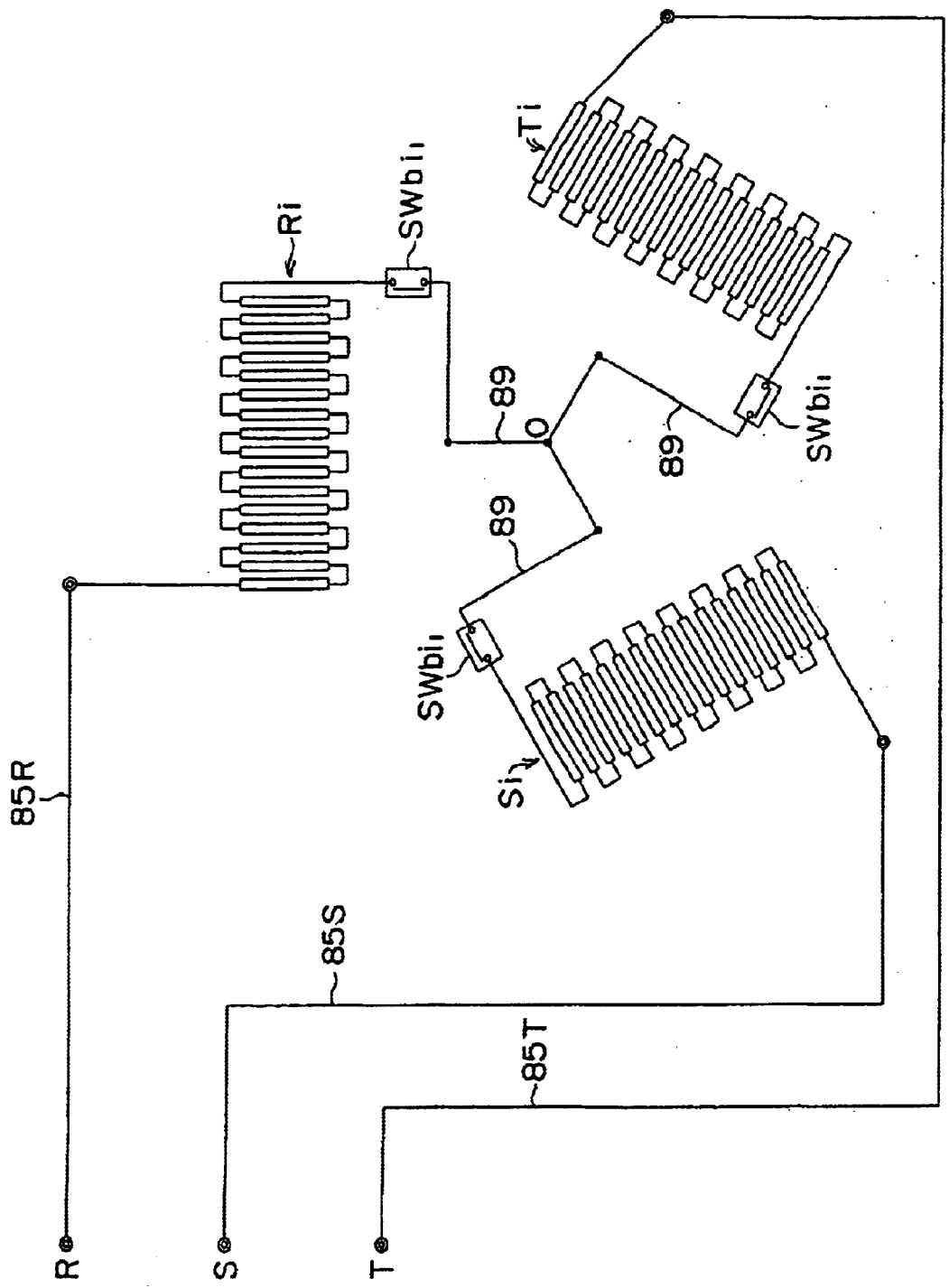
FIG. 33 is descriptive view of the resistance value of the resistor assembly with the connection of FIG. 31.

In this state, as shown in FIG. 33, all the resistor elements rj of the sixteen resistor elements rj of each of the resistor assemblies Ri, Si and Ti are serially connected so that resistance value is in the state of high resistance value.

Accordingly, the resistor assemblies Ri, Si and Ti having high resistance value whose all the resistor elements rj are serially connected (that is, the resistor bodies 57R, 57S and 57T having high resistance value) are connected to the R, S, and T phases of the three phase AC generator 88.

In such connection, the three phase AC generator 88 is operated, while the power supply switch 97 is turned ON so that the electric conduction control circuit 84 is operated. After that, the high voltage switch 95 is turned ON. With the ON operation, the electric conduction control circuit 84 first turns ON the main vacuum circuit breaker 86, and then, conducts the coil 80 (S1) of the switching member SWbi1 so that the switching member SWbi1 is turned ON. With this, the output (voltage and current) from the three phase AC generator 88 is conducted with the resistor elements rj of the resistor assemblies Ri, Si and Ti so that the resistor elements rj generate heat.

At that time, the electric conduction control circuit 84 allows each of the electric fans 50 of the resistor units 42, 43 and 44 to be operated so that cooling wind from each of the electric fans 50 is blown to the housing 52 of the resistor units 42, 43 and 44. Further, the cooling wind absorbs heat which is generated in the resistor elements rj of the resistor units 42, 43 and 44 when it flows around the radiating fin 60, cools the resistor elements rj, and then, is vented from an exhaust port (not shown) of the box 32 forming the load chamber 33 to the outside.

Moreover, even in this case, the switching members SWaij and SWbij of each stage are ON/OFF controlled so that the load test is performed with changing the load resistance value applied to the three phase AC generator 88 from the resistor bodies 57R, 57S and 57T by predetermined time, for example, into 25%, 50%, 75% and 100%. Further, in this example, since the flat shaped resistor assemblies Ri, Si and Ti are provided by twenty two stages, the ratio of load resistance value applied to three phase AC generator 88 can be set more finely. For example, the load test can be performed by 5% or 10%.

Moreover, when the low voltage switch for low voltage load test 93, the high voltage switch for high voltage load test 94, and the high voltage switch for high voltage load test 95 are operated to be ON, such a load test is performed automatically by the electric conduction control circuit 84 in accordance with a program for load test. The program may be previously stored in a storage means (not shown) of ROM and the like in the electric conduction control circuit 84, or it may be recorded in recording medium of hard disk and the like so that it may be read into CPU (not shown) of the electric conduction control circuit 84 at the time of starting the load checking to be used.

Modified Example

Figure 34:
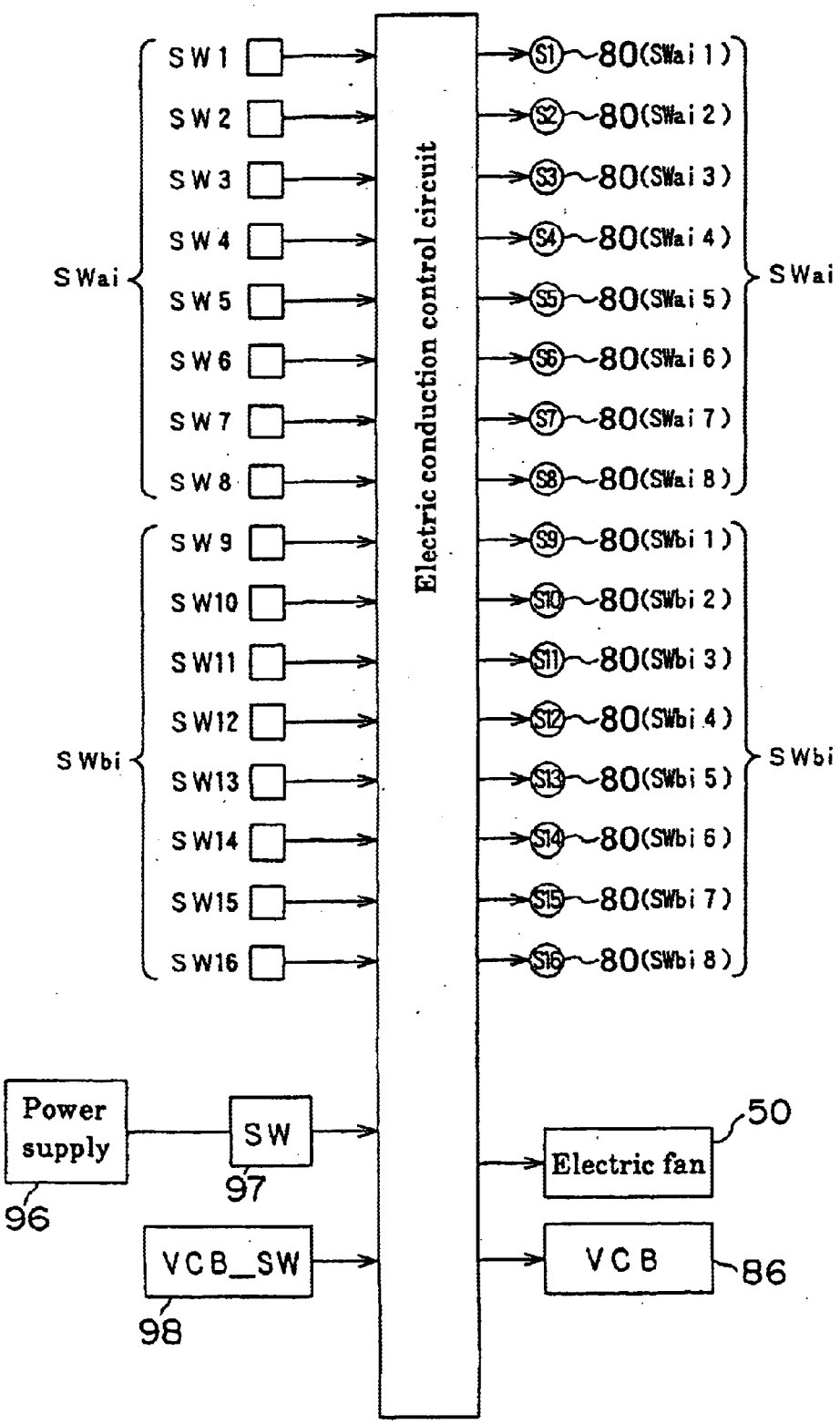
FIG. 34 is a descriptive view illustrating another example of the control circuit of the switching member shown in FIG. 15.

In the above mentioned example, when the low voltage switch for low voltage load test 93, the high voltage switch for high voltage load test 94 and the high voltage switch for high voltage load test 95 are operated to be ON, the load checking is performed in accordance to the program, but the present invention is not necessarily limited to it. For example, as shown in FIG. 34, switches for operating On/OFF SW1 to SW16 of the switching members SWaij and SWbij of each stage are provided corresponding to the coils 80 of the switching members SWaij shown in S1 ? S8 and the coils 80 of the switching members SWbij shown in S9 to S16, and may be controlled to be electrically conducted with the coils 80 shown in S1 to S16 by the switches SW1 to SW16, respectively. Further, the vacuum circuit breaker 86 may be operated to be ON/OFF by the switch 98.

Others

In the above mentioned example, the switching members SWaij, SWbij are connected to all the electrically conductive connection pieces 58$a$1 to 58$a$(m/2) and 58$a$1 to 58$a$(m/2) (connection to the end of the resistor elements rj) of the resistor assemblies Ri, Si and Ti, but the present invention is not necessarily limited to it. In case of this example, the configuration that the switching members are provided only to Cb1, Cb5, Cb(m/2)+1 (Cb9 because m=16) may be provided.

Second Embodiment of the Invention

Constitution

In the first embodiment of the invention, before performing the low voltage load test, the 3300V voltage load test, or the 6600V high voltage load test, a few of resistor elements rj of the resistor assemblies Ri, Si and Ti are previously connected (shorted) manually using the connection lines 89 and 90, the conductive plates 91 and 92 and the like, but the present invention is not necessarily limited to it.

Figure 35:
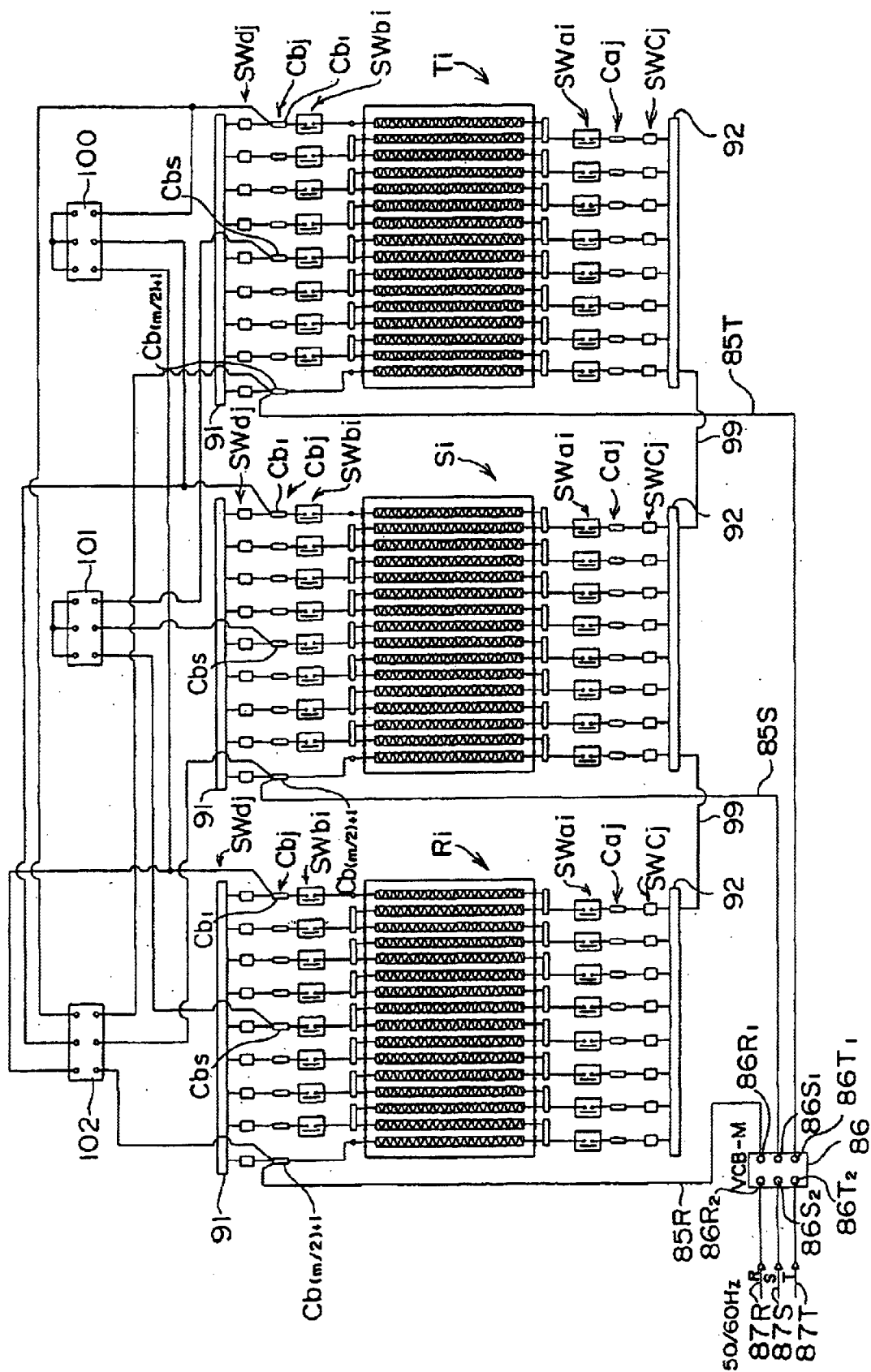
FIG. 35 is a schematic circuit diagram of a dry load test apparatus in accordance to the second embodiment of the present invention.
Figure 36:
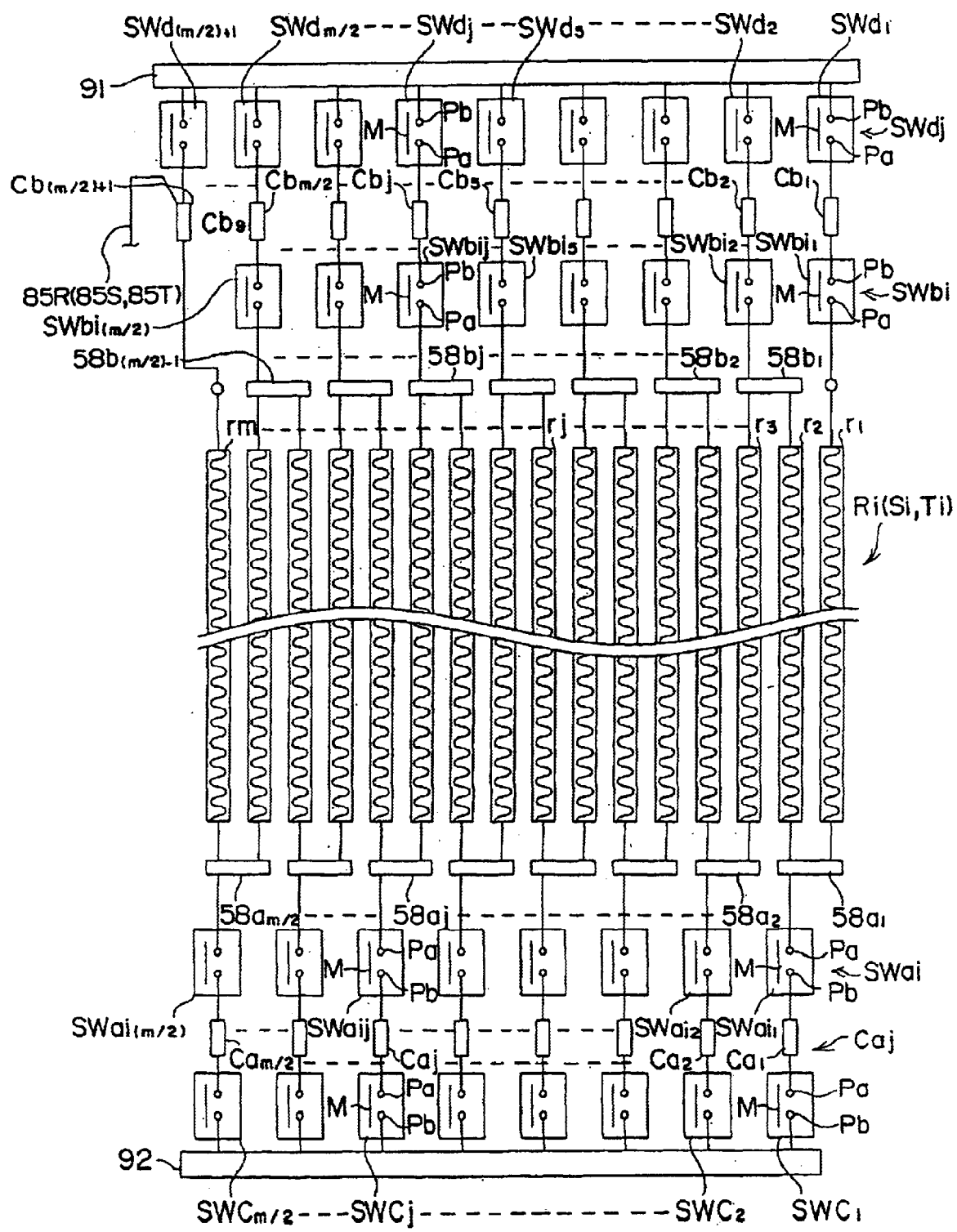
FIG. 36 is a partially enlarged descriptive view of FIG. 34.

For example, as shown in FIG. 35, the three conductive plates (shorting means) 92 serially connected with connection lines (shorting means) 99 and 99 are provided, each of the conductive plates 92 is connected to the inter assembly conductive members Caj of the resistor bodies 57R, 57S and 57T through second switching members SWcj [j=1, 2, 3 cm/2] which are shorting means, and the three conductive plates 91 are connected to the inter assembly conductive members Cbj of the resistor bodies 57R, 57S and 57T through second switching members SWdj [j=1, 2, 3 cm/2] which are shorting means (refer to FIG. 36 in detail). Moreover, a magnet switch having the same configuration (configuration of FIG. 16 to FIG. 23) as the first switching members SWaij and SWbij which are shorting means is used to the second switching members SWcj and SWdj which are shorting means. Besides, the columns of the first switching members SWaij and SWbij are provided to each of the resistor assemblies Ri, Si and Ti to be multi stages. However, if it is able to short the inter assembly conductive member Caj or the inter assembly conductive member Cbj, even one column is enough for the second switching members SWcj and SWdj.

Further, the inter assembly conductive members Cb1, Cb1 and Cb1 of the resistor bodies 57R, 57S and 57T are connected to be capable of being conducted (shorted) one another with a vacuum circuit breaker (VCB) 100 which is a high voltage switch, the inter assembly conductive members Cbs, Cbs and Cbs of the resistor bodies 57R, 57S and 57T are connected to be capable of being conducted (shorted) one another with a vacuum circuit breaker (VCB) 101 which is a high voltage switch, and the inter assembly conductive members Cb1, Cb1, Cb1 and Cb(m/2)+1, Cb(m/2)+1, Cb(m/2)+1 [since m/2=8 in this example, Cb(m/2)+1=Cb9] of the resistor bodies 57R, 57S and 57T are connected one another with the vacuum circuit breaker (VCB) 102 which is a high voltage switch.

Figure 37:
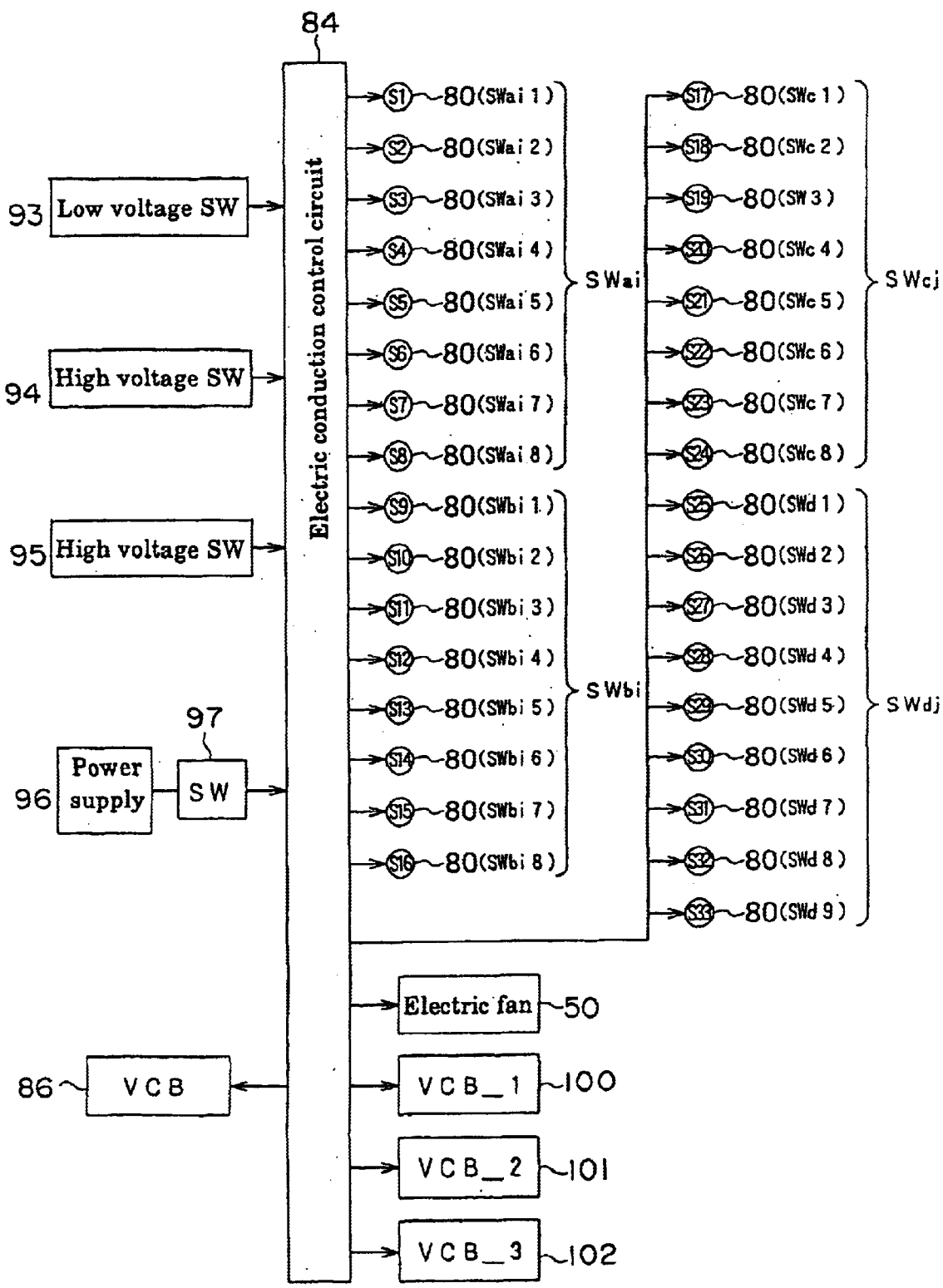
FIG. 37 is a control circuit diagram of the switching member of FIG. 35.

Further, if the coils 80 of the second switching members SWcj are S17 to S24 and the coils 80 of the second switching members SWdj are S24 to S32, the solenoids S17 to S32 are operatively controlled by the electric conduction control circuit 84, as shown in FIG. 37. Moreover, the same portions as FIG. 24 are attached with the reference numerals as attached in FIG. 24, and description thereof is omitted.

Operation (1) Low Voltage Load Test

In such connection, in case of performing, for example, 400V low voltage load test, first, the three phase AC generator 88 is operated, while the power supply switch 97 is turned ON so that the electric conduction control circuit 84 is operated.

After that, the low voltage switch 93 is turned ON. With the ON operation, the electric conduction control circuit 84 first turns ON the main vacuum circuit breaker 86, and then, conducts all the coils 80 (S1 to S8) of the switching members SWaij of the resistor assemblies Ri, Si and Ti which constitute the resistor bodies 57R, 57S and 57T so that the switching members SWaij are turned ON, and in addition, conducts all the coils 80 (S17 to S24) of the switching members SWcj of the resistor assemblies Ri, Si and Ti which constitute the resistor bodies 57R, 57S and 57T so that all the switching members SWcj are turned ON.

With this, the resistor elements rj of the resistor assemblies Ri, Si and Ti which constitute the resistor bodies 57R, 57S and 57T are connected to the neutral point at which voltage becomes 0V through electrically conductive connection pieces $58a1$ to $58a(m/2)$, all the switching members SWai1 to Swai(m/2), the inter assembly conductive members Ca1 to Cam/2, the switching members SWc1 to SWcm/2 and the conductive plate 92.

Besides, the electric conduction control circuit 84 allows all the coils 80 (S9 to S16) of the switching members SWbij of the resistor assemblies Ri, Si and Ti which constitute the resistor bodies 57R, 57S and 57T to be conducted so that all the switching members SWbij are turned ON, and it allows all the coils 80 (S25 to S32) of the switching members SWdj of the resistor assemblies Ri, Si and Ti which constitute the resistor bodies 57R, 57S and 57T to be conducted so that all the switching members SWdj are turned ON.

With this, the resistor elements rj of the resistor assemblies Ri, Si and Ti are connected to the R, S and T phases of the three phase AC generator 88 through the electrically conductive connection pieces $58b1$ to $58b(m/2)$, all the switching members SWbij (SWbi1 to SWbi(m/2)) of the switching member columns SWb1 to SWbn, the inter assembly conductive members Cb1 to Cb(m/2)+1 of the resistor bodies 57R, 57S and 57T, the switching members SWd1 to SWd(m/2)+1, the conductive plate 91, the wirings 85R, 85S and 85T and the vacuum circuit breaker 86.

In this state, as shown in FIG. 27, all the sixteen resistor elements rj of the resistor assemblies Ri, Si and Ti are parallel connected. Besides, the resistor assemblies Ri, Si and Ti (that is, the resistor bodies 57R, 57S and 57T having low resistance value) whose all the resistor elements rj are parallel connected to reduce load resistance value are connected to the R, S, and T phases of the three phase AC generator 88. With this, the output (voltage and current) from the three phase AC generator 88 is inputted to the resistor elements rj of the resistor assemblies Ri, Si and Ti, and the load test is started. With this, the resistor elements rj of the resistor assemblies Ri, Si and Ti are conducted so that the resistor elements rj generate heat.

At this time, the electric conduction control circuit 84 allows each of the electric fans 50 of the resistor units 42, 43 and 44 to be operated so that cooling wind from each of the electric fans 50 is blown to the housing 52 of the resistor units 42, 43 and 44. Further, the cooling wind absorbs heat generated in the resistor elements rj of the resistor units 42, 43 and 44 when it flows around the radiating fin 60, cools the resistor elements rj, and then, is vented from an exhaust port (not shown) of the box 32 forming the load chamber 33 to the outside.

Moreover, even in this case, the switching members SWaij and SWbij of each stage are ON/OFF controlled so that the load test is performed with changing the load resistance value applied to the three phase AC generator 88 from the resistor bodies 57R, 57S and 57T, for example, into 25%, 50%, 75% and 100% by predetermined time. Further, in this example, since the flat shaped resistor assemblies Ri, Si and Ti are provided by twenty two stages, the ratio of load resistance value applied to three phase AC generator 88 can be set more finely. For example, the load test can be performed by 5% or 10%.

(2) 3300V High Voltage Load Test

In case of performing, for example, 3300V high voltage load test, the three phase AC generator 88 is operated, while the power supply switch 97 is turned ON so that the electric conduction control circuit 84 is operated.

After that, the high voltage switch 94 is turned ON. With the ON operation, the electric conduction control circuit 84 first turns ON the main vacuum circuit breaker 86 and the vacuum circuit breaker 101, and then, conducts the coil 80 (S5) of the switching members SWbij of the resistor assemblies Ri, Si and Ti which constitute the resistor bodies 57R, 57S and 57T so that the switching member SWbi5 is turned ON. With this, the resistor elements rj of the resistor assemblies Ri, Si and Ti which constitute the resistor bodies 57R, 57S and 57T are connected to the neutral point at which voltage becomes 0V through the electrically conductive connection piece $58b5$, the switching member SWbi5, the inter assembly conductive member Cb5 and the vacuum circuit breaker 101.

That is, in this state, as shown in FIG. 30, the two resistor bodies 8r and 8r having the value for which eight resistor elements rj which are half of each of the sixteen resistor elements rj of each of the resistor assemblies Ri, Si and Ti are parallel connected, and one end side of the serially connected resistor bodies 8r and 8r is connected to the neutral point at which voltage becomes 0V through the electrically conductive connection piece $58b5$, the switching member SWbi5, the inter assembly conductive member Cb5 and the vacuum circuit breaker 101.

Besides, the electric conduction control circuit 84 allows the vacuum circuit breaker 102 to be ON and the coil 80 (S9) of the switching members SWbij of the resistor assemblies Ri, Si and Ti which constitute the resistor bodies 57R, 57S and 57T to be conducted so that the switching member Swbi1 of each of the resistor assemblies Ri, Si and Ti is turned ON.

With this, the resistor elements rj of the resistor assemblies Ri, Si and Ti are connected to the R, S and T phases of the three phase AC generator 88 through the electrically conductive connection pieces 58b1 to 58b(m/2), all the switching members SWbij of the switching member columns SWb1 to SWbn, the inter assembly conductive members Cb1 to Cb(m/2)+1 (=Cb9) of the resistor bodies 57R, 57S and 57T, the vacuum circuit breaker 102, the conductive plate 91, the wirings 85R, 85S and 85T and the vacuum circuit breaker 86.

With this, the output (voltage and current) from the three phase AC generator 88 is inputted to the resistor bodies 8r and 8r of the resistor assemblies Ri, Si and Ti, and the load test is started. With this, the resistor elements rj which constitute the resistor elements 8r and 8r are conducted so that the resistor elements rj generate heat.

Moreover, even in this case, the switching members SWaij and SWbij of each stage are ON/OFF controlled so that the load test is performed with changing the load resistance value applied to the three phase AC generator 88 from the resistor bodies 57R, 57S and 57T by predetermined time, for example, into 25%, 50%, 75% and 100%. Further, in this example, since the flat shaped resistor assemblies Ri, Si and Ti are provided by twenty two stages, the ratio of load resistance value applied to three phase AC generator 88 can be set more finely. For example, the load test can be performed by 5% or 10%.

(3) 6600V High Voltage Load Test

In case of performing, for example, 6600V high voltage load test, the three phase AC generator 88 is operated, while the power supply switch 97 is turned ON so that the electric conduction control circuit 84 is operated.

After that, the high voltage switch 95 is turned ON. With the ON operation, the electric conduction control circuit 84 first turns ON the main vacuum circuit breaker 86 and the vacuum circuit breaker 100, and then, conducts the coil 80 (S1) of the switching members SWbij of the resistor assemblies Ri, Si and Ti which constitute the resistor bodies 57R, 57S and 57T so that the switching member SWbi1 is turned ON.

With this, the resistor elements rj of the resistor assemblies Ri, Si and Ti which constitute the resistor bodies 57R, 57S and 57T are connected to the neutral point at which voltage becomes 0V through the electrically conductive connection piece 58b1, the switching member SWbi1, the inter assembly conductive member Cb1 and the vacuum circuit breaker 100.

Further, each of the inter assembly conductive members Cb(m/2)+1 of the resistor bodies 57R, 57S and 57T is connected to the R, S and T phases of the three phase AC generator 88 through the wirings 90, 90 and 90, the wirings 85R, 85S and 85T and the vacuum circuit breaker 86.

In this state, as shown in FIG. 33, all the resistor elements rj of the sixteen resistor elements rj of each of the resistor assemblies Ri, Si and Ti are serially connected so that resistance value is in the state of high resistance value.

Accordingly, the resistor assemblies Ri, Si and Ti having high resistance value (that is, the resistor bodies 57R, 57S and 57T having high resistance value) whose all the resistor elements rj are serially connected are connected to the R, S and T phases of the three phase AC generator 88.

With such operation of the electric conduction control circuit 84, the output (voltage and current) from the three phase AC generator 88 is conducted with the resistor elements rj of the resistor assemblies Ri, Si and Ti so that the resistor elements rj generate heat.

At that time, the electric conduction control circuit 84 allows each of the electric fans 50 of the resistor units 42, 43 and 44 to be operated so that cooling wind from each of the electric fans 50 is blown to the housing 52 of the resistor units 42, 43 and 44. Further, the cooling wind absorbs heat generated in the resistor elements rj of the resistor units 42, 43 and 44 when it flows around the radiating fin 60, cools the resistor elements rj, and then, is vented from an exhaust port (not shown) of the box 32 forming the load chamber 33 to the outside.

Moreover, even in this case, the switching members SWaij and SWbij of each stage are ON/OFF controlled so that the load test is performed with changing the load resistance value applied to the three phase AC generator 88 from the resistor bodies 57R, 57S and 57T by predetermined time, for example, into 25%, 50%, 75% and 100%. Further, in this example, since the flat shaped resistor assemblies Ri, Si and Ti are provided by twenty two stages, the ratio of load resistance value applied to three phase AC generator 88 can be set more finely. For example, the load test can be performed by 5% or 10%.

Moreover, when the low voltage switch for low voltage load test 93, the high voltage switch for high voltage load test 94 and the high voltage switch for high voltage load test 95 are operated to be ON, such a load test is performed automatically by the electric conduction control circuit 84 in accordance with a program for load test. The program may be previously stored in a storage means (not shown) of ROM and the like in the electric conduction control circuit 84, or it may be recorded in recording medium of hard disk and the like so that it may be read into CPU (not shown) of the electric conduction control circuit 84 at the time to use to start the load check.

In such a manner, the electric conduction control circuit 84 operates only the low voltage switch 93, the high voltage switch 94 and the high voltage switch 95 to be ON so that the resistance value of the resistor assemblies Ri, Si and Ti of the resistor bodies 57R, 57S and 57T are automatically set, thereby automatically performing the load test. With this, the switching of complex switch can be performed simply, rapidly and optimally (accurately). Further, according to this example, it is unnecessary to provide vacuum circuit breaker to each of the multi stage (twenty two stages in this example) resistor assemblies Ri, Si and Ti which constitute each of the resistor bodies 57R, 57S and 57T, and the vacuum circuit breakers increase by only three ones of 100, 101 and 102, so that even though being automated, the facility may not be enlarged and cost hardly increases.

(The First Modified Example)

Figure 38:
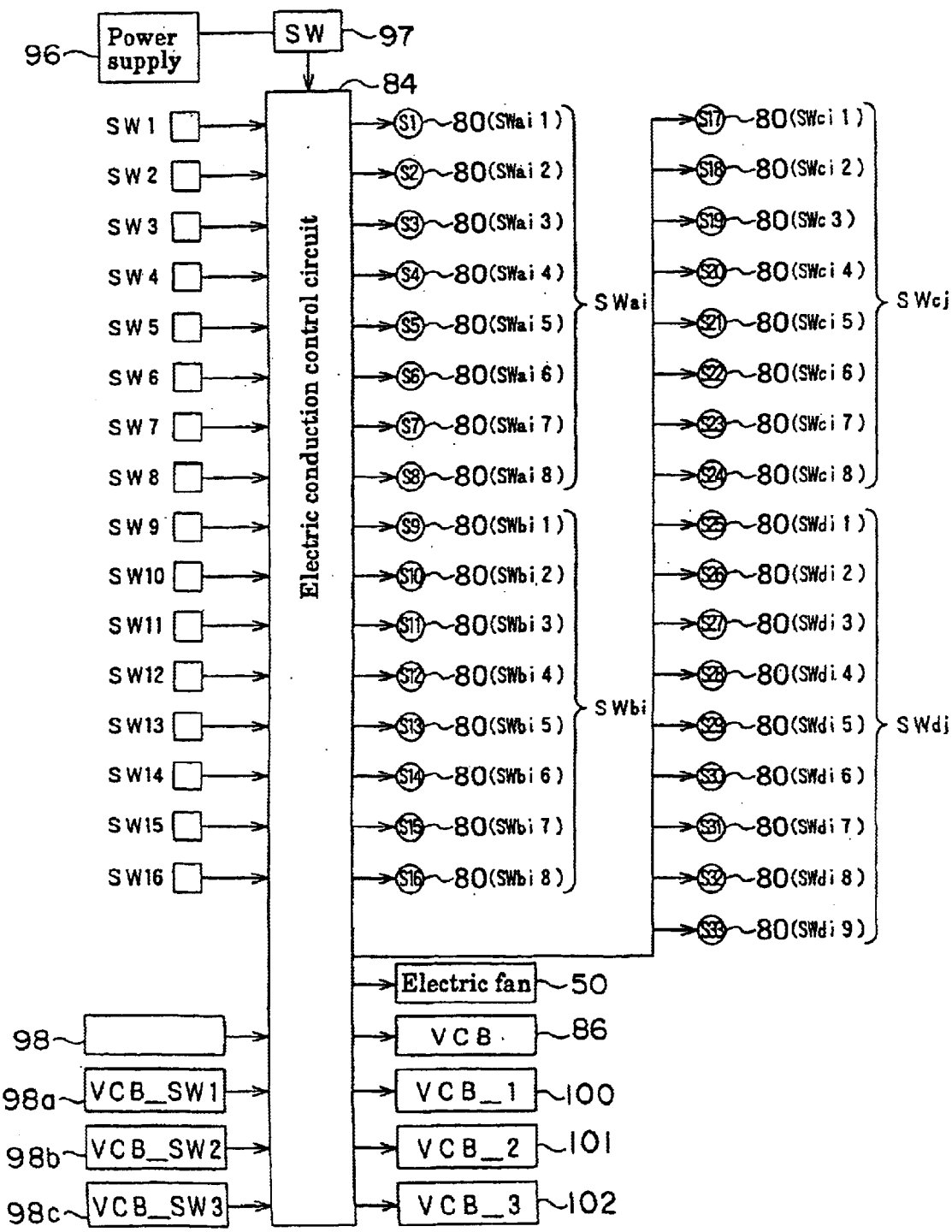
FIG. 38 is a descriptive view illustrating another example of the control circuit diagram of the switching member of FIG. 35.

In the second embodiment, when the low voltage switch for low voltage load test 93, the high voltage switch for high voltage load test 94 and the high voltage switch for high voltage load test 95 are operated to be ON, the load test is performed in accordance to the program, but the present invention is not necessarily limited to it. For example, as shown in FIG. 38, the ON/OFF operative switches SW1 to SW16 of the switching members SWaij and SWbij of each stage are provided corresponding to the coils 80 of the switching members SWaij shown in S1 to S8 and the coils 80 of the switching members SWbij shown in S9 to S16, and conduction with the coils 80 shown in S1 to S16 is controlled by the switches SW1 to SW16, respectively. Further, the vacuum circuit breakers 86, 100, 101 and 102 can be operated to be ON/OFF by the switches 98, 98a, 98b and 98c.

(The Second Modified Example)

Further, the vacuum circuit breaker 102 is not necessarily needed. That is, when the high voltage switch 94 is operated to be ON, if the electric conduction control circuit 84 operates the switching members SWd1 and SWd(m/2)+1 (=SWd9) to be ON, the vacuum circuit breaker 102 can be omitted. In this case, even though being automated, since the number of the vacuum circuit breakers can be reduced by one than the above mentioned example, cost can be further reduced and small size thereof can be achieved.

(The Third Modified Example)

In the above mentioned first and second embodiments of the invention the switching members SWaij and SWbij and the switching members SWcj and SWdj and the like are provided side by side with the solenoid S and the contact holding member 72 holding the movable contact M, but the present invention is not necessarily limited to it.

Figure 39:
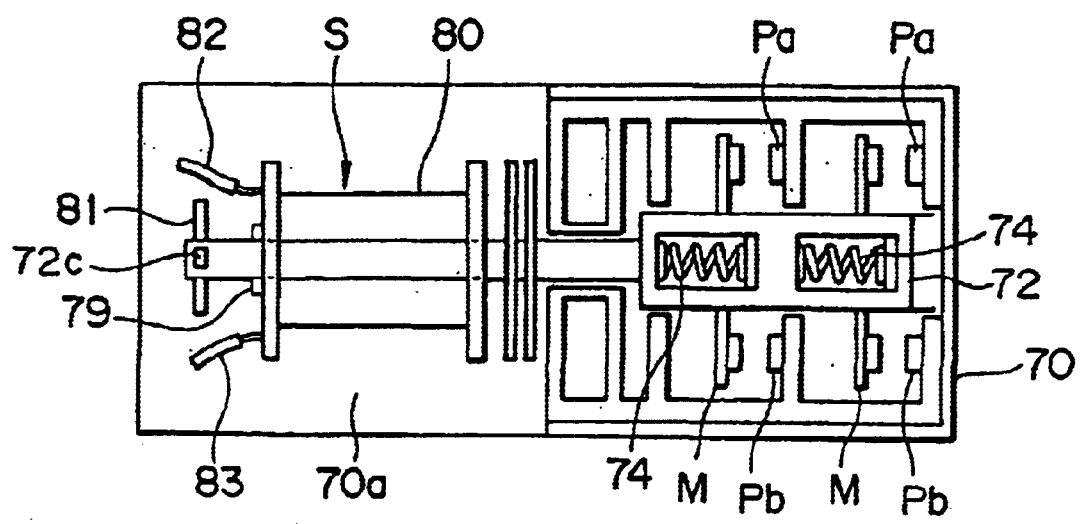
FIG. 39 is a plan view illustrating another example of the switching member shown in FIG. 16 to FIG. 18.
Figure 40:
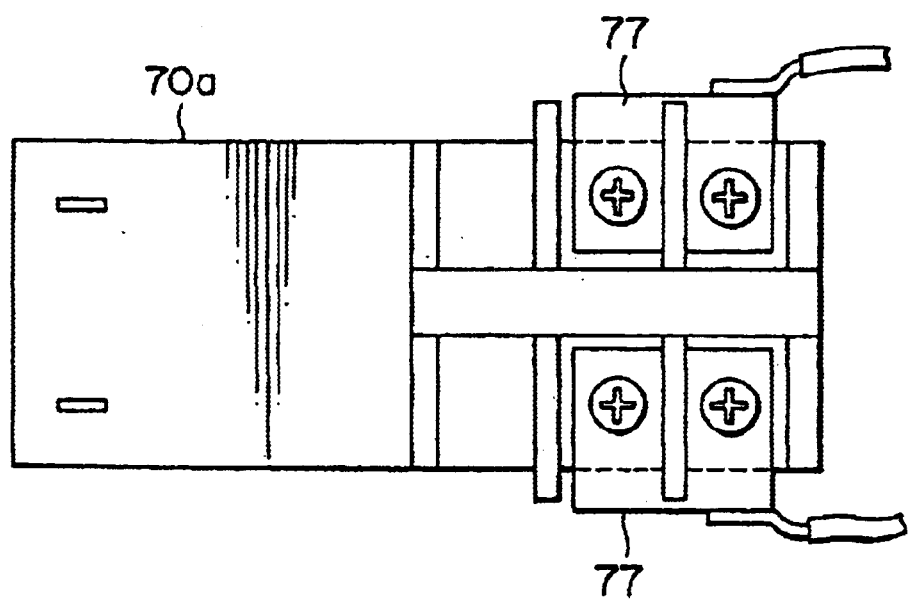
FIG. 40 is a bottom view of FIG. 39.

For example, as shown in FIG. 39, there may be provided the configuration that the solenoid S having a movable iron plate (actuator) 81 driven by magnetic force of the coil 80 and the coil 80 is provided, a solenoid attached portion 70a is provided to the contact case 70, and the solenoid S is disposed on the substantially same straight line as the driving direction of the movable contact M for the contact holding member 72 and attached to the solenoid attached portion 70a (refer to FIG. 40). In this case, the stationary contacts P1 and P2 and the coil 80 are provided to be separated to the distance that discharge does not occur. Further, the lead lines 82 and 83 of the solenoid S are provided at the ends of the sides apart form the stationary contacts P1 and P2. With this, discharge between the lead lines 82 and 83 and the stationary contacts P1 and P2 can be prevented.

Moreover, in this case, in the contact holding member 72, a small opening 72c is formed at the front end of the side of the solenoid S, and the movable iron plate 81 is engaged into the small opening 72c. Further, if the coil 80 is electrically conducted, and then, magnetic force is generated in the iron core 79, the movable iron plate 81 is drawn into the iron core 79 with the magnetic force, the contact holding member 72 is moved to the right side in FIG. 39, the movable contacts M and M turn ON the stationary contacts Pa and Pa therebetween and the stationary contacts Pb and Pb therebetween similarly to the above mentioned first embodiment of the invention. Further, as shown there, a flange F is provided at a portion between the case 70 of the contact holding member 72 and the solenoid S so that isolation between the solenoid S and the contacts M, Pa and Pb can be more ensured. Also, the contact holding member 72 is formed with Teflon and the like so that it can resist further high voltage. This point can be adapted to both the above mentioned example and the below mentioned example.

(The Fourth Modified Example)

Although an example that the switching members SWaij and SWbij and the switching members SWcj and SWdj and the like are used as magnetic type one using the solenoid S is illustrated in the above mentioned first and second embodiments of the invention, but the present invention is not limited to it.

Figure 41:
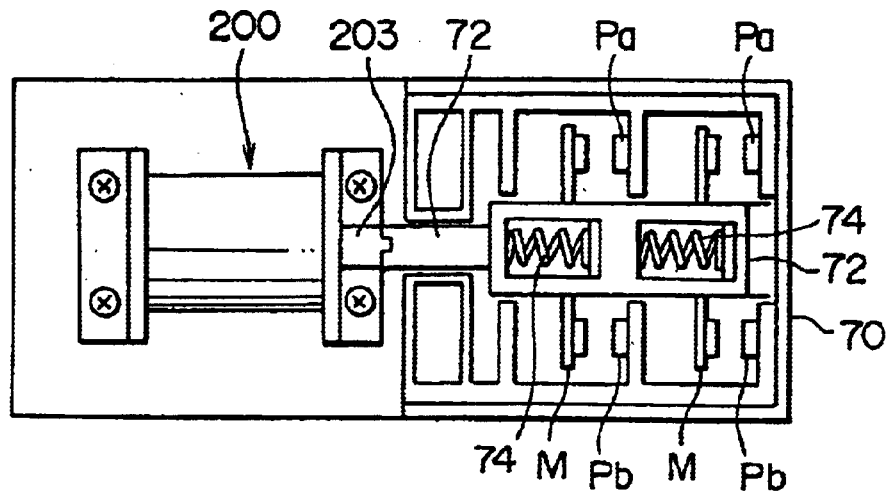
FIG. 41 is a plan view illustrating another example of switching member shown in FIG. 16 to FIG. 18.

For example, the switching members SWaij and SWbij and the switching members SWcj and SWdj may be an air type switch as shown in FIG. 41.

In this modified example, instead of the solenoid S of the switching members SWaij and SWbij and the switching members SWcj and SWdj, the air cylinder 200 is provided as a driving means.

Figure 42:
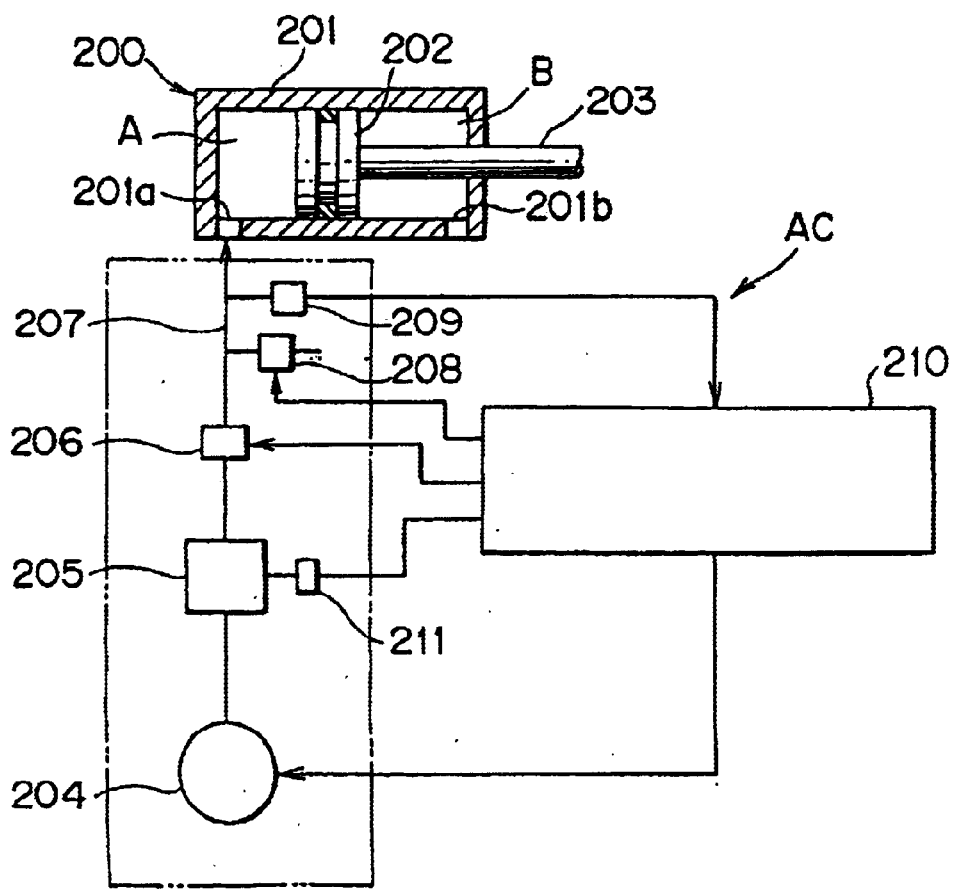
FIG. 42 is an air control circuit diagram of the switching member of FIG. 41.

As shown in FIG. 42, the air cylinder 200 comprises a cylinder body 201, a piston 202 disposed in the cylinder body 201, and the piston rod 203 integrated with the piston 202. Further, the piston rod 203 is serially engaged to the contact holding member 72. Moreover, air chambers A and B partitioned by the piston 202 are formed in the cylinder body 201, and ports 201a and 201b are formed to be open to each of the air chambers A and B. The port 201b is open to the atmosphere. The air cylinder 200 is adapted to be operatively controlled by the air control circuit AC.

The air control circuit AC comprises an air compressor 204, an air tank 205 and an electromagnetic valve 206. Further, the air compressor 204 is connected to the port 201a of the air cylinder 200 through the air tank 205 and the electromagnetic valve 206, and an electromagnetic valve 208 and a pressure sensor 209 are connected to a pipe line 207 connecting the electromagnetic valve 206 and the port 201a. The electromagnetic valve 208 allows the air chamber A to be open to the atmosphere at the time of operation. Further, a pressure detecting signal from the pressure sensor 209 is inputted to an arithmetic control circuit 210, and the air compressor 204 and the electromagnetic valves 206 and 208 are operatively controlled by the arithmetic control circuit 210. Further, the pressure sensor 211 is connected to the air tank 205, and a pressure detecting signal from the pressure sensor 211 is also inputted to the arithmetic control circuit 210.

In such configuration, the arithmetic control circuit 210 operates the air compressor 204 to store compressed air into the air tank 205. Therefore, if the pressure from the pressure sensor 211 becomes a predetermined value, the operation of the air compressor 204 is stopped.

Further, the arithmetic control circuit 210 operates and controls the electromagnetic valve 206 to be open by the operation of the above mentioned switches 94, 95 and 96 and the like. With this, the compressed air is guided from the air tank 205 to the air chamber A of the cylinder body 201 through the pipe line 207. The compressed air moves the piston 202 in the right direction against spring force of the spring 73 shown in FIGS. 18 and 19, and presses the movable contact M to contact with the stationary contacts P1 and P2. Further, when the pressure detecting signal from a pressure sensor 209 is more than a predetermined value and the change of the pressure detecting signal becomes constant, the arithmetic control circuit 210 allows the electromagnetic valve 206 to be closed. Moreover, when the load test switching members SWaij and SWbij, the switching members SWcj and SWdj and the like are used in the load test, if the pressure from the pressure sensor 208 is more than a predetermined value, the arithmetic control circuit 210 allows the electromagnetic valve 206 to be open, and feeds the compressed air to the air chamber A again.

Further, when the load test is finished, the arithmetic control circuit 201 allows the electromagnetic valve 208 to be open, and the air chamber A to be open to the atmosphere. With this, the contact holding member 72, the piston rod 203 and the piston 202 are moved with the spring force of the spring 73 to the left direction in FIG. 42, the air of the air chamber A is vented to the atmosphere through the electromagnetic valve 208, and the movable contact M is separated from the stationary contacts P1 and P2.

With such an air cylinder 200 used as driving means of the switching members SWaij and SWbij and the switching members SWcj and SWdj and the like instead of the solenoid S, the switching members SWaij and SWbij and the switching members SWcj and SWdj and the like can be used in more stable state.

Third Embodiment of the Invention

An example of the type of dry load test apparatus used for a three phase AC generator is illustrated in the above mentioned example, but the present invention is not necessarily limited to it. For example, only one of the resistor assemblies Ri, Si and Ti of the resistor bodies 57R, 57S and 57T is used as a single body and then the electric load test for under test power supply of generator, battery and the like may be performed.

Fourth Embodiment of the Invention

Further, there is provided the configuration that the resistor units 42, 43 and 44 which are provided separately are provided side by side, and the resistor assemblies Ri, Si and Ti of the resistor bodies 57R, 57S and 57T are provided to each of the resistor units 42, 43 and 44, respectively, but the present invention is not necessarily limited to it.

Figure 43:
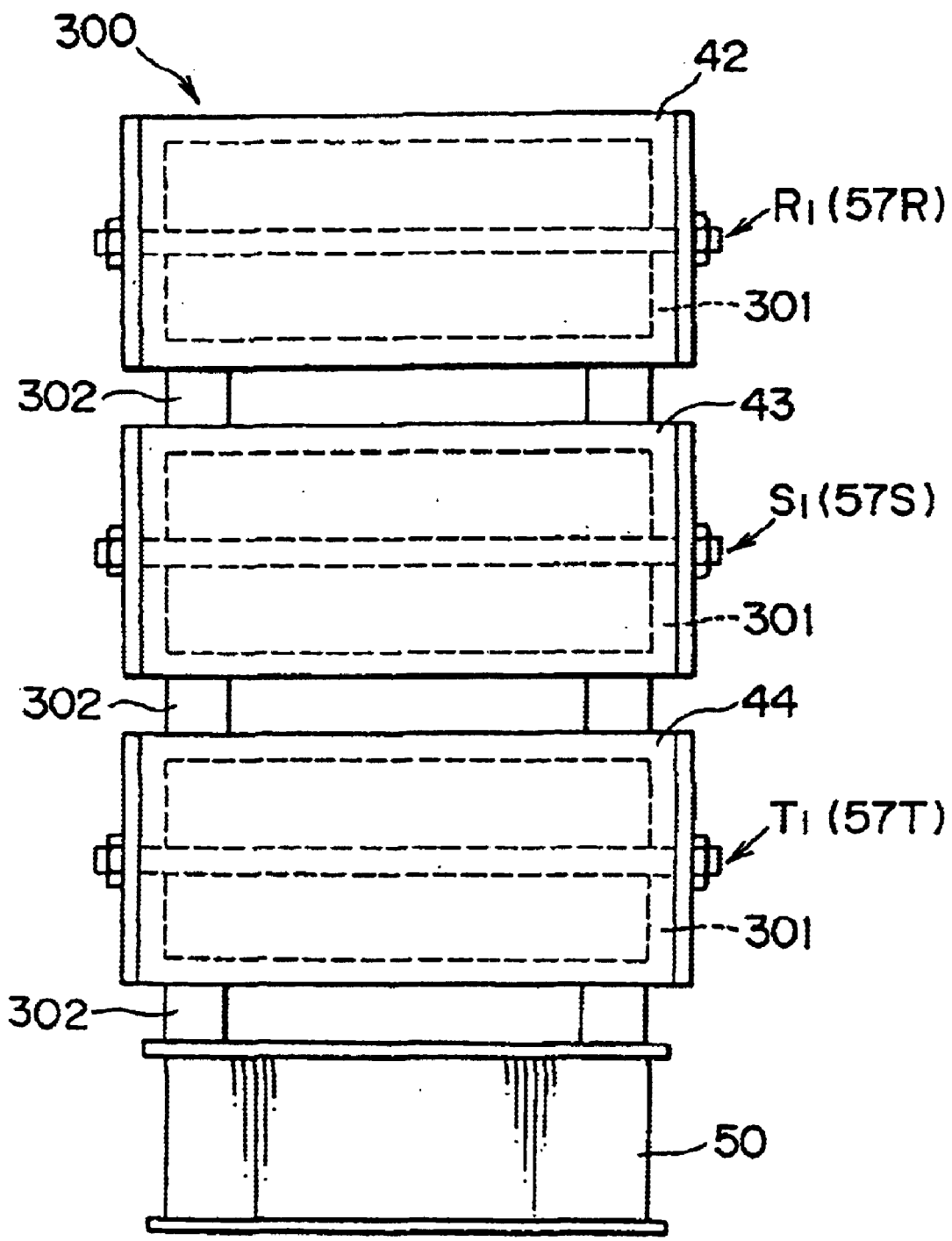
FIG. 43 is a descriptive view of another dry load test apparatus.
Figure 44:
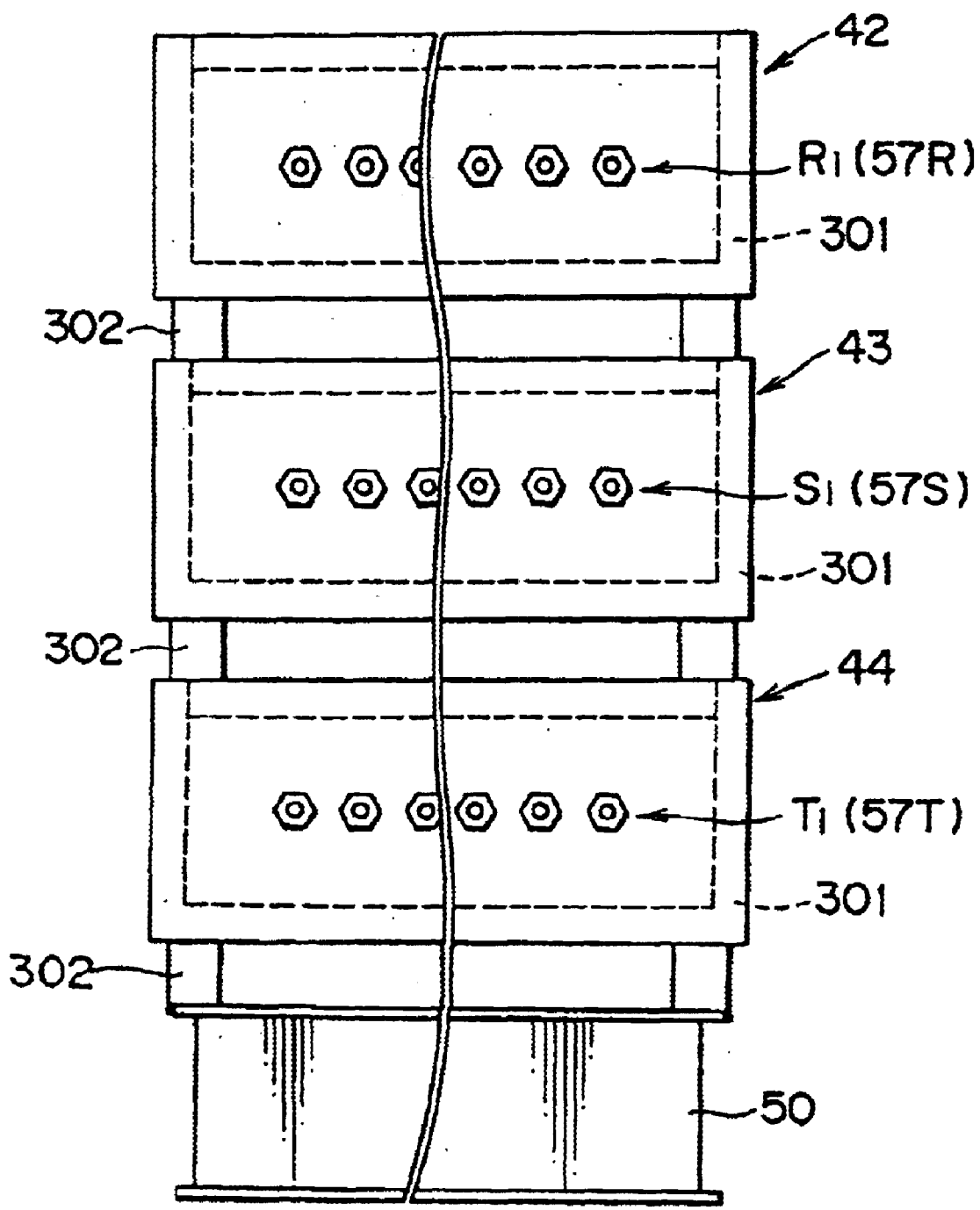
FIG. 44 is a right side elevation view of FIG. 43.

For example, in case where voltage of the under test power supply is a high voltage and relatively low, the stage number of the resistor assemblies Ri, Si and Ti is adapted to be small, for example, two to three stages, and the resistor units 42, 43 and 44 provided separately may be assembled in upper and lower sides as shown in FIGS. 43 and 44 to form one dry load test apparatus 300. Moreover, although the stage number of the resistor assemblies Ri, Si and Ti is one stage for convenience of drawing in FIGS. 43 and 44, it is practically two to three stages.

In this case, since each of the resistor units 42, 43 and 44 has box shaped frames 301, 301 and 301 made of metal, the isolation member 302 needs to be disposed among the resistor units 42, 43 and 44, and some isolation distances need to be taken between the frame 301 and the resistor assemblies Ri, Si and Ti. Hence, the interval among the resistor bodies 57R, 57S and 57T is enlarged so that the height of the dry load test apparatus 300 tends to be higher, which is not desirable.

Figure 45A:
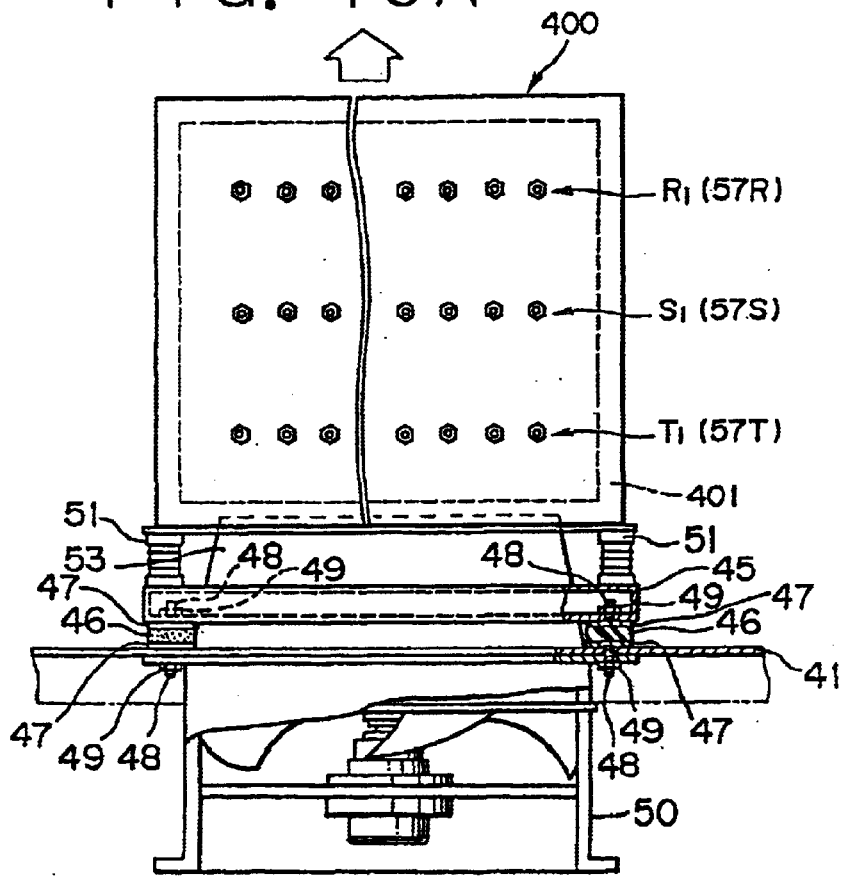
FIG. 45A is a side elevation view illustrating a dry load test apparatus relating to the fourth embodiment of the present invention of which one portion is broken.
Figure 46:
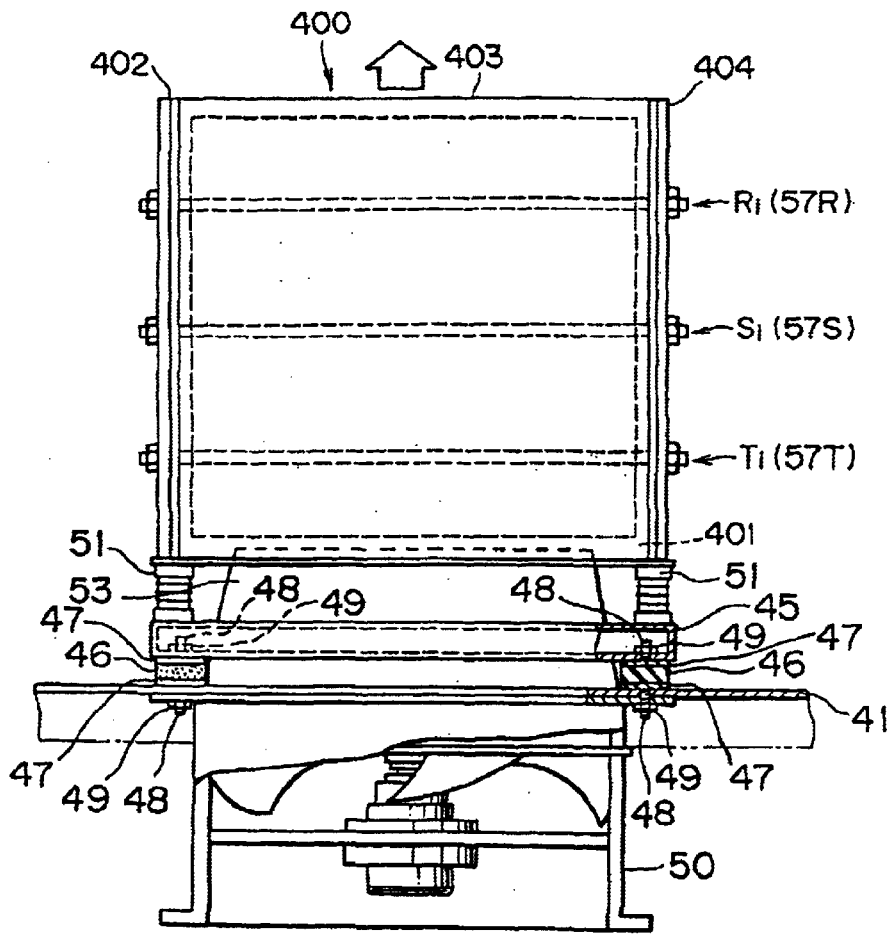
FIG. 46 is a right side elevation view of the dry load test apparatus of FIG. 45A;.
Figure 47:
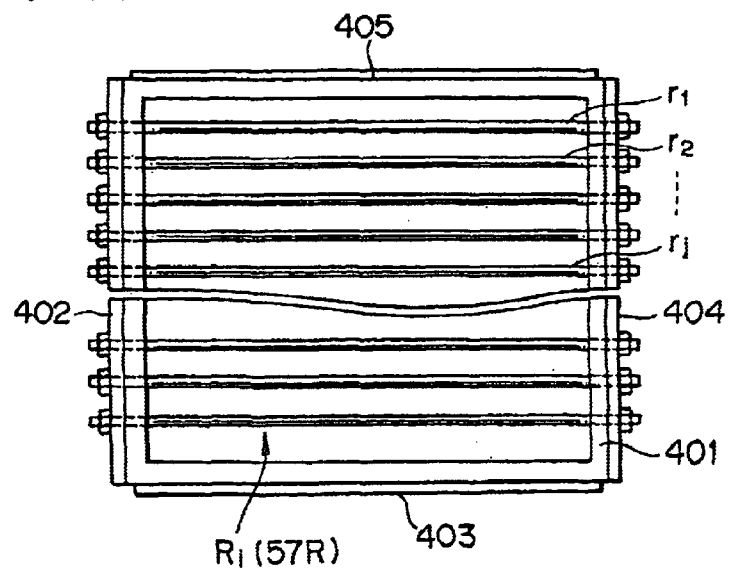
FIG. 47 is a plan view of FIG. 46.

Therefore, as shown in FIG. 45A, FIG. 46 and FIG. 47, the dry load test apparatus 400 in which only the resistor assemblies Ri, Si and Ti of the resistor bodies 57R, 57S and 57T are assembled is also desirable. The dry load test apparatus 400 comprises a frame 401 made of metal (for example, iron) having a cuboid shape (box shape) of which four faces of sides and two faces of the upper and lower portions are opened, and isolation plates 402 to 405 closing the openings toward the sides of the frame 401. Further, the resistor assemblies Ri, Si and Ti of the resistor bodies 57R, 57S and 57T which are disposed in the upper and lower portions are bridged and fixed between the isolation plates 402 and 404.

In this case, since the number of the frame 401 is one, the intervals among the resistor bodies 57R, 57S and 57T can be narrower than those of FIGS. 43 and 44. As a result, the height of the dry load test apparatus 400 can be still smaller than that of the dry load test apparatus 300. Moreover, although the stage number of the resistor assemblies Ri, Si and Ti is one stage for convenience of drawing in case of this example, it is practically two to three stages.

Figure 45B:
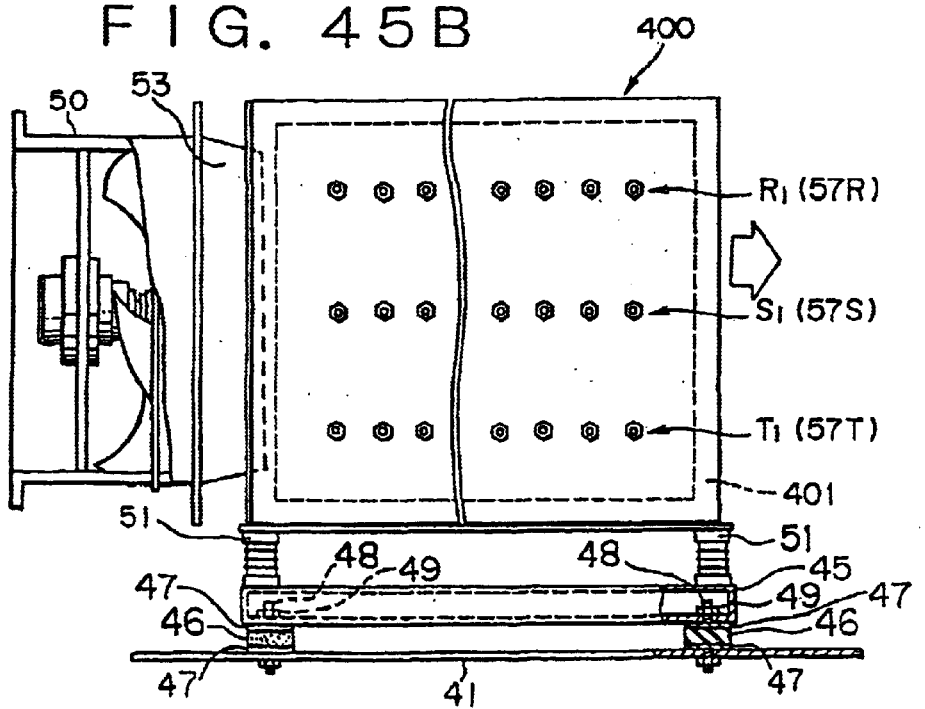
FIG. 45B is a side elevation view illustrating a modified example of FIG. 45A where a portion thereof is broken.

Also, there may be provided the configuration that the isolation plates 403 and 405 are detached from the side of the frame 401, two opposite sides placed between the isolation plates 402 and 404 of the frame 401 are opened, the electric fan 50 is attached to one side of the opening as shown in FIG. 45B, and the upper and lower openings of the frame 401 are closed. In this case, cooling wind from the electric fan 50 flows from the opening of one side of the frame 401 into the frame 401 as shown with an arrow 401a, cools the internal resistor element, and then, is vented from the opening of the other side. With such a configuration, the height of the dry load test apparatus 400 can be still smaller so that the dry load test apparatus 400 can be mounted into even a small truck. Further, depending on the establishment sites, it can be easily provided even on the place whose height cannot be measured. Moreover, the electric fan 50 is attached to the frame 41, cooling wind generated from the electric fan 50 flows from the opening of the side of the frame 401 into the frame 401 through the isolation hood 53, as shown with the arrow 401a.

(Others 1)

Figure 48A:
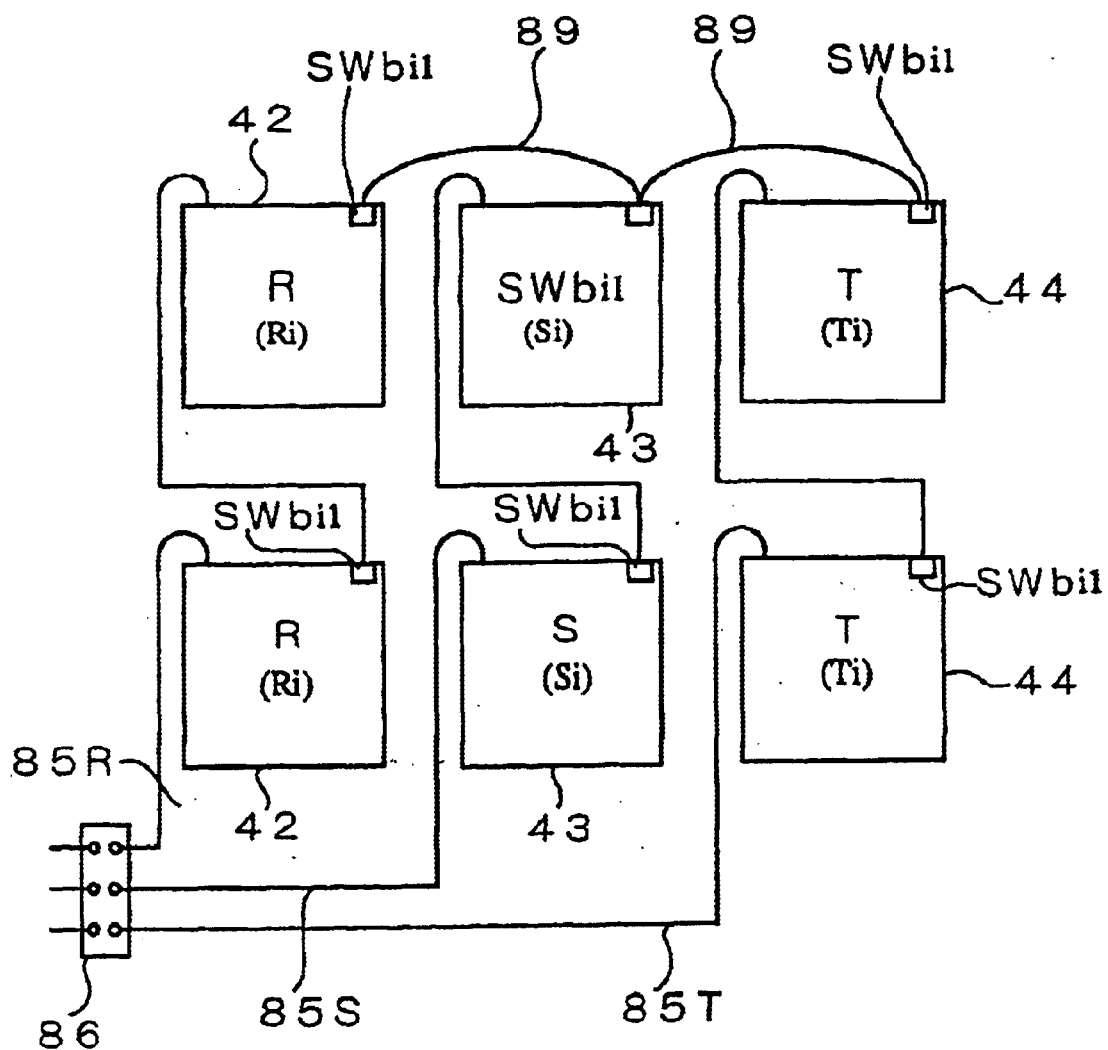
FIG. 48A is a descriptive view schematically illustrating a connection example of resistor units of the present invention.
Figure 48B:
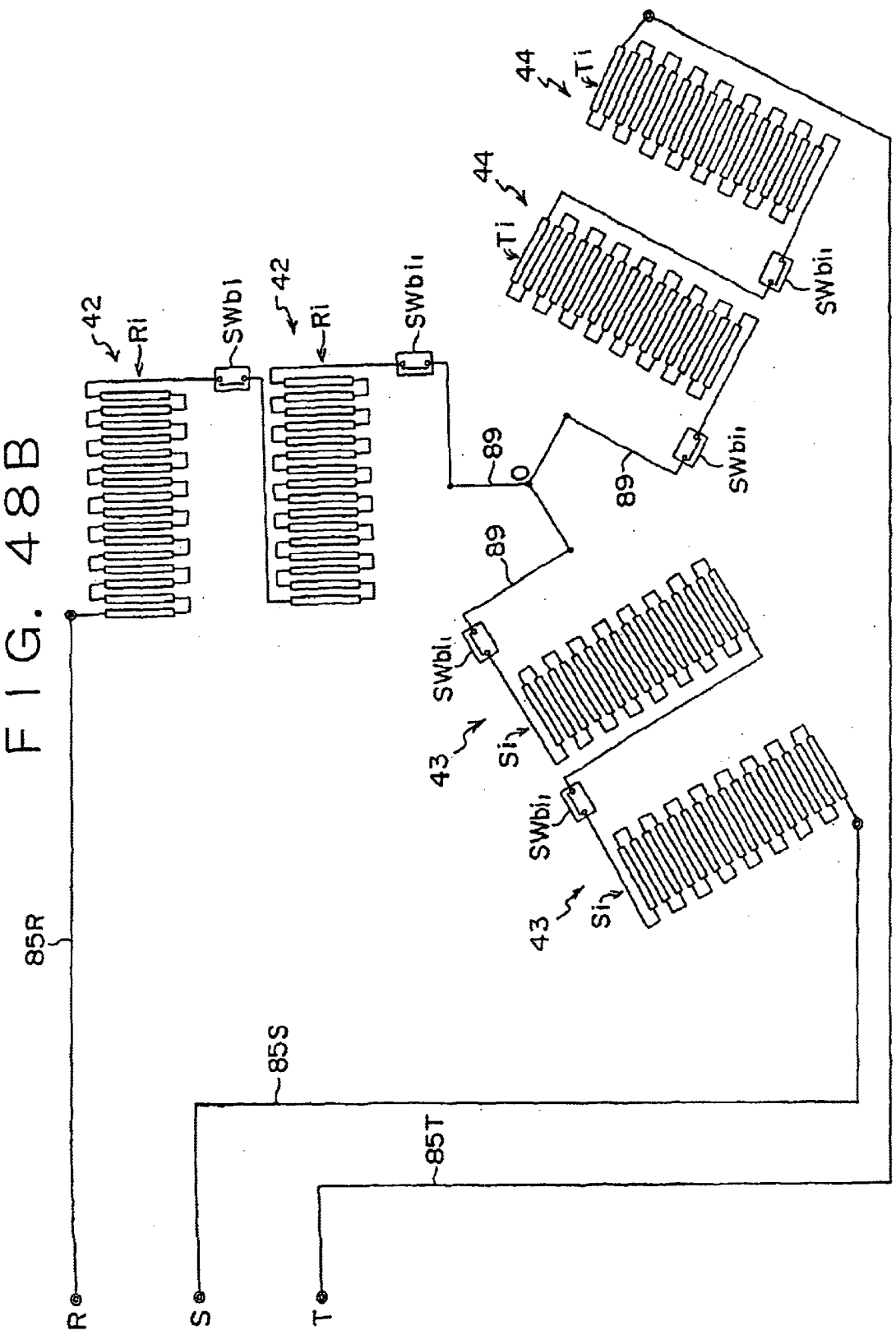
FIG. 48B is a descriptive view illustrating a connection state of the resistor units of FIG. 48A.

Further, the above mentioned example illustrates an example that R-phase resistor unit 42, S-phase resistor unit 43, and T-phase resistor unit 44 are provided by one, but the present invention is not limited to it. For example, the resistor elements rj of the resistor units 42, 43 and 44 are serially connected for 6600V as shown in FIGS. 31 to 33, the serially connected resistor units 42, 43 and 44 are provided by two sets as shown in FIG. 48A, and each of the two sets of resistor units 42 and 42, each of the two sets of resistor units 43 and 43 and each of the two sets of resistor units 44 and 44 are serially connected as shown in FIG. 48B, thereby performing the 13200V load test. Moreover, the connection example increases the number of the resistor units 42, 43 and 44 as an example so that the voltage available to the load test can be set to be high.

(Others 2)

In the above mentioned first embodiment of the invention, the dry load test apparatus 40 in which the resistor units 42, 43 and 44 are provided is mounted on the truck 30, and after the dry load test apparatus 40 is carried by the truck 30 to the site where the electric load test is performed, and the electric load test is performed in the state that the dry load test apparatus 40 is mounted on the truck 30, but the present invention is not limited to it.

Figure 49:
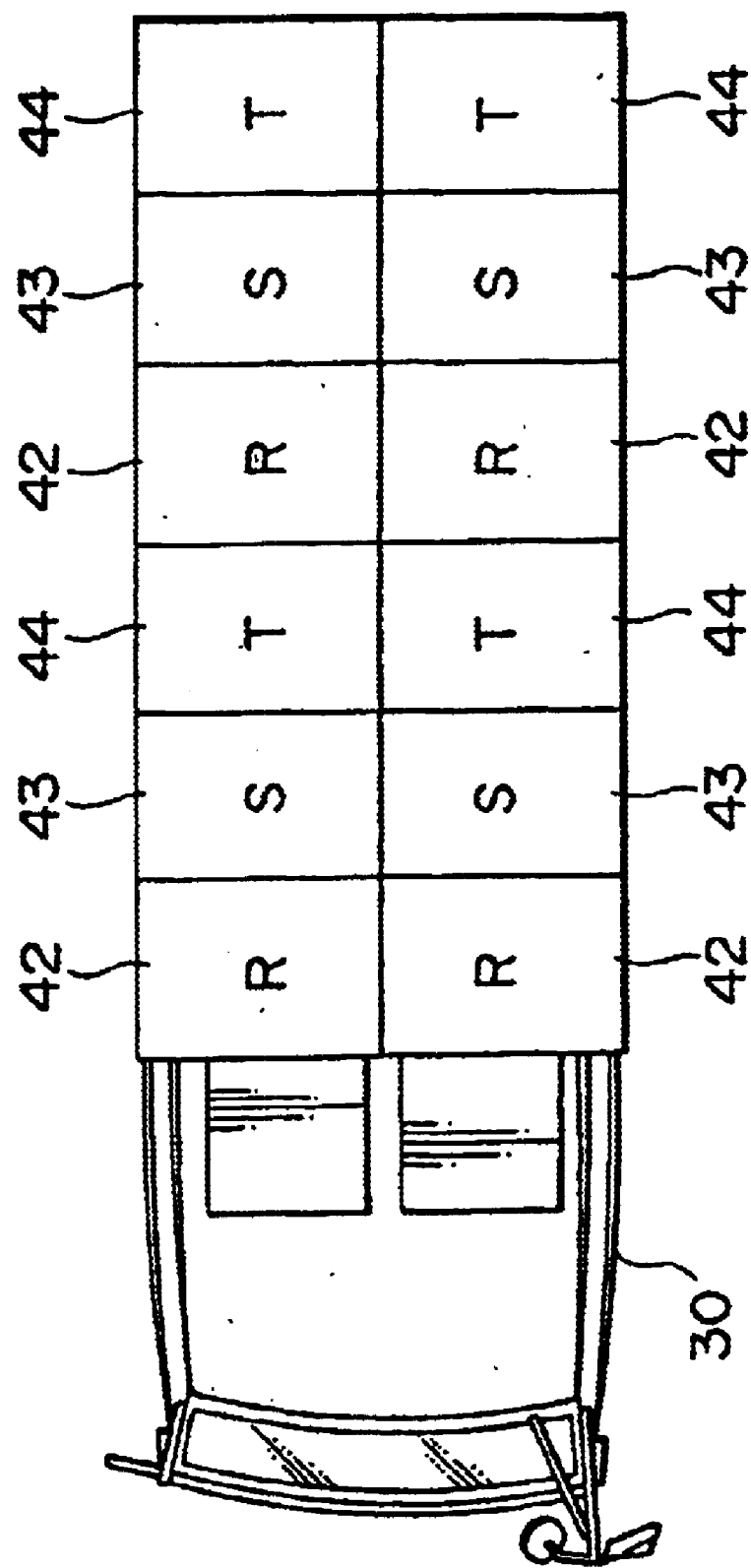
FIG. 49 is a plan view illustrating another example of a truck in which the dry load test apparatus relating to the present invention is mounted.
Figure 50A:
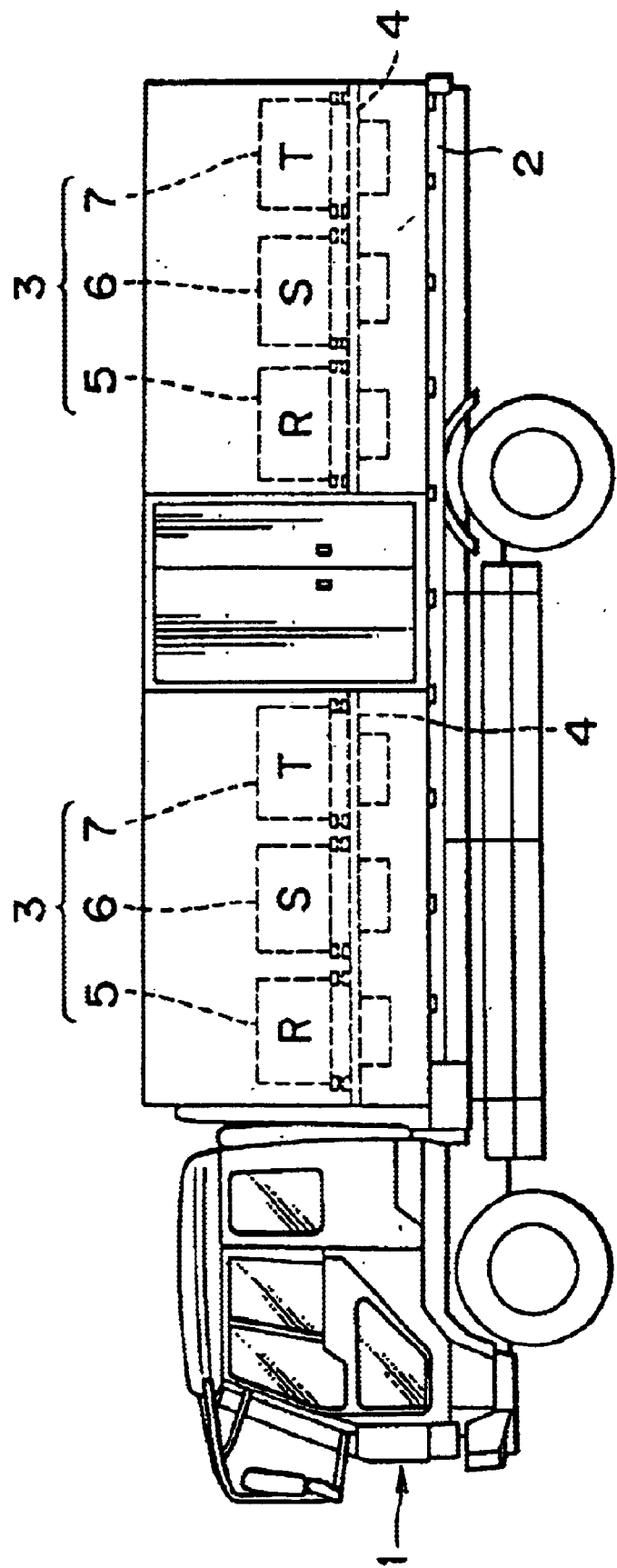
FIG. 50A is a side elevation view of a truck in which a conventional dry load test apparatus is mounted.
Figure 50B:
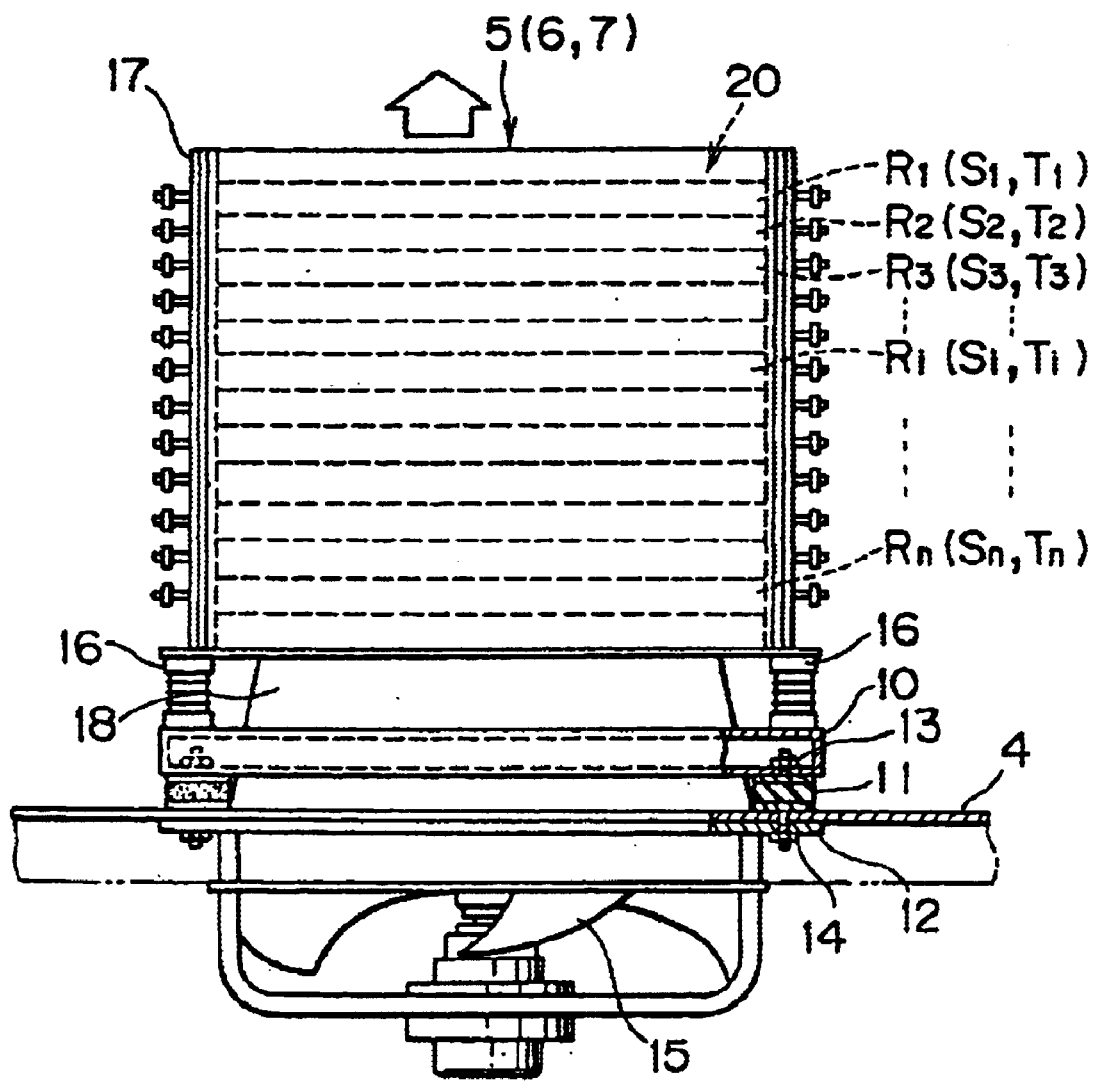
FIG. 50B is a side elevation view of a resistor unit where a portion of the electric fan of FIG. 50A is broken.
Figure 51:
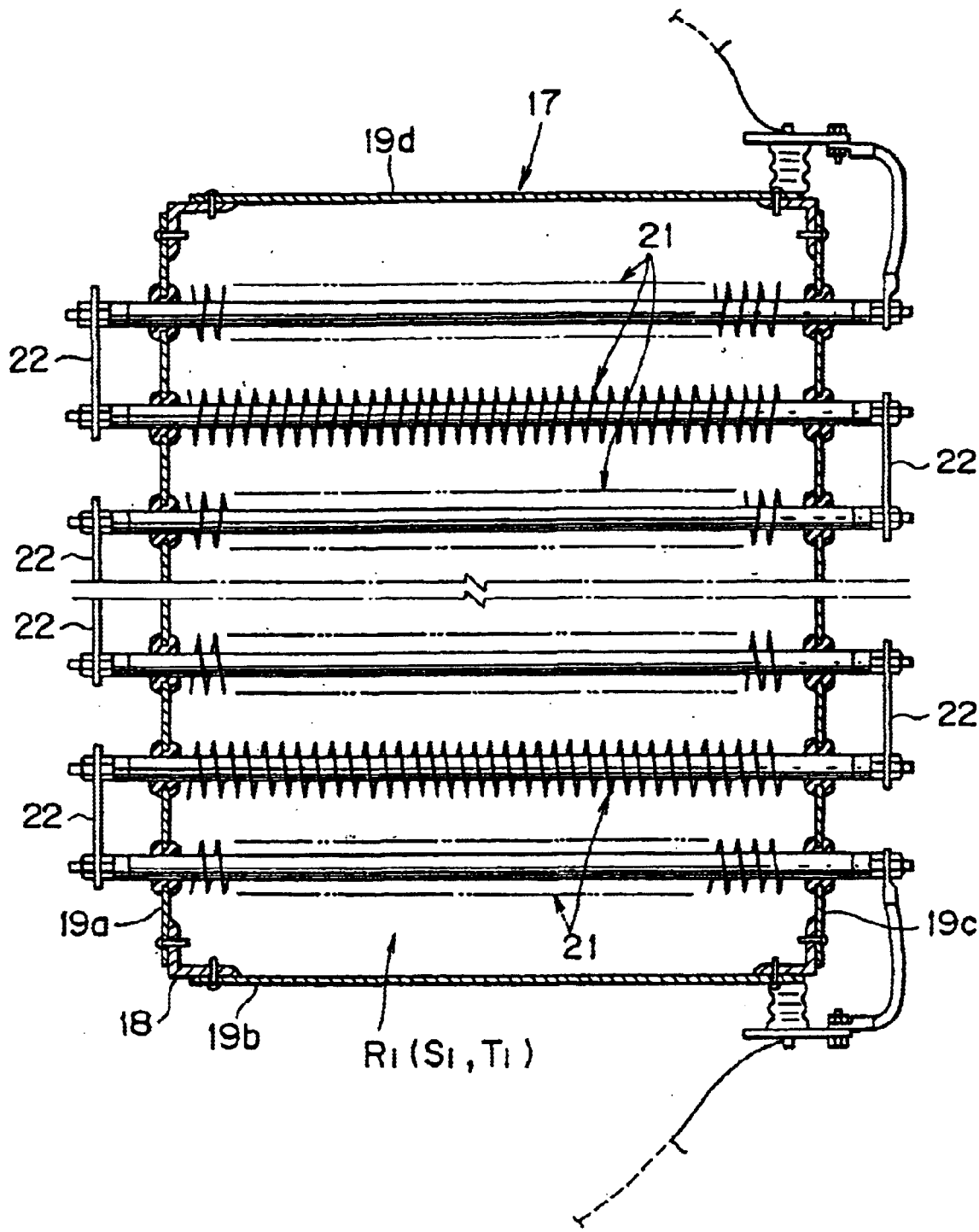
FIG. 51 is a descriptive view of the resistor assembly of FIG. 50B.
Figure 52:
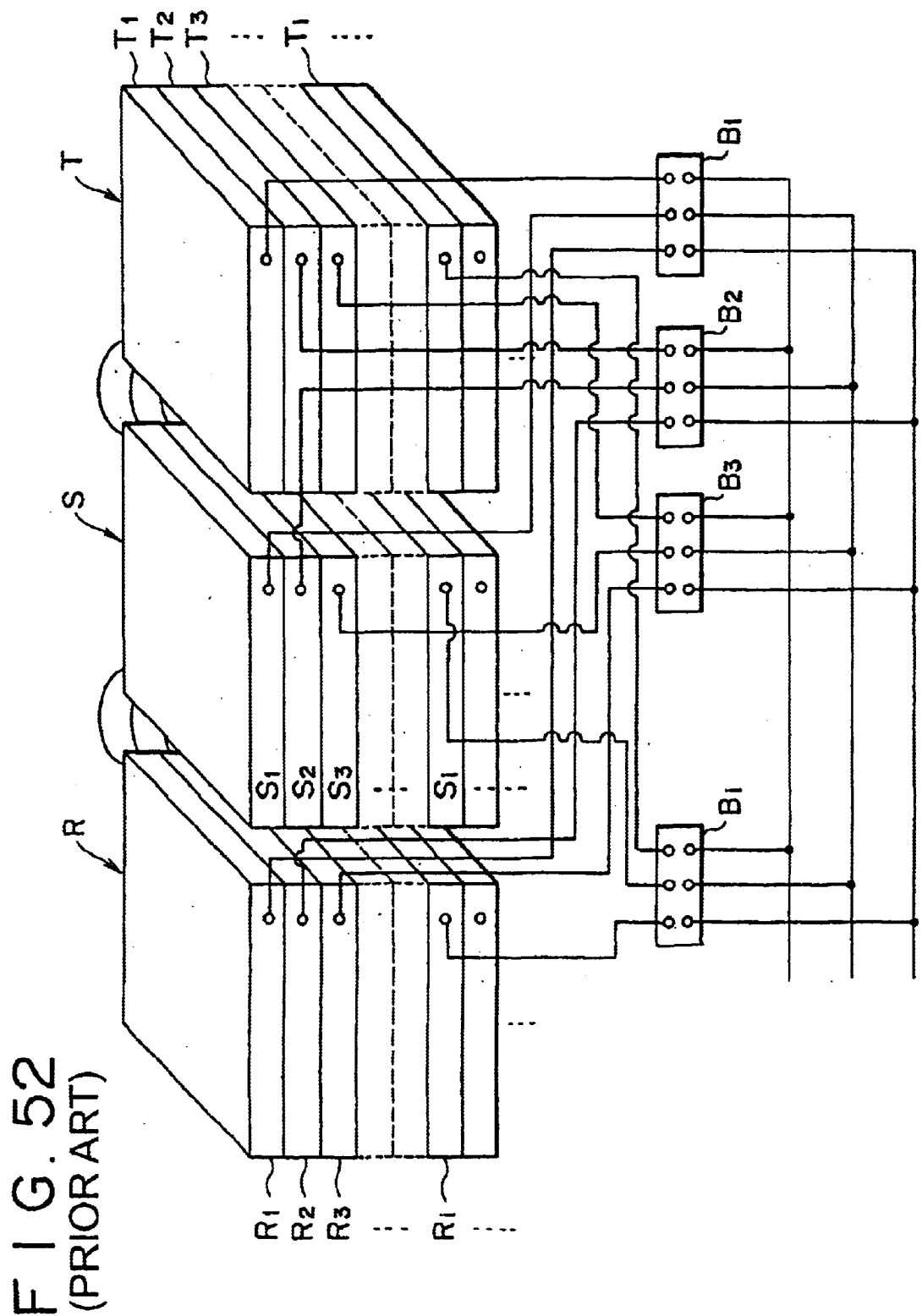
FIG. 52 is a descriptive view illustrating a connection example of the resistor assemblies of FIG. 50B.
Figure 53:
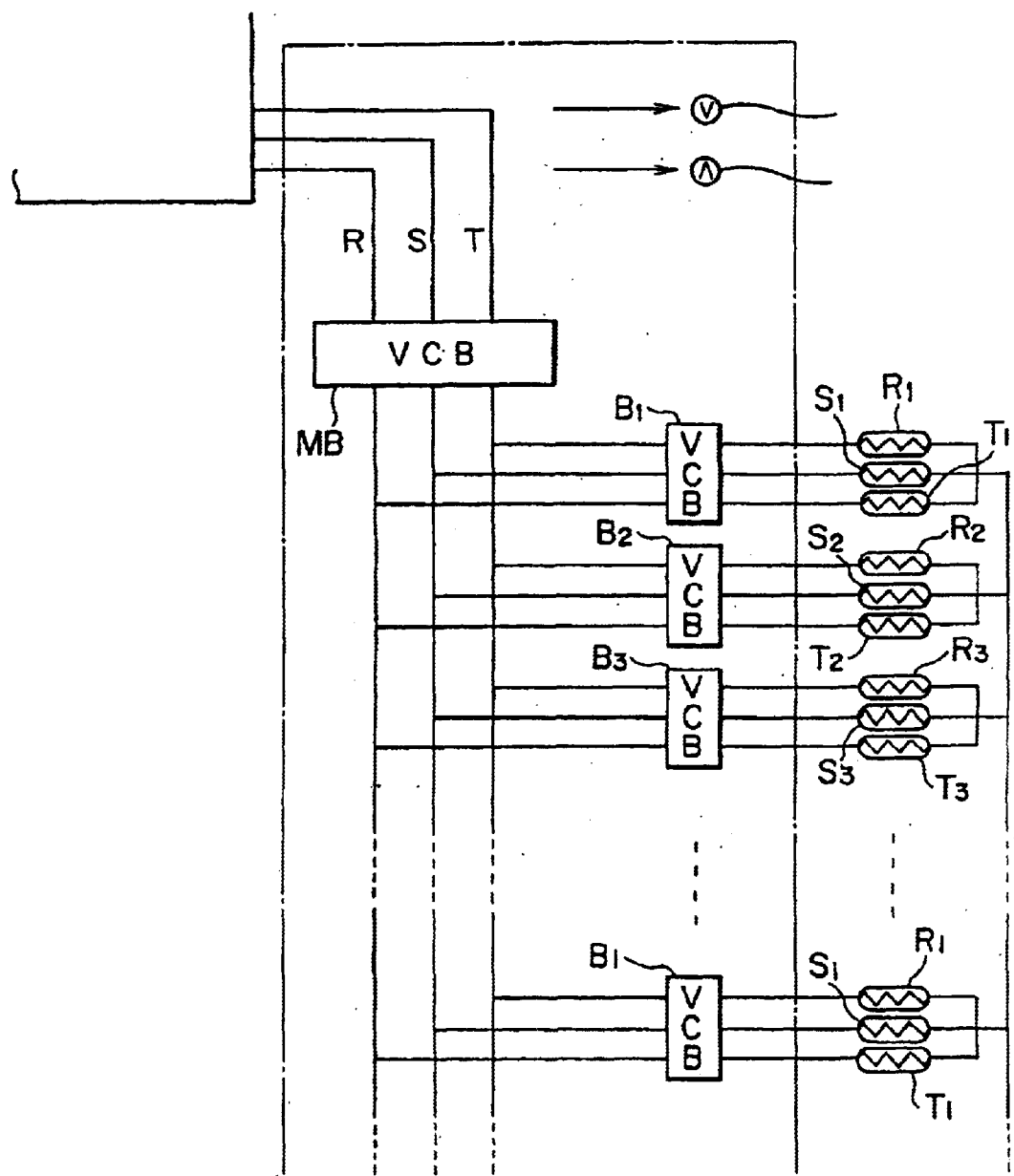
FIG. 53 is a circuit diagram of the resistor assembly of FIG. 52.

For example, as shown in FIG. 49, the resistor units 42, 43 and 44 corresponding to R-phase, S-phase and T-phase are detachably mounted on the carrier of the truck 30. Further, the resistor units 42, 43 and 44 are carried by the truck 30 to the site where the electric load test is performed, and are detached to be unloaded from the truck 30 at the site. After that, the resistor units 42, 43 and 44 are provided at the site in the same configuration as the first embodiment of the invention, and then, the electric load test for the power supply of the on the spot generator and the like is started. Moreover, although each one of the resistor assemblies Ri, Si and Ti is shown in FIG. 45 to FIG. 47 for convenience of description, they are practically provided with multi stages. Besides, although 58j, Caj, Cbj and the like of the first embodiment of the invention are assembled to the resistor assemblies Ri, Si and Ti similarly to the first embodiment of the invention, illustrations thereof are omitted for convenience of drawing in this example.

Accordingly, since the truck 30 needs not to be located at the site during the electric load test, it is used for carrying other resistor units 42, 43 and 44 to other sites or for collecting the resistor units 42, 43 and 44 of other sites. As a result, the truck 30 can be usefully and effectively used.

As mentioned above, because there is provided the constitution according to the first aspect of the present invention that the dry load test apparatus comprises multi stage resistor bodies for high voltage load test having numerous flat shaped resistor assemblies consisting of a large number of elongate resistor elements provided side by side in a flat shape with interval and serially connected at an end thereof, said numerous resistor assemblies being provided side by side with multi stages with interval in order that flat planes thereof become parallel so that a large number of resistor element columns which are formed with corresponding said resistor elements of the multi stage resistor assemblies are provided; a plurality of first multi stage switching members, one end thereof being connected to an end of each of said resistor elements of the resistor element columns to constitute switching member columns; a large number of inter assembly conductive members respectively connecting other ends of first switching members of said switching member columns one another; and a high voltage switch connecting a few of said large number of inter assembly conductive members to an under test power supply, the apparatus is compact, and the resistance value of the load resistor for load resistor test can be set finely, and in addition, the cost for manufacturing the apparatus can be lowered.

Further, because there is the constitution provided according to the second aspect of the present invention that one end of said first switching members is connected to each ends of at least a few of said resistor elements of the resistor element columns to constitute the switching member columns, the number of parts can be minimized as many as needed.

Because there is provided the constitution according to the third aspect of the present invention that one end of said first switching members is connected to each ends of all of said resistor elements of the resistor element columns to constitute the switching member columns corresponding to each of said resistor element columns, the resistance value of the resistor assemblies can be set more finely by connecting (shorting) the large number of inter assembly conductive members one another.

Because there is provided the constitution in addition to the first aspect according to the fourth aspect of the present invention that a shorting means for shorting selectively said large number of inter assembly conductive members one another is provided, the resistance value of the resistor assemblies can be set more finely by connecting (shorting) the large number of inter assembly conductive members one another.

Because there is provided the constitution in addition to the fourth aspect according to the fifth aspect of the present invention that said shorting means is a second switching member, the combination of resistor assemblies to be shorted can be selected simply and rapidly by means of ON/OFF manipulation of the first and second switching members.

Because there is provided the constitution in addition to the fifth aspect according to the sixth aspect of the present invention that said switching member comprises one set of a plurality of stationary contact pairs as first and second stationary contacts, a plurality of movable contacts interrupting or connecting the first and second stationary contacts of each of said stationary contact pairs, and a driving means driving said movable contacts to the first and second stationary contacts in advance or retreat simultaneously to interrupt or to connect the first and second stationary contacts of each of said stationary contact pairs, and said plurality of first stationary contacts and said second stationary contacts are individually connected each other, its structure is simple and can be used for high voltage.

Because there is provided the constitution in addition to the sixth aspect according to the seventh aspect of the present invention that said driving means are solenoids which are operatively controlled by a control panel and a control circuit, the combination of resistor assemblies to be shorted can be selected simply, rapidly and automatically by means of handling the control panel.

Because there is provided the constitution in addition to the seventh aspect according to the eighth aspect of the present invention that said solenoid comprises a coil and an actuator driven by magnetic force of said coil, and said solenoid is disposed on the substantially same straight line as a driving direction of said movable contact, the withstand voltage between the coil and the stationary contact can be easily ensured.

Because there is provided the constitution in addition to the sixth aspect according to the ninth aspect of the present invention that said driving means is an air cylinder which is operatively controlled by an air control circuit, the withstand voltage between the stationary contact and other portion can be easily ensured.

Although the technical spirits of the present invention has been disclosed with reference to the appended drawings and the preferred embodiments of the present invention corresponding to the drawings, the descriptions in the present specification are only for illustrative purpose, not for limiting the present invention.

Also, those who are skilled in the art will appreciate that various modifications, additions and substitutions are possible without departing from the scope and spirit of the present invention. Therefore, it should be understood that the present invention is limited only to the accompanying claims and the equivalents thereof, and includes the aforementioned modifications, additions and substitutions.

What is claimed is:

1. A dry load test apparatus comprising:

multi-stage resistor bodies (42, 43, 44) for high voltage load test comprising a plurality of flat shaped resistor assemblies (Ri, Si, Ti) each including elongate resistor elements (r, j) spaced apart in a plane and connected mutually end to end in series through electrically conductive connection pieces (58$aj$, 58$bj$-1), said resistor assemblies arranged in columns such that the flat shape surfaces are parallel and in parallel multi-stages which are spaced apart with respect to each other, said connection pieces comprising electrically conductive connection pieces (58$aj$, 58$bj$-1) arranged in columns;

a pair of isolation plates (67, 68) arranged on opposite sides of each of said resistor bodies to sandwich said resistor bodies therebetween;

first switching members (SWbi1) arranged in columns, said members being attached to surfaces of said isolation plates (67, 68) on a side opposite to said resistor bodies, each being connected at one end to ends (F) of said resistor elements to which said electrically conductive connection pieces are not connected;

multi-stages of second switching members (SWaij, SWbij) arranged in switching member columns (SWai, SWbi), said second switching members being attached to surfaces of said isolation plates (67, 68) on a side opposite to said resistor bodies, each being connected at one end to each electrically conductive connection pieces (58$aj$, 58$bj$-1) of said electrically conductive connection piece columns;

a plurality of first conductive members (Caj, Cbj) for connecting mutually the other ends of said second switching members (SWaij, SWbij) of said switching
member columns;

a plurality of second conductive members (Cb1) for
connecting mutually the other end of said first switching members (SWbi1);

a plurality of third conductive members (Cb(m/2)+1)
connected with ends (E) of said resistor elements to
which said electrically conductive connection pieces
are not attached;

high voltage switches connected to said third conductive
members (Cb(m/2)+1); and an electric conduction control circuit (84) for ON-OFF
controlling said second switching members (SWaij,
SWbij).

2. A dry load test apparatus according to claim 1, wherein
said resistor bodies includes three bodies (57R, 57S, 57T),
said first and second conductive members (Cb1, Cb1 and
Cb(m/2)+1) of said resistor bodies (57R, 57S and 57T) are
connected with respect to each other, and said third conductive members (Cb(m/2)+1) of said resistor bodies (57R, 57S
and 57T) are connected through a switch (86) for high
voltage connected to an electrical instrument subjected to
load test.

3. A dry load test apparatus comprising, a plurality of resistor units arranged adjacent each other
on a platform, each resistor unit comprising a plurality
of planes of resistor assemblies arranged in a stacked
column, each plane of resistor assemblies comprising
plural elongated resistor elements having opposite ends
and arranged in spaced-apart relationship;

a plurality of electrically conductive connection pieces
within each of said planes of resistor assemblies and
arranged adjacent said opposite ends of said elongated
resistor elements for serially connecting said resistor
elements within a plane, said connection pieces
arranged in columns, wherein two of said resistor
elements have non-connected ends with respect to said
connection pieces;

a pair of isolation plates adjacent opposite sides of the
stacked columns of planes of resistor assemblies;

a plurality of switching elements arranged in a column,
each column positioned in side by side relationship to
an adjacent column, said columns of switching elements attached to each isolation plate of said pair of
isolation plates on a side opposite to a side adjacent said
resistor elements;

wherein a first column of switching elements on one of
said isolation plates has each switching element connected to one non-connected end of said resistor
elements, and wherein each of the remaining columns
of switching elements on said one of said isolation
plates is connected to said columns of connection
pieces;

wherein each column of switching elements attached to
the other of said isolation plates has each switching
element thereof connected to said connection pieces
that are arranged adjacent the opposite ends of said
elongated resistor elements;

a plurality of first conductive members corresponding to
said columns of switching elements, each switching
element connected to a first conductive member to
provide switched connections between said first conductive members and said connection pieces and
switched connections between a first conductive member and a non-connected end of a resistor element.

4. A dry load test apparatus of claim 3 further comprising
a set of second conductive members, each second conductive member of said set connected to a non-connected end of
one of said two resistor elements.

5. A dry load test apparatus of claim 4 wherein each
conductive member of said set of second conductive members is further connected to a high voltage switch, said high
voltage switch connectable to an electrical instrument subjected to a load test.

6. A dry load test apparatus of claim 3 further comprising
shorting means connected with said first conductive members for electrically connecting selected ones of said first
conductive members.

7. A dry load test apparatus comprising, a plurality of resistor units arranged adjacent each other,
each resistor unit comprising a plurality of planes of
resistor assemblies arranged in a stacked column, each
plane of resistor assemblies comprising plural elongated resistor elements having opposite ends and
arranged in spaced-apart relationship;

means for serially connecting adjacent resistor elements
within a plane to provide a serial connection from one
end of a first resistive element through each of the
resistor elements within the plane to a second end of the
last resistor element within the plane;

switching elements arranged in stacked planes, each plane
comprising a plurality of switching elements each
having first and second poles, at least one switching
element in each plane connected to said one end of said
first resistor element through a first pole of said at least
one switching element, the remaining switching elements within the plane connected to said means for
serially connecting adjacent resistor elements through a
first pole of said remaining switching elements;

a plurality of conductive members connected to the second pole of each of said switching elements;

short circuit connecting means connectable to said conductive members for selectively connecting the conductive members;

electrical conduction control circuit means for ON/OFF
controlling said switching elements.

* * * * *